US012787535B2

(12) United States Patent
Yamazaki et al.

(10) Patent No.: US 12,787,535 B2
(45) Date of Patent: Nov. 3, 2026

(54) ELECTRONIC DEVICE AND AUTHENTICATION METHOD OF ELECTRONIC DEVICE

(71) Applicant: Semiconductor Energy Laboratory Co., Ltd., Atsugi (JP)

(72) Inventors: Shunpei Yamazaki, Setagaya (JP); Kensuke Yoshizumi, Atsugi (JP); Naoto Kusumoto, Isehara (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 19/387,770

(22) Filed: Nov. 13, 2025

(65) Prior Publication Data

US 2026/0173637 A1 Jun. 18, 2026

Related U.S. Application Data

(63) Continuation of application No. 18/285,499, filed as application No. PCT/IB2022/053554 on Apr. 15, 2022, now Pat. No. 12,495,661.

(30) Foreign Application Priority Data

Apr. 22, 2021 (JP) ................................ 2021-072473

(51) Int. Cl.
*H10K 39/34* (2026.01)
*G06F 3/04886* (2022.01)
(Continued)

(52) U.S. Cl.
CPC ......... *H10K 39/34* (2023.02); *G06F 3/04886* (2013.01); *G06V 40/1318* (2022.01); *H10K 59/871* (2023.02); *H10K 59/873* (2023.02)

(58) Field of Classification Search
CPC .......... G06F 21/32; G06F 21/31; G06F 21/36; G06F 21/602; G06F 21/46; G06F 21/45;
(Continued)

(56) References Cited

U.S. PATENT DOCUMENTS

| | | | |
|---|---|---|---|
| 8,533,803 | B2 | 9/2013 | Cha et al. |
| 8,760,420 | B2 | 6/2014 | Nozawa et al. |

(Continued)

FOREIGN PATENT DOCUMENTS

| | | | |
|---|---|---|---|
| CN | 106415570 A | 2/2017 |
| EP | 3035226 A | 6/2016 |

(Continued)

OTHER PUBLICATIONS

International Search Report (Application No. PCT/IB2022/053554) Dated Jul. 19, 2022.

(Continued)

*Primary Examiner* — Dong Hui Liang
(74) *Attorney, Agent, or Firm* — Eric J. Robinson; Robinson Intellectual Property Law Office, P.C.

(57) ABSTRACT

A lightweight, foldable electronic device with an input function is provided. The electronic device is provided with a foldable display apparatus; the display apparatus has an input function, an authentication function, and the like, and is capable of operating the electronic device with or without contact. The display apparatus includes a light-emitting device and a light-receiving device in a display portion. The light-emitting device has a function of performing display. The light-emitting device may also have a light-emitting function for aiding input operation. The light-receiving device has an imaging function and a function of a sensor for performing input operation.

20 Claims, 22 Drawing Sheets

(51) Int. Cl.
*G06V 40/13* (2022.01)
*H10K 59/80* (2023.01)

(58) Field of Classification Search
CPC ...... G06F 21/6218; G06F 21/35; G06F 21/34; G06F 21/6245; G06F 21/316; G06F 21/44; G06F 21/83; G06F 21/10; G06F 21/64; G06F 3/0488; G06F 3/04883; G06F 3/0484; G06F 3/167; G06F 3/0481; G06F 3/03547; G06F 9/451; G06F 2221/2141; G06F 2203/0338
See application file for complete search history.

(56) References Cited

U.S. PATENT DOCUMENTS

| | | | | |
|---|---|---|---|---|
| 8,803,816 | B2 | 8/2014 | Kilpatrick, II et al. | |
| 8,836,611 | B2 | 9/2014 | Kilpatrick, II et al. | |
| 8,860,632 | B2 | 10/2014 | Kilpatrick, II et al. | |
| 8,860,765 | B2 | 10/2014 | Kilpatrick, II et al. | |
| 8,863,038 | B2 | 10/2014 | King et al. | |
| 8,866,840 | B2 | 10/2014 | Dahl et al. | |
| 8,933,874 | B2 | 1/2015 | Lundqvist et al. | |
| 8,947,320 | B2 | 2/2015 | King et al. | |
| 9,009,984 | B2 | 4/2015 | Caskey et al. | |
| 9,088,006 | B2 | 7/2015 | Yamazaki et al. | |
| 9,582,043 | B2 | 2/2017 | Hirakata | |
| 9,627,648 | B2 | 4/2017 | Yamazaki et al. | |
| 9,747,428 | B2 | 8/2017 | Tartz et al. | |
| 9,818,961 | B2 | 11/2017 | Hiroki et al. | |
| 10,003,047 | B2 | 6/2018 | Yamazaki et al. | |
| 10,381,599 | B2 | 8/2019 | Yamazaki et al. | |
| 10,606,995 | B2 | 3/2020 | Uebuchi et al. | |
| 10,628,103 | B2 | 4/2020 | Iwaki et al. | |
| 10,903,453 | B2 | 1/2021 | Yamazaki et al. | |
| 11,036,962 | B2 | 6/2021 | Chen et al. | |
| 11,321,039 | B2 | 5/2022 | Iwaki et al. | |
| 11,360,603 | B2 | 6/2022 | Yamazaki et al. | |
| 11,487,373 | B2 | 11/2022 | Kubota et al. | |
| 11,621,407 | B2 | 4/2023 | Yamazaki et al. | |
| 11,789,568 | B2 | 10/2023 | Kubota et al. | |
| 11,882,755 | B2 | 1/2024 | Kubota et al. | |
| 12,099,686 | B2 | 9/2024 | Kubota et al. | |
| 12,239,005 | B2 | 2/2025 | Kubota et al. | |
| 2004/0225880 | A1 | 11/2004 | Mizrah | |
| 2007/0289097 | A1 | 12/2007 | Barnett | |
| 2011/0242035 | A1 | 10/2011 | Nozawa et al. | |
| 2015/0213245 | A1 | 7/2015 | Tartz et al. | |
| 2015/0227223 | A1* | 8/2015 | Kang | G06F 3/0482 345/173 |
| 2016/0085268 | A1 | 3/2016 | Aurongzeb et al. | |
| 2016/0378961 | A1 | 12/2016 | Park | |
| 2018/0101259 | A1 | 4/2018 | No et al. | |
| 2018/0198896 | A1 | 7/2018 | Kang et al. | |
| 2018/0268118 | A1 | 9/2018 | Uebuchi et al. | |
| 2019/0004764 | A1 | 1/2019 | Son et al. | |
| 2019/0294770 | A1* | 9/2019 | Han | G06V 40/13 |
| 2019/0303644 | A1 | 10/2019 | Lee | |
| 2022/0013061 | A1 | 1/2022 | Hsieh et al. | |
| 2022/0198863 | A1 | 6/2022 | Ho et al. | |

FOREIGN PATENT DOCUMENTS

| | | | |
|---|---|---|---|
| EP | 3100194 | A | 12/2016 |
| EP | 3151163 | A | 4/2017 |
| EP | 3190476 | A | 7/2017 |
| EP | 3376422 | A | 9/2018 |
| JP | 04-086349 | A | 7/1992 |
| JP | 2001-143077 | A | 5/2001 |
| JP | 2011-221675 | A | 11/2011 |
| JP | 2012-508405 | | 4/2012 |
| JP | 2014-197522 | A | 10/2014 |
| JP | 2017-511912 | | 4/2017 |
| JP | 2017-130158 | A | 7/2017 |
| JP | 2018-152815 | A | 9/2018 |
| KR | 2016-0114108 | A | 10/2016 |
| TW | 201216734 | | 4/2012 |
| TW | 201305789 | | 2/2013 |
| TW | 201714117 | | 4/2017 |
| WO | WO-2010/028394 | | 3/2010 |
| WO | WO-2010/028397 | | 3/2010 |
| WO | WO-2010/028399 | | 3/2010 |
| WO | WO-2010/028402 | | 3/2010 |
| WO | WO-2010/028403 | | 3/2010 |
| WO | WO-2010/028404 | | 3/2010 |
| WO | WO-2010/028405 | | 3/2010 |
| WO | WO-2010/028406 | | 3/2010 |
| WO | WO-2010/028407 | | 3/2010 |
| WO | WO-2011/100331 | | 8/2011 |
| WO | WO-2012/144808 | | 10/2012 |
| WO | WO-2015/116403 | | 8/2015 |

OTHER PUBLICATIONS

Written Opinion (Application No. PCT/IB2022/053554) Dated Jul. 19, 2022.

Taiwanese Office Action (Application No. 111114822) Dated Feb. 5, 2026.

* cited by examiner

ELECTRONIC DEVICE AND AUTHENTICATION METHOD OF ELECTRONIC DEVICE

TECHNICAL FIELD

One embodiment of the present invention relates to an electronic device.

Note that one embodiment of the present invention is not limited to the above technical field. Examples of the technical field of one embodiment of the present invention include a semiconductor device, a display apparatus, a light-emitting apparatus, a power storage device, a memory device, a lighting device, an input device (e.g., a touch sensor or the like), an input/output device (e.g., a touch panel or the like), a driving method or usage thereof, and a manufacturing method thereof.

Note that in this specification and the like, a semiconductor device generally means a device that can function by utilizing semiconductor characteristics. A transistor and a semiconductor circuit are embodiments of semiconductor devices. In addition, in some cases, a memory device, a display apparatus, an imaging device, or an electronic device includes a semiconductor device.

BACKGROUND ART

In recent years, display apparatuses have been used in various applications. Examples of applications of large-sized display apparatuses are television devices for home, digital signage, PID (Public Information Display), and the like. Examples of applications of small- and medium-sized display apparatuses are portable information terminals such as smartphones and tablet terminals.

Light-emitting apparatuses including light-emitting devices have been developed as display apparatuses, for example. Light-emitting devices utilizing an electroluminescence (hereinafter referred to as EL) phenomenon have features such as thinness, small weight, high-speed response, and capability of low-voltage driving. Patent Document 1, for example, discloses a flexible light-emitting apparatus.

REFERENCE

Patent Document

[Patent Document 1] Japanese Published Patent Application No. 2014-197522

SUMMARY OF THE INVENTION

Problems to be Solved by the Invention

Electronic devices such as cellular phones, smartphones, tablet type computers, and laptop computers are fabricated with appropriate size depending on their functions and usability. In addition, to improve their portability, reduction in weight is desired. Capability of being deformed into a smaller size by being folded, for example, is also preferable.

Since electronic devices that include display apparatuses are used for a variety of applications as described above, they are desired to have higher functionality. For example, a more convenient electronic device can be achieved with a user interface function, an image capturing function, authentication function, or the like. As a user interface, an input function such as a touch panel is often used.

Thus, an object of one embodiment of the present invention is to provide a lightweight, foldable electronic device. Another object is to provide an electronic device having an input function on the display portion. Another object is to provide an electronic device having an authentication function. Another object is to provide a novel electronic device. Another object is to provide an authentication method using the above electronic device. Another object is to provide a novel semiconductor device or the like.

Note that the description of these objects does not preclude the existence of other objects. One embodiment of the present invention does not have to achieve all of these objects. Note that other objects will be apparent from the description of the specification, the drawings, the claims, and the like, and other objects can be derived from the description of the specification, the drawings, the claims, and the like.

Means for Solving the Problems

One embodiment of the present invention is an electronic device that includes a display apparatus with an input function.

One embodiment of the present invention is an electronic device including a display portion including a light-emitting device and a light-receiving device, in which the light-emitting device and the light-receiving device are placed close to each other, the display portion displays a keyboard key with a plurality of the light-emitting devices, a first character string is input by first touch operation on the keyboard key with a finger, an image of a fingerprint of the finger used for the first touch operation is captured by a plurality of the light-receiving devices provided close to the plurality of light-emitting devices displaying the keyboard key used when the first character string is input, and information of the first character string and information of the fingerprint of the finger used for the first touch operation are compared with registered information to perform authentication.

It is preferable that the first touch operation be performed with the plurality of light-receiving devices or a capacitive sensor as an input device.

When a second character string is input by second touch operation on the keyboard key with a finger, after the authentication, an image of a fingerprint of the finger used for the second touch operation is captured by the plurality of light-receiving devices provided close to the plurality of light-emitting devices displaying the keyboard key used when the second character string is input, and authentication can be performed by comparing information of the fingerprint of the finger used for the second touch operation with the registered information.

The display portion includes a display apparatus having flexibility, the display apparatus is fitted into a first housing and a second housing, and the keyboard key can be displayed when the first housing and the second housing make a certain angle. The electronic device further includes a hinge jig, the hinge jig includes a first shaft hole, a second shaft hole, and a lock component, the lock component includes a spring and a ball, the first housing includes a first shaft, the second housing includes a second shaft, a plurality of dent portions are provided close to the first shaft and the second shaft, the first shaft is inserted in the first shaft hole, the second shaft is inserted in the second shaft hole, and the angle can be fixed by the ball entering any of the plurality of dent portions.

Another embodiment of the present invention is a method for authentication of an electronic device performing touch operation and fingerprint image capturing on a display portion, in which a keyboard key is displayed on the display portion, a first character string is input by first touch operation with a finger, to the keyboard key, an image of a fingerprint of the finger inputting the first character string is captured when the first touch operation is performed, and whether or not the first character string matches registered information and whether or not information of the fingerprint of the finger inputting the first character string matches the registered information are checked.

After the information of the first character string and the fingerprint of the finger inputting the first character string matches the registered information, a second character string is input by second touch operation with a finger, to the keyboard key, an image of a fingerprint of the finger inputting the second character string is captured when the second touch operation is performed, whether or not the second character string matches the registered information and whether or not information of the fingerprint of the finger inputting the second character string matches the registered information are checked, and authentication may be performed when information of the second character string and the fingerprint of the finger inputting the second character string match the registered information.

When third touch operation is performed with a finger to the keyboard key after the authentication, an image of a fingerprint of the finger is captured, and whether or not information of the fingerprint of the finger for the third touch operation matches the registered information is checked, and authentication can be canceled when the information of the fingerprint of the finger for the third touch operation does not match the registered information.

Effect of the Invention

According to one embodiment of the present invention, a lightweight, foldable electronic device can be provided. An electronic device having an input function on the display portion can be provided. An electronic device having an authentication function can be provided. A novel electronic device can be provided. An authentication method using the above electronic device can be provided. A novel semiconductor device or the like can be provided.

Note that the description of these effects does not preclude the existence of other effects. One embodiment of the present invention does not have to have all of these effects. Other effects can be derived from the description of the specification, the drawings, and the claims.

MODE FOR CARRYING OUT THE INVENTION

Figure 1:
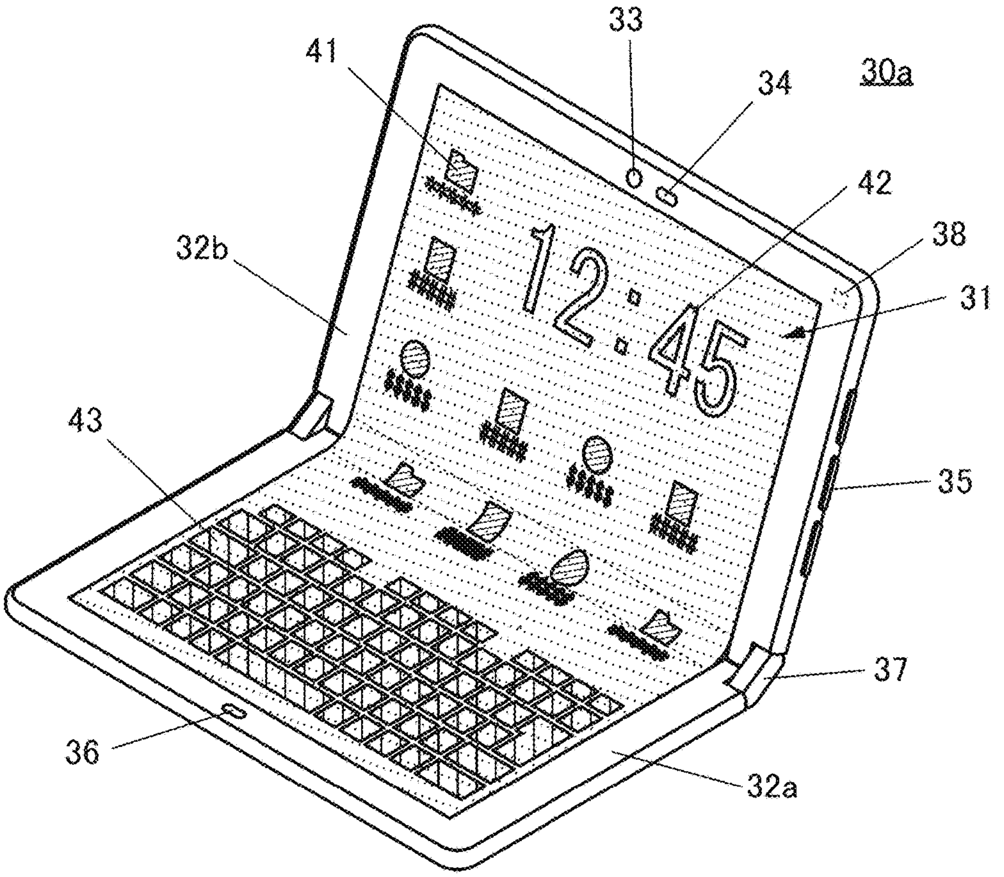
FIG. 1 is a diagram illustrating an electronic device.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that operate as a switch are connected in series or in parallel. Furthermore, in some cases, capacitors are divided and arranged in a plurality of positions.

In addition, one conductor has a plurality of functions such as a wiring, an electrode, and a terminal in some cases.

In this specification, a plurality of names are used for the same component in some cases. Even in the case where components are illustrated in a circuit diagram as if they were directly connected to each other, the components may actually be connected to each other through one or more conductors; in this specification, even such a structure is included in direct connection.

Embodiment 1

In this embodiment, electronic devices of one embodiment of the present invention will be described.

One embodiment of the present invention is an electronic device including a foldable display apparatus. The display apparatus has an input function, an authentication function, or the like, and is capable of operating the electronic device with or without contact. The display apparatus includes a light-emitting device (also referred to as a light-emitting element) in a display portion. The display apparatus can also include a light-receiving device (also referred to as a light-receiving element) placed close to the light-emitting device.

The light-emitting device has a function of performing display. In addition, the light-emitting device may also have a light-emitting function for aiding input operation. The light-receiving device has an imaging function and a function of a sensor for performing input operation.

An organic EL element formed with a high aperture ratio in a pixel can be used as the light-emitting device. The organic EL element can be fabricated through a lithography process; thus, the aperture ratio can be higher than that in a case where the organic EL element is formed using a metal mask with low alignment accuracy. Accordingly, high luminance can be achieved even when the current density of the organic EL element is reduced, and the reliability of the element can be improved. Furthermore, the provision of the organic EL element over a flexible substrate material makes the display portion foldable, which enables the formation of a small, lightweight electronic device.

FIG. 1 is a diagram illustrating an electronic device 30*a* of one embodiment of the present invention. FIG. 1 shows an example of a tablet computer as the electronic device 30*a*, in which a display portion 31 displays an icon 41, a clock 42, and keyboard keys 43. The electronic device 30*a* includes a housing 32*a*, a housing 32*b*, a camera 33, a microphone 34, a push button 35, a speaker 36, a hinge jig 37, and the like. The push button 35 can have a function of a power switch, a volume control, or the like.

The electronic device 30*a* can have a variety of functions. For example, the electronic device 30*a* can have a function of displaying a variety of information (a still image, a moving image, a text image, and the like) on the display portion, a function of displaying a calendar, date, time, or the like, a function of executing a variety of software (programs), a wireless communication function, and a function of reading a program or data stored in a recording medium.

The electronic device 30*a* may include a sensor 38 (a sensor having a function of measuring force, displacement, position, speed, acceleration, angular velocity, rotational frequency, distance, capacitance, light, liquid, magnetism, temperature, chemical substance, sound, time, hardness, electric field, current, voltage, power, radiation, flow rate, humidity, gradient, oscillation, odor, or infrared rays). The sensor 38 can be used for input operation, measurement operation, operation control of the electronic device, or their assistance.

The electronic device 30*a* is foldable, and includes a flexible display apparatus in the display portion 31. The display apparatus includes a light-emitting device such as an organic EL element over a flexible substrate, and is fitted into the housing 32*a* and the housing 32*b*. The display apparatus is provided with an input device in addition to the light-emitting device, and is capable of input operation with or without contact. An optical sensor (a light-receiving device), a capacitive sensor, a combination thereof, or the like can be used as the input device.

The housing 32*a* and the housing 32*b* are connected to each other via the hinge jig 37. Thus, with the vicinity of the hinge jig 37 as the center, a condition where the housing 32*a* and the housing 32*b* are parallel and next to each other (see FIG. 2A), a condition where the housing 32*a* and the housing 32*b* make an angle larger than 0° and smaller than 180°, or a condition where the housing 32*a* and the housing 32*b* overlap each other (see FIG. 2B) can be made.

FIG. 1 is an example of the condition where the housing 32*a* and the housing 32*b* make an angle larger than 0° and smaller than 180°, and shows the condition where the angle is slightly larger than 90°. This angle makes the use of the electronic device easy when the housing 32*a* is placed on a plane surface such as a tabletop and the head of a user is positioned higher than the housing 32*b*. In the case where the electronic device is used with this angle, keyboard input is suitable as input operation, because of the affinity for the human body.

When the angle between the housing 32*a* and the housing 32*b* is 85° to 135°, preferably 90° to 130°, more preferably 95° to 125°, for example, the keyboard keys 43 may be automatically displayed in the case where input operation is needed, so that the user can immediately perform input operation with both hands. Note that a setting where the keyboard keys 43 are not automatically displayed can also be selected.

Figure 2A:
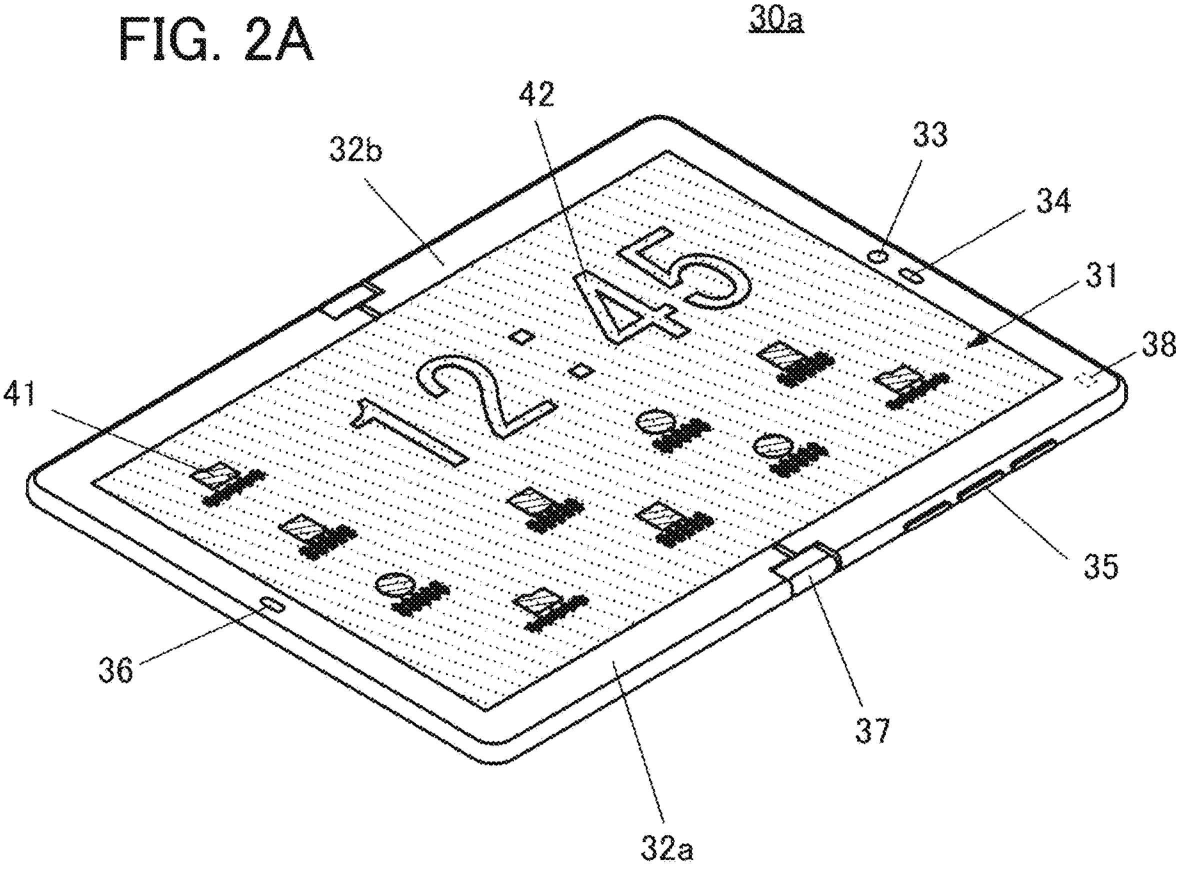
FIG. 2A and FIG. 2B are diagrams illustrating an electronic device.

In contrast, in the case where the electronic device is used at the angle shown in FIG. 2A, the housing is held by one hand in some cases, in which case two-handed keyboard input might not be performed. Thus, the keyboard may displayed depending on the user's preference. Note that the direction of display can be changed, by detecting the angle of the housings with the sensor 38 included in the electronic device 30*a*, to a direction which is easier for the user to see.

Figure 2B:
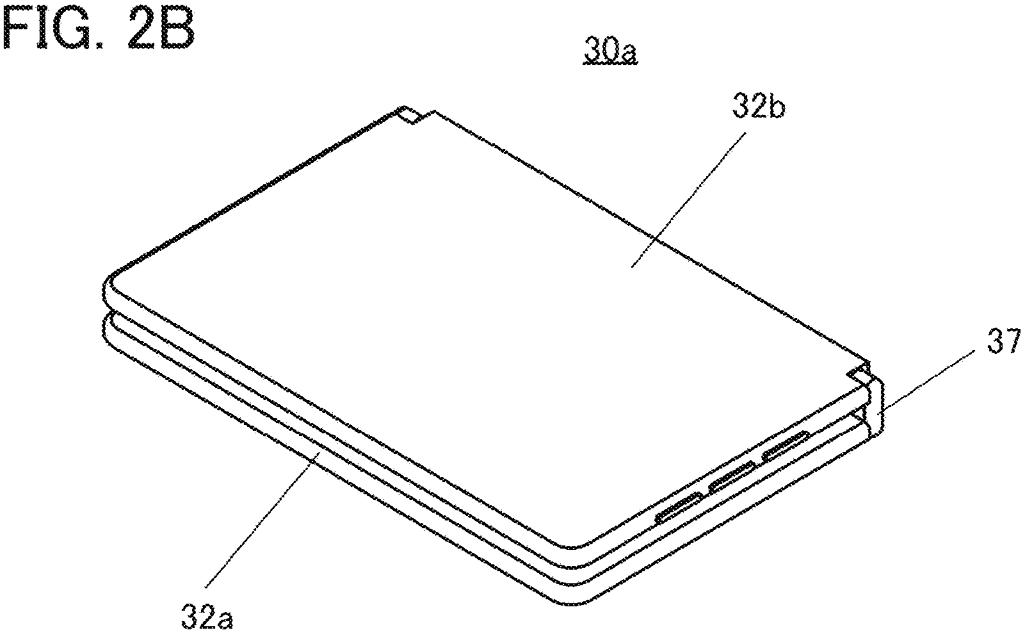

It is also possible to provide a function of setting a standby state with the display and the like being turned off or a power-off state when the angle of the electronic device is as shown in FIG. 2B. The state shown in FIG. 2B where the electronic device is folded can improve the portability. Furthermore, with the display portion 31 being protected by the housings 32*a* and 32*b*, resistance to drop can be improved.

Figure 3A:
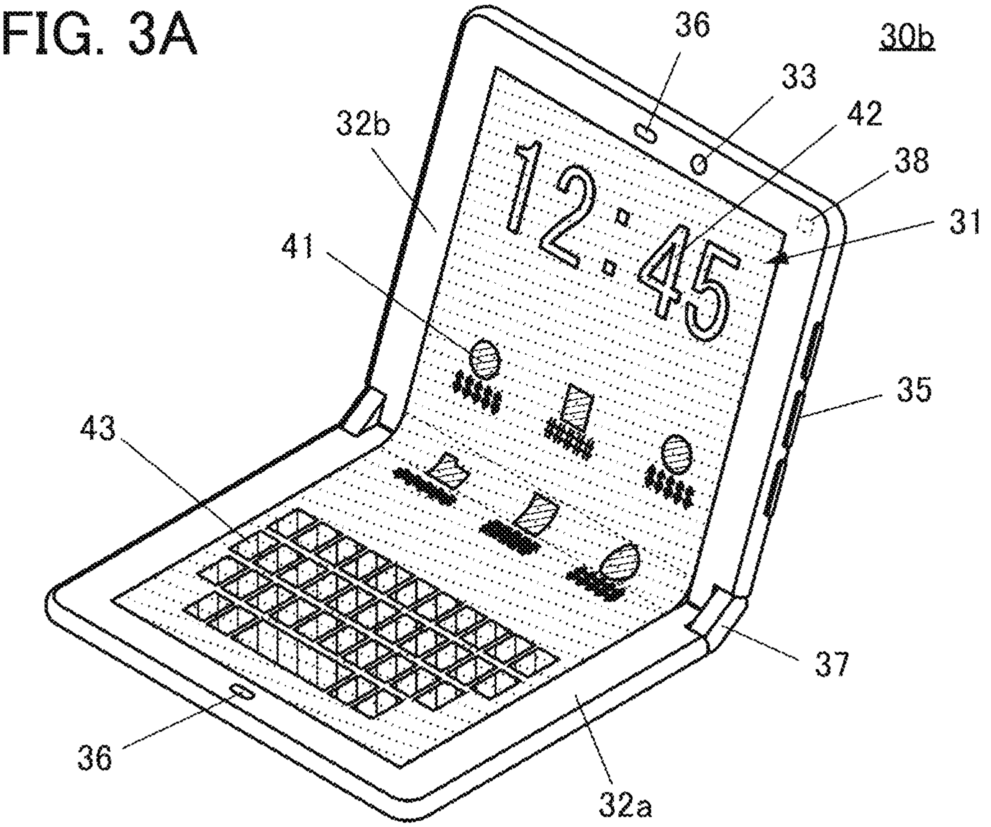
FIG. 3A to FIG. 3C are diagrams illustrating an electronic device.
Figure 3B:
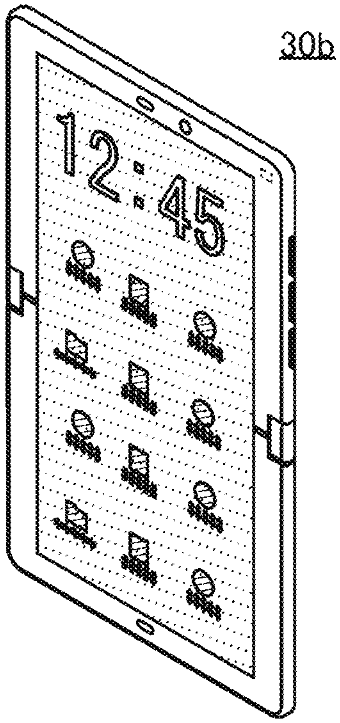
Figure 3C:
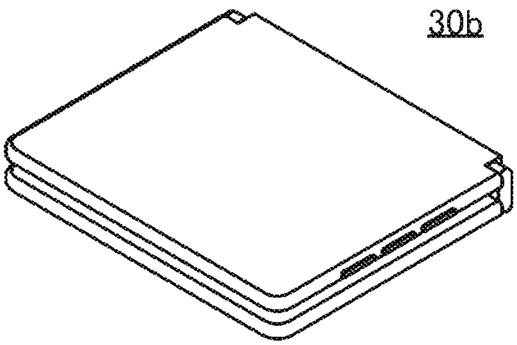

Although the tablet computer is illustrated in FIG. 1, FIG. 2A, and FIG. 2B, one embodiment of the present invention may be a smartphone-type electronic device as shown in FIG. 3A to FIG. 3C. The smartphone-type electronic device 30*b* is different from the electronic device 30*a* in that it is small-sized and has a telephone function; however, it can have other functions and other types of elements that are equivalent to those of the electronic device 30*a*.

Here, the hinge jig 37 and the surrounding elements will be described. Although the angle between the housing 32*a* and the housing 32*b* can be adjusted as described above, it is not preferable if the angle is changed unintentionally. Unintentional change in the angle may hinder the visibility of the display portion and the input operation, for example. Unintentional change in the angle also has a risk of pinching a finger or the like. Thus, it is preferable that angle be retained during the use of the electronic device.

Figure 4A:
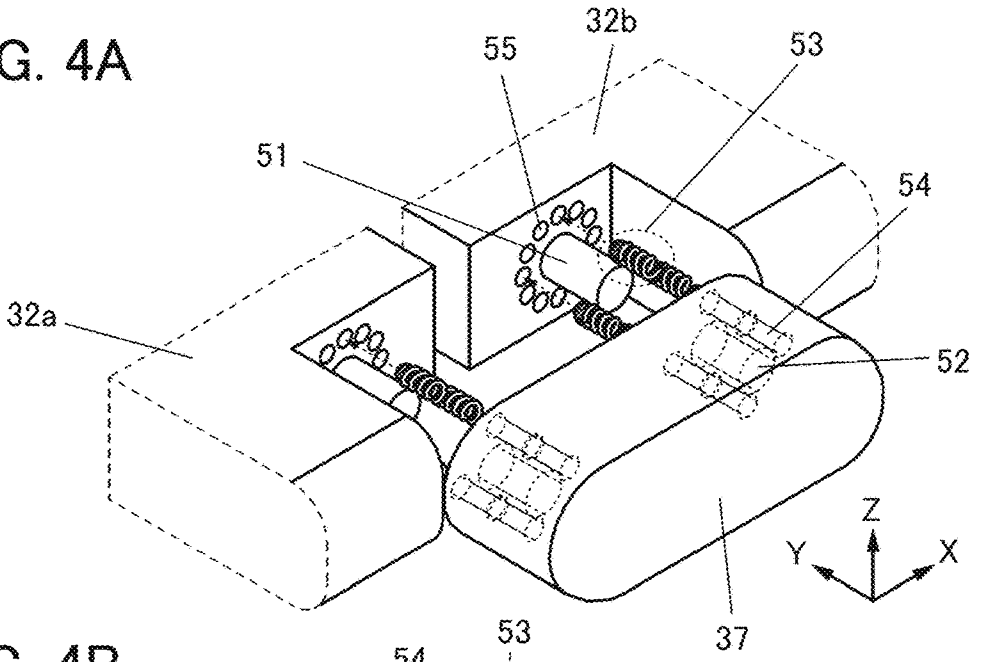
FIG. 4A to FIG. 4D are diagrams illustrating a structure of a hinge mechanism.
Figure 4B:
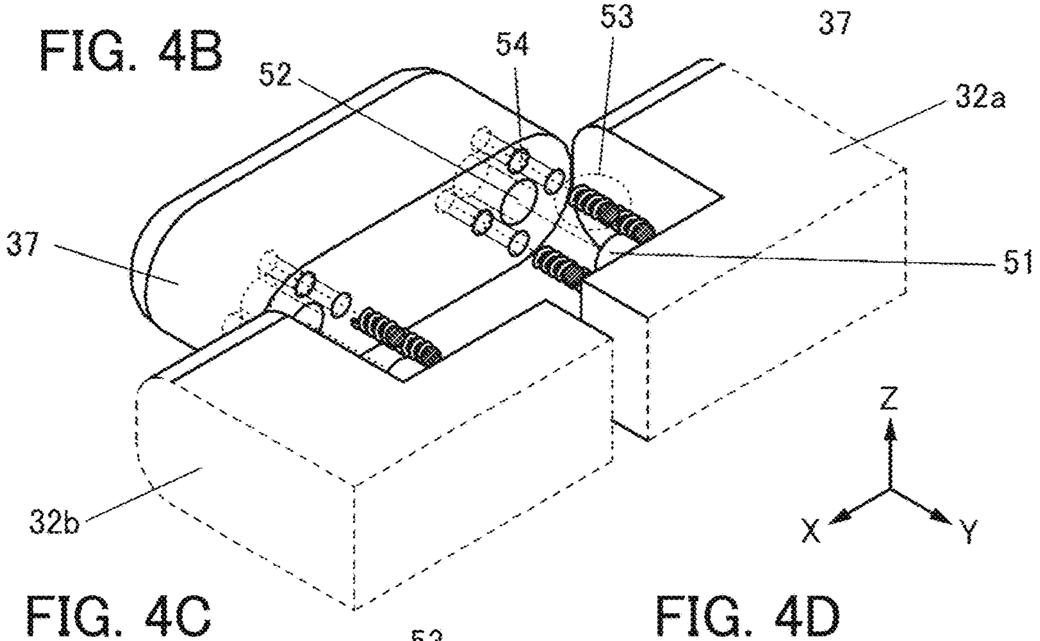

FIG. 4A and FIG. 4B illustrate the hinge jig 37 and the surrounding elements. Note that the hinge jig 37 is an element of part of the mechanism functioning as a hinge, and the mechanism including the hinge jig 37 and the surrounding elements functions as a hinge. The hinge jig 37 includes two pairs of components and parts having the same structure; one of them is combined with an element included in the housing 32*a* and the other is combined with an element included in the housing 32*b*. Note that the components and parts having the same structure are denoted by the same reference numerals.

The hinge jig 37 includes a shaft hole 52 and a plurality of holes 54. The holes 54 are provided around the shaft hole 52, and a lock component 53 having a ball at the end of a spring is inserted in the hole 54. It is preferable that the plurality of holes 54 be provided at regular intervals (at equal angles) on a first circle centered at the shaft hole 52. The hinge jig 37 includes two pairs of these components and parts.

The housing 32*a* and the housing 32*b* each include a shaft 51 and a plurality of dent portions 55. The dent portions 55 are provided around the shaft 51. It is preferable that the plurality of dent portions 55 be provided at regular intervals (at equal angles) on a second circle centered at the shaft 51. Note that the curvature radius of the first circle and that of the second circle are the same.

The shaft 51 of the housing 32*a* is inserted in one of the shaft holes 52 of the hinge jig 37, and the shaft 51 of the housing 32*b* is inserted in the other shaft hole 52 of the hinge jig 37, whereby the housing 32*a* and the housing 32*b* are connected to each other via the hinge jig 37. The inside diameter of the shaft hole 52 is larger than the diameter of the shaft 51, and rotational movement can be made between the hinge jig 37 and the housing 32*a*, and between the hinge jig 37 and the housing 32*b*. Note that the shaft holes 52 may be provided in the housings 32*a* and 32*b*, and the two shafts 51 may be provided on the hinge jig 37.

Figure 4C:
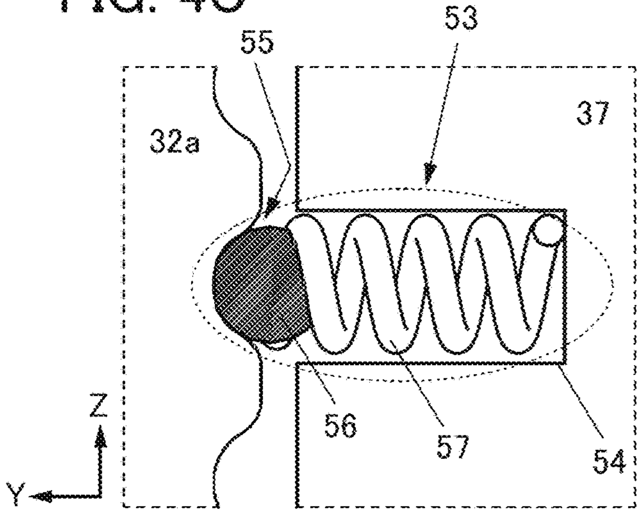

At this time, as shown in the inside view of around the lock component 53 in FIG. 4C, a ball 56 enters the dent portion 55 due to the elasticity of a spring 57, which brings into a simply-locked state. When bending movement is made between the housing 32*a* and the housing 32*b* with a force greater than a certain strength, the ball 56 comes out from the dent portion 55, which creates an unlocked state. As the bending movement is further made, the ball 56 enters another dent portion 55, which creates a simply-locked state again.

Figure 4D:
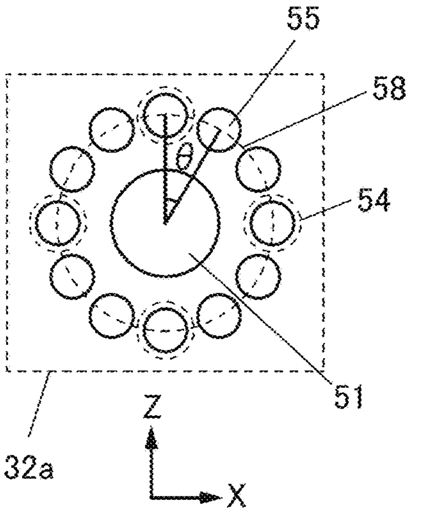
Figure 5A:
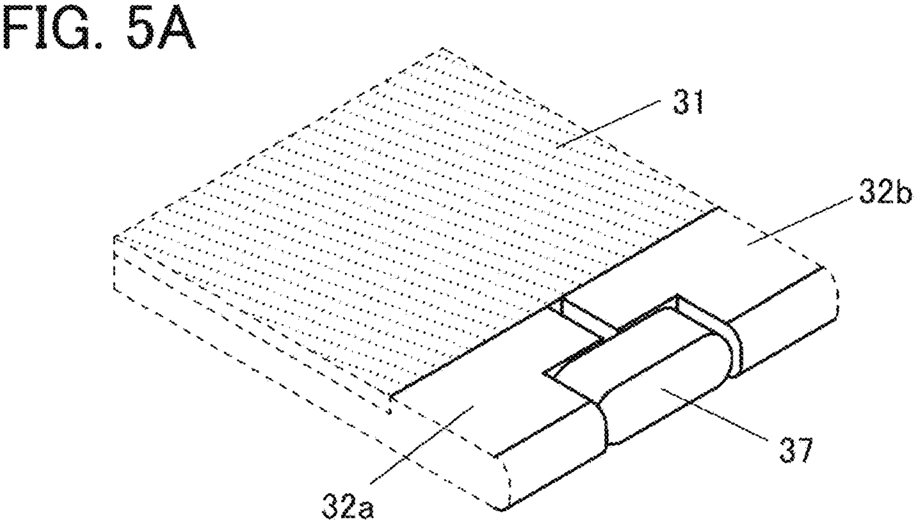
FIG. 5A to FIG. 5D are diagrams illustrating an electronic device.
Figure 5B:
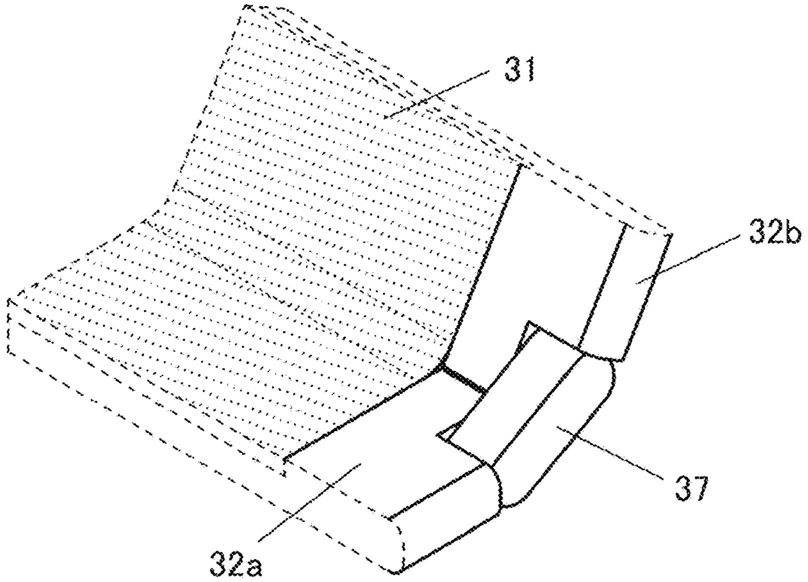
Figure 5C:
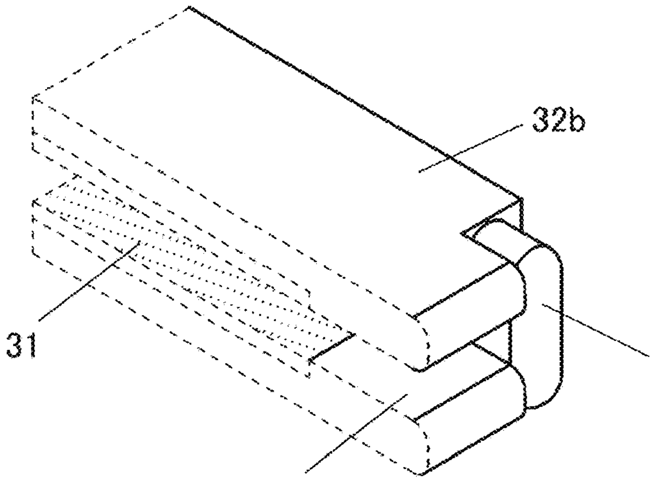

Here, as illustrated in FIG. 4D, the plurality of dent portions 55 are provided at regular intervals (an equal angle θ) on a second circle 58, which enables the housing 32*a* and the housing 32*b* to be fixed at several angles. For example, in the case where the dent portions 55 are provided at 30° intervals and rotation is made with a combination of one of the shaft holes 52 and the shaft 51, the angle made between the housing 32*a* and the housing 32*b* is 180 (see FIGS. 5A), 150°, 120° (see FIG. 5B), or 90°. When additional rotation with a combination of the other shaft hole 52 and the shaft 51 is made, the angle can also be 60°, 30°, or 0° (see FIG. 5C).

Note that although FIG. 4A and FIG. 4B each show an example in which there are four pairs of the hole 54 and the lock component 53 around the shaft hole 52, one pair is also acceptable, and the number of pairs may be the same as the number of dent portions 55 at maximum. A larger number can increase the lock strength, but too many pairs of the hole 54 and the lock component 53 would make it difficult for the holes and lock components to be placed inside the hinge jig 37. In addition, the spring 57 would need to be thin and the diameter of the ball 56 would need to be small, which may decrease the lock strength. In the case where a plurality of holes 54 and lock components 53 are provided, the holes 54 and the dent portions 55 are provided at appropriate positions such that the plurality of lock components 53 work simultaneously (see FIG. 4D).

Since there are two combinations of the shaft hole 52 and the shaft 51 in the hinge portion, the number of dent portions 55 and lock components 53 around the shaft hole 52 and the shaft 51 can be increased, whereby the lock strength can be increased. In particular, in the case where the electronic device is thin, the lock component 53 needs to be small; thus, the above structure is preferable.

Figure 5D:
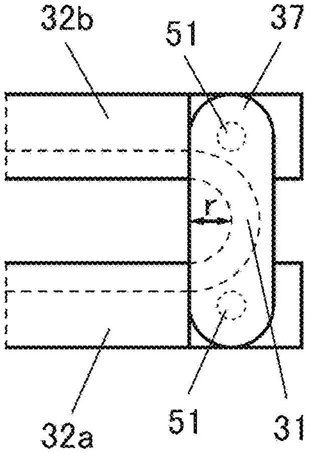

With the presence of two shafts 51, there is a space between the housing 32*a* and the housing 32*b* when the electronic device is folded, as shown in the side view in FIG. 5D. Thus, even in the condition where the electronic device is folded, the bent portion of the flexible display apparatus can have a certain curvature radius r and the reliability of the display portion 31 can be improved. The curvature radius r can be adjusted with the distance between one shaft hole 52 and the other shaft hole 52 provided in the hinge jig 37.

Note that when the electronic device is folded, the curvature radius r is preferably small so that the thickness can be reduced. However, improvement in the display apparatus is also required in order to reduce the curvature radius r. The electronic device of one embodiment of the present invention includes an input device, and an optical sensor or a capacitive sensor can be used for the input device.

Here, a light-receiving device that can be formed through the same process as a light-emitting device can be used as the optical sensor. Thus, in the case where a capacitive sensor is unnecessary, the manufacturing cost can be reduced.

Furthermore, a light-receiving device can be formed on the same plane as a light-emitting device; unlike a capacitive sensor, it does not need to be formed over a light-emitting device. Thus, the display apparatus can be formed thin. Hence, the stress at the time of bending can be easily relieved, and high reliability can be maintained even in the case where the curvature radius r is small.

A light-receiving device is capable of sensing a change in the amount of light and converting it to input operation, which enables contactless input operation. For example, operation of the electronic device located beyond the user's reach becomes possible. In addition, the need for a part of the body such as a finger to directly touch the display portion 31 is eliminated, enabling hygienic use of the electronic device. Moreover, even in the case where a capacitive sensor would not react or would malfunction, such as when the user wears gloves or when the display screen has water drops on it, a light-receiving device is capable of reliable input operation.

With a light-emitting device that emits infrared light in addition to a light-emitting device that emits visible light, it is possible to display an image while infrared light for sensing is emitted. Thus, the electronic device of one embodiment of the present invention has a structure with high affinity for a function other than a display function (here, a light-receiving function).

In addition, capturing an image of fingerprints, palm prints, a vein, or the like by the light-receiving device enables personal authentication. Note that the electronic device of one embodiment of the present invention may include a light-receiving device and a capacitive sensor both as input devices.

In one embodiment of the present invention, light-emitting devices that exhibit colors such as R (red), G (green), and B (blue) are separately fabricated with the use of a lithography process; thus, unlike a case using a light-emitting device that emits white light, a color filter is not required. Thus, the display apparatus can be made even thinner, and the reliability against bending can be improved.

Next, an authentication function using the input device, in the electronic device 30*a*, will be described. Note that fingerprint matching using the light-receiving device as the input device will be described here; however, fingerprint matching may be performed using a capacitive sensor. Vein matching, instead of fingerprint matching, may also be performed.

Figure 6A:
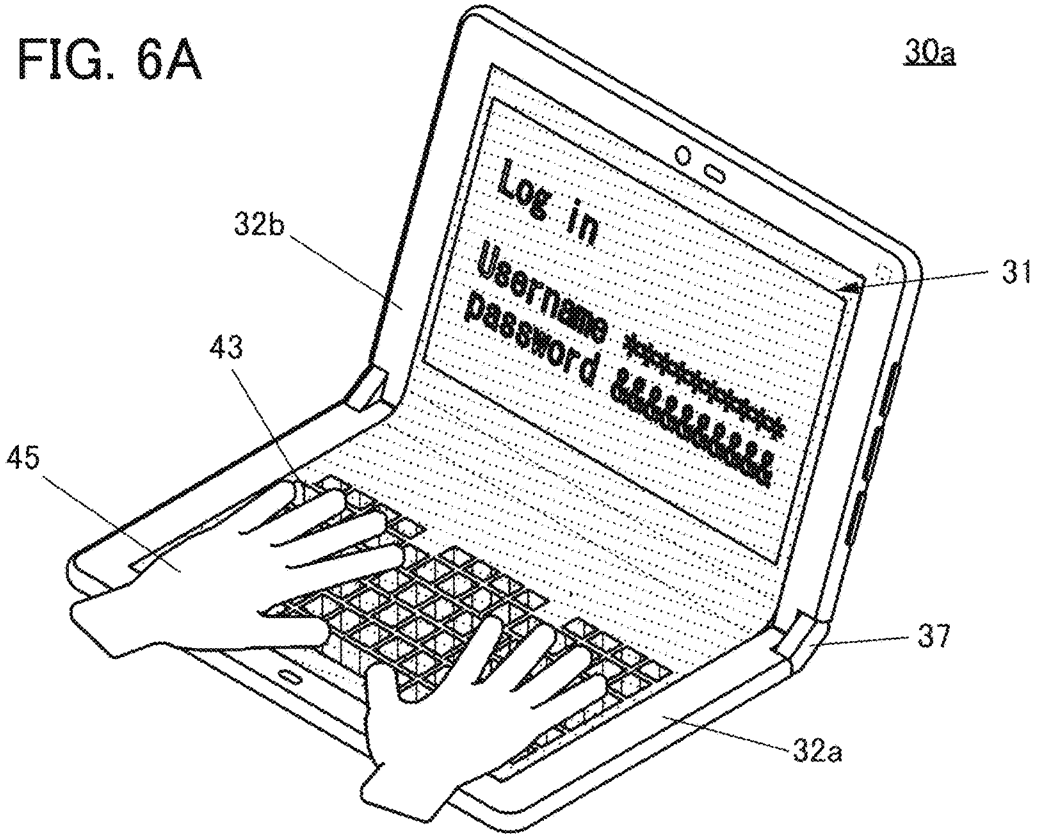
FIG. 6A and FIG. 6B are diagrams illustrating an authentication method for an electronic device.

FIG. 6A is a diagram showing login operation when the electronic device 30*a* is used. Here, login is operation to obtain permission to use the electronic device, to access a specific device through a network, to access a website, or the like; it can also be referred to as approval.

The light-receiving device is provided in the display portion 31 of the electronic device 30*a*, and an image of the fingerprint can be captured when the finger of a hand 45 touches the display portion 31. In addition, the keyboard keys 43 are displayed on the display portion 31. An image of the fingerprint can be captured, for example, by using light of the light-emitting device for displaying the keyboard keys 43 and capturing light reflected from the finger with the light-receiving device provided near the light-emitting device. Alternatively, an image of the fingerprint may be captured by using light with low visibility such as infrared rays emitted from the light-emitting device and capturing light reflected from the finger with the light-receiving device.

Layout of the keyboard keys 43 is, for example, QWERTY layout. For the keyboard in QWERTY layout, any of the ten fingers of left and right hands is assigned to each key. Thus, an image of the fingerprint of each finger can be captured by the light-receiving device provided in the position of each key that is displayed.

Figure 6B:
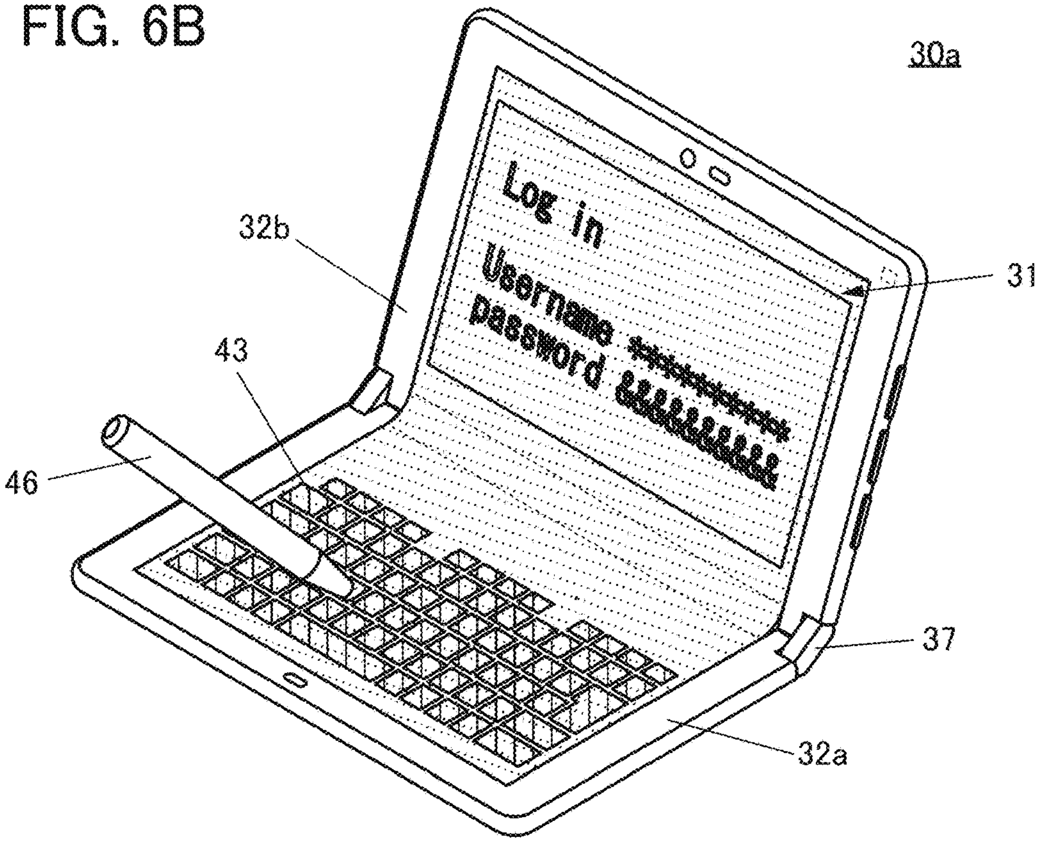

At the time of logging in, character strings such as a name (ID) and a password (which means a string of characters and/or numerals) are generally input; in the electronic device of one embodiment of the present invention, matching of the fingerprint of the finger assigned to the key to input them is also performed. Note that an example in which character strings are used for a name (ID) and a password will be described below; however, a single character may also be used for a name or a password. In FIG. 6A and FIG. 6B, the login screen, name (ID), and password that are displayed are denoted as "Log in", "Username", and "password", respectively, as an example.

In the case where the password is "abcklm", for example, images of the fingerprint of the left little finger that touches "a" key, the fingerprint of the left forefinger that touches "b" key, the fingerprint of the left middle finger that touches "c" key, the fingerprint of the right middle finger that touches "k" key, the fingerprint of the right third finger that touches "l" key, and the fingerprint of the right forefinger that touches "m" key are captured when password input operation is performed, and the images are compared with fingerprint information that are set in advance. Thus, with input and matching of the character strings and image-capturing and matching of the fingerprints assigned to the keys, the electronic device can have high security.

Alternatively, a stylus 46 may be used instead of the finger, as illustrated in FIG. 6B. In this case, the image of a tip shape of the stylus 46 or the like is captured for matching. Alternatively, it is also possible to provide a light source on the tip of the stylus 46 and emit pulsed light to the key without contacting the key, so that the received pulsed light may be used for matching and authentication. In this manner, input operation only with the registered stylus is possible.

Figure 7:
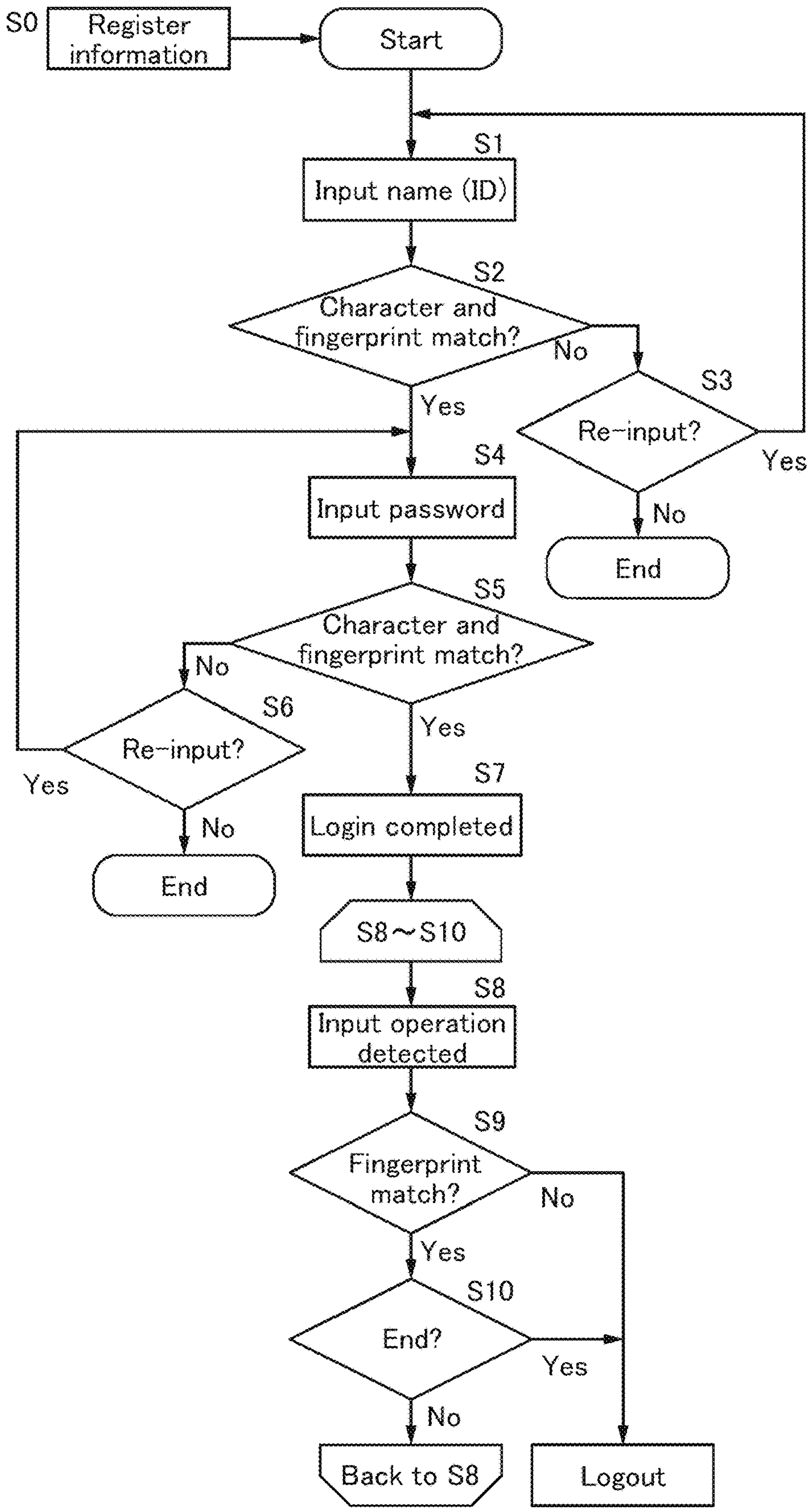
FIG. 7 is a flow chart describing an authentication method for an electronic device.

The authentication operation and security control after the authentication operation in FIG. 6A will be described, with the use of a flow chart shown in FIG. 7.

First, information for authentication is registered (Step S0). This operation is to register at least information of character strings used for a name (ID) and a password and the fingerprint information corresponding to each key in the electronic device by inputting a text or the like that includes the name (ID) and the password in a usual typing way. Since the typing way differs between individuals, the finger to be assigned to each key is determined by the user. Some fingers of both hands or one hand, a single finger, or toes may be used, without limitation to all the fingers of both hands. Note that the above information of character strings used for the name (ID) and the password, and the above fingerprint information are referred to as registered information.

Next, the login screen is displayed, and the name (ID) is input by the keyboard keys 43 being touched (Step S1). Then, whether or not the character string of the name (ID) matches the registered information, and whether or not the fingerprint of the finger that touches each key matches the fingerprint that is registered beforehand are checked (Step S2).

In the case where the character strings match but the fingerprints do not match, or in the case where the accuracy of fingerprint detection is low, re-input is requested (Step S3). In the case where the user is actually the registered individual, he/she goes back to Step S1 to re-input. In the case where the user is not the registered individual, even if the name (ID) matches the registered information, he/she cannot move on to the next step.

In the case where the fingerprints match in Step S2, the user moves on to password input (Step S4). Then, in addition to whether or not the character string of the password matches the registered information, whether or not the fingerprint of the finger that touches each key matches the registered fingerprint is checked (Step S5).

In the case where the character strings match but the fingerprints do not match, or in the case where the accuracy of fingerprint detection is low, re-input is requested (Step S6). In the case where the user is actually the registered individual, he/she goes back to Step S4 to re-input. In the case where the user is not the registered individual, even if the password matches the registered information, he/she cannot log in.

In the case where the fingerprints match in Step S5, login is completed (Step S7). Steps up to this point correspond to the first authentication operation. Although an example in which the character string information matching and fingerprint information matching are performed for each of the name (ID) and the password is described above, matching of the fingerprint information may be combined with either one of the name (ID) and the password. Alternatively, login may be completed by one of the following combinations: name (ID) matching and fingerprint matching, and password matching and fingerprint matching.

Next, security control after the authentication operation will be described. Note that the description here is based on the premise that input operation with the use of the keyboard keys 43 is performed after the first authentication operation.

In the case where there is no input operation, it is preferable to encourage the login operation to be performed again, using a timer or the like.

After completion of login, when the input operation with the use of the keyboard keys 43 is detected (Step S8), whether or not the fingerprint of the finger that touched each key matches the fingerprint that is registered beforehand is checked (Step S9).

In the case where the fingerprints match in Step S9, whether or not to complete the operation is confirmed (Step S10), and in the case where the operation is not completed, Step S8 to Step S10 are repeated. In the case where the entire input operation is not subjected to detection, timer operation or the like may be added before Step S8. Step S8 to Step S10 correspond to the second authentication operation.

In the case where the fingerprints do not match in Step S9, it is possible that the user has been changed during the loop, so that the user is automatically logged out. Logging out can cancel the approval given in the first authentication operation. Note that the loop may be repeated several times before logout, in case the accuracy of fingerprint detection is low. It is also possible to make the login state maintained with matching of part of the fingerprints. The threshold for logout with respect to how much the fingerprints match can be set by the user.

As described above, in the electronic device of one embodiment of the present invention, not only matching of character string information such as a password but also matching of the fingerprint information assigned to the key for inputting the character string information are required for approval; thus, the electronic device can have very high security.

Note that the information of input characters and information of obtained fingerprint may be used for other purposes than the above-described authentication. For example, since fingerprint information enables identification of an individual, it is possible to store a character string or the like that is used often by that individual. With the use of the stored information, automatic modification of mistyping, erroneous conversion, or the like becomes possible. Note that artificial intelligence (AI) or the like may be used to recognize the mistyping or erroneous conversion.

At least part of this embodiment can be implemented in combination with any of the other embodiments described in this specification, as appropriate.

Embodiment 2

In this embodiment, a display apparatus of one embodiment of the present invention will be described. The display apparatus described below as an example can be suitably used for the electronic device described in Embodiment 1.

A display portion of the display apparatus of one embodiment of the present invention includes light-receiving devices and light-emitting devices. The display portion has a function of displaying an image with the use of the light-emitting devices. Furthermore, the display portion has one or both of an image capturing function and a sensing function with use of the light-receiving devices.

Alternatively, the display apparatus of one embodiment of the present invention may be configured to include a light-emitting/receiving device (also referred to as a light-emitting/receiving element) and a light-emitting device.

First, the display apparatus including a light-receiving device and a light-emitting device will be described.

The display apparatus of one embodiment of the present invention includes light-receiving devices and light-emitting devices in the display portion. In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function. The display portion can be used as an image sensor, a touch sensor, or the like. That is, by sensing light with the display portion, an image can be taken and touch operation with an object (e.g., a finger or a stylus) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can sense the reflected light (or the scattered light); thus, image capturing, touch operation sensing, or the like is possible even in a dark place.

The light-emitting device included in the display apparatus of one embodiment of the present invention functions as a display device (also referred to as a display element).

As the light-emitting device, an EL element (also referred to as an EL device) such as an OLED or a QLED is preferably used. Examples of light-emitting substances included in EL elements include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). Alternatively, as the light-emitting device, an LED such as a micro LED can be used.

The display apparatus of one embodiment of the present invention has a function of sensing light using the light-receiving devices.

When the light-receiving devices are used as an image sensor, the display apparatus can capture an image using the light-receiving devices. For example, the display apparatus can be used as a scanner.

An electronic device including the display apparatus of one embodiment of the present invention can acquire data related to biological information such as a fingerprint or a palm print by using a function of an image sensor. That is, a biological authentication sensor can be incorporated in the display apparatus. When the display apparatus incorporates a biological authentication sensor, the number of components of an electronic device can be reduced as compared to the case where a biological authentication sensor is provided separately from the display apparatus; thus, the size and weight of the electronic device can be reduced.

When the light-receiving devices are used as a touch sensor, the display apparatus can detect touch operation by an object with the use of the light-receiving devices. That is, the light-receiving devices can also be referred to as input devices.

As the light-receiving device, a PN photodiode or a PIN photodiode can be used, for example. The light-receiving device functions as a photoelectric conversion element (also referred to as a photoelectric conversion device) that senses light incident on the light-receiving device and generates charge. The amount of electric charge generated from the light-receiving devices depends on the amount of light entering the light-receiving devices.

It is particularly preferable to use an organic photodiode including a layer containing an organic compound as the light-receiving device. An organic photodiode, which is easily made thin, lightweight, and large in area and has a high degree of freedom for shape and design, can be used in a variety of devices.

In one embodiment of the present invention, organic EL elements (also referred to as organic EL devices) are used as the light-emitting devices, and organic photodiodes are used as the light-receiving devices. The organic EL elements and the organic photodiodes can be formed over one substrate. Thus, the organic photodiodes can be incorporated in a display apparatus including the organic EL elements.

If all the layers of the organic EL elements and the organic photodiodes are formed separately, the number of deposition steps becomes extremely large. However, a large number of layers can be shared between the organic photodiodes and the organic EL elements; hence, forming the common layers concurrently can prevent the increase in the number of deposition steps.

For example, one of a pair of electrodes (a common electrode) can be a layer shared by the light-receiving device and the light-emitting device. As another example, at least one of a hole-injection layer, a hole-transport layer, an electron-transport layer, and an electron-injection layer may be shared by the light-receiving device and the light-emitting device. When the light-receiving device and the light-emitting device include a common layer in such a manner, the number of deposition steps and the number of masks can be reduced, thereby reducing the number of manufacturing steps and the manufacturing cost of the display apparatus. Furthermore, the display apparatus including the light-receiving devices can be manufactured using an existing manufacturing apparatus and an existing manufacturing method for the display apparatus.

Next, a display apparatus including a light-emitting/receiving device and a light-emitting device will be described. Note that functions, behavior, effects, and the like similar to those in the above are not described in some cases.

In the display apparatus of one embodiment of the present invention, a subpixel exhibiting any color includes a light-emitting/receiving device instead of a light-emitting device, and subpixels exhibiting the other colors each include a light-emitting device. The light-emitting/receiving device has both a function of emitting light (a light-emitting function) and a function of receiving light (a light-receiving function). For example, in the case where a pixel includes three subpixels of red, green, and blue, at least one of the subpixels includes a light-emitting/receiving device and the other subpixels each include a light-emitting device. Thus, the display portion of the display apparatus of one embodiment of the present invention has a function of displaying an image using both a light-emitting/receiving device and a light-emitting device.

The use of the light-emitting/receiving device serving as both a light-emitting device and a light-receiving device can provide a light-receiving function for the pixel without increasing the number of subpixels included in the pixel. Thus, the display portion of the display apparatus can be provided with one or both of an image capturing function and a sensing function while keeping the aperture ratio of pixels (aperture ratio of subpixels) and the resolution of the display apparatus. Accordingly, in the display apparatus of one embodiment of the present invention, the aperture ratio of the pixel can be more increased and the resolution can be increased more easily than in the case where a subpixel including a light-receiving device is provided separately from a subpixel including a light-emitting device In the display apparatus of one embodiment of the present invention, light-emitting/receiving devices and light-emitting devices are arranged in a matrix in a display portion, and an image can be displayed on the display portion. The display portion can be used as an image sensor, a touch sensor, or the like. In the display apparatus of one embodiment of the present invention, the light-emitting devices can be used as a light source of the sensor. Thus, image capturing, touch operation sensing, or the like is possible even in a dark place.

The light-emitting/receiving device can be manufactured by combining an organic EL element and an organic photodiode. For example, by adding an active layer of an organic photodiode to a layered structure of an organic EL element, the light-emitting/receiving device can be manufactured. Furthermore, in the light-emitting/receiving device formed of a combination of an organic EL element and an organic photodiode, layers common to the organic EL element and the organic photodiode are formed together, so that an increase in the number of deposition steps can be prevented.

For example, one of a pair of electrodes (a common electrode) can be a layer shared by the light-emitting/receiving devices and the light-emitting devices. As another example, at least one of a hole-injection layer, a hole-transport layer, an electron-transport layer, and an electron-injection layer may be shared by the light-emitting/receiving devices and the light-emitting devices.

Note that layers included in the light-emitting/receiving devices might have different functions between the case where the light-emitting/receiving devices function as the light-receiving devices and the case where the light-emitting/receiving devices function as the light-emitting devices. In this specification, the name of a component is based on its function of the case where the light-emitting/receiving devices function as the light-emitting devices.

The display apparatus of this embodiment has a function of displaying images using the light-emitting devices and the light-emitting/receiving devices. That is, the light-emitting device and the light-emitting/receiving device function as a display element.

The display apparatus of this embodiment has a function of sensing light using the light-emitting/receiving devices. The light-emitting/receiving device can sense light having a shorter wavelength than light emitted by the light-emitting/receiving device itself.

When the light-emitting/receiving devices are used as an image sensor, the display apparatus of this embodiment can capture an image using the light-emitting/receiving devices. When the light-emitting/receiving device is used as the touch sensor, the display apparatus of this embodiment can detect touch operation of an object with the use of the light-emitting/receiving device.

The light-emitting/receiving device functions as a photoelectric conversion element. The light-emitting/receiving device can be manufactured by adding an active layer of the light-receiving device to the above-described structure of the light-emitting device. In the light-emitting/receiving device, an active layer of a PN photodiode or a PIN photodiode can be used, for example.

In the light-emitting/receiving device, it is particularly preferable to use an active layer of an organic photodiode including a layer containing an organic compound. An organic photodiode, which is easily made thin, lightweight, and large in area and has a high degree of freedom for shape and design, can be used in a variety of devices.

A display apparatus that is an example of the display apparatus of one embodiment of the present invention will be more specifically described below with reference to drawings.

Structure Example 1 of Display Apparatus

Structure Example 1-1

Figure 8A:
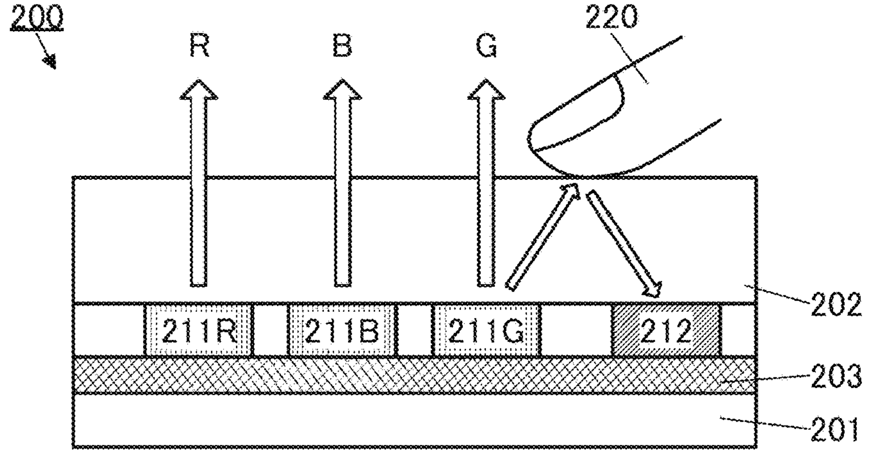
FIG. 8A, FIG. 8B, and FIG. 8D are cross-sectional views each showing an example of a display apparatus.

FIG. 8A is a schematic diagram of a display panel 200. The display panel 200 includes a substrate 201, a substrate 202, a light-receiving device 212, a light-emitting device 211R, a light-emitting device 211G, a light-emitting device 211B, the functional layer 203, and the like.

The light-emitting device 211R, the light-emitting device 211G, the light-emitting device 211B, and the light-receiving device 212 are provided between the substrate 201 and the substrate 202. The light-emitting device 211R, the light-emitting device 211G, and the light-emitting device 211B emit red (R) light, green (G) light, and blue (B) light, respectively. Hereinafter, in the case where the light-emitting device 211R, the light-emitting device 211G, and the light-emitting device 211B are not distinguished from each other, each light-emitting device is referred to as a light-emitting device 211 in some cases.

The display panel 200 includes a plurality of pixels arranged in a matrix. One pixel includes at least one subpixel. One subpixel includes one light-emitting device. For example, the pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving device 212. The light-receiving device 212 may be provided in all the pixels or in some of the pixels. In addition, one pixel may include a plurality of light-receiving devices 212.

FIG. 8A shows a state where a finger 220 touches a surface of the substrate 202. Part of light emitted from the light-emitting device 211G is reflected by a contact portion of the substrate 202 and the finger 220. In the case where part of reflected light or scattered light is incident on the light-receiving device 212, the contact of the finger 220 with the substrate 202 can be sensed. That is, the display panel 200 can function as a touch panel.

The functional layer 203 includes a circuit for driving the light-emitting device 211R, the light-emitting device 211G, and the light-emitting device 211B and a circuit for driving the light-receiving device 212. The functional layer 203 includes a switch, a transistor, a capacitor, a wiring, and the like. Note that in the case where the light-emitting device 211R, the light-emitting device 211G, the light-emitting device 211B, and the light-receiving device 212 are driven by a passive-matrix method, a structure not provided with a switch, a transistor, or the like may be employed.

Figure 8B:
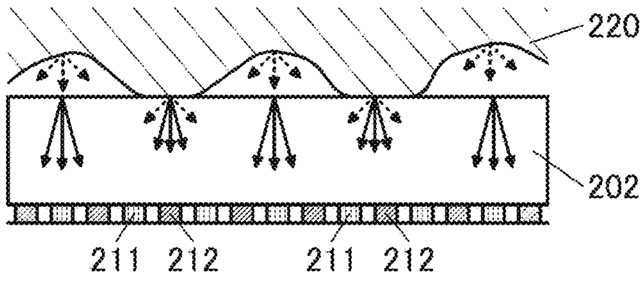

The display panel 200 preferably has a function of sensing a fingerprint of the finger 220. FIG. 8B schematically shows an enlarged view of the contact portion when the finger 220 touches the substrate 202. FIG. 8B shows the light-emitting devices 211 and the light-receiving device 212 that are alternately arranged.

The fingerprint of the finger 220 is formed of depressions and projections. Therefore, as illustrated in FIG. 8B, the projections of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and enters the light-receiving devices 212 which are positioned directly below the contact surfaces or the non-contact surfaces is the sum of intensities of regularly reflected light and diffusely reflected light. As described above, regularly reflected light (indicated by solid arrows) is dominant near the depressions of the finger 220, where the finger 220 is not in contact with the substrate 202; whereas diffusely reflected light (indicated by dashed arrows) from the finger 220 is dominant near the projections of the finger 220, where the finger 220 is in contact with the substrate 202. Thus, the intensity of light received by the light-receiving device 212 positioned directly below the depression is higher than the intensity of light received by the light-receiving device 212 positioned directly below the projection. Accordingly, an image of the fingerprint of the finger 220 can be captured.

When the interval between the light-receiving devices 212 is smaller than the distance between two projections of the fingerprint, preferably the distance between a depression and a projection adjacent to each other, a clear fingerprint image can be obtained. The distance between a depression and a projection of a human's fingerprint is approximately 200 μm; thus, the interval between the light-receiving devices 212 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 8C:
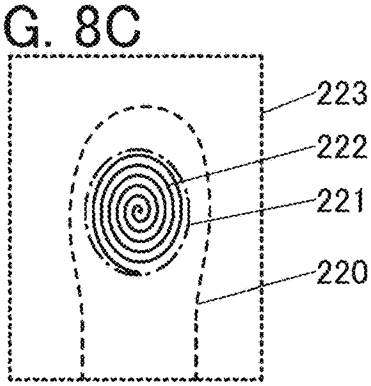
FIG. 8C and FIG. 8E are diagrams each showing an example of an image.

FIG. 8C shows an example of a fingerprint image captured with the display panel 200. In FIG. 8C, in an imaging range 223, the outline of the finger 220 is indicated by a dashed-dotted line and the outline of a contact portion 221 is indicated by a dashed line. In the contact portion 221, a high-contrast image of a fingerprint 222 can be captured by a difference in light incident on the light-receiving device 212.

Figure 8D:
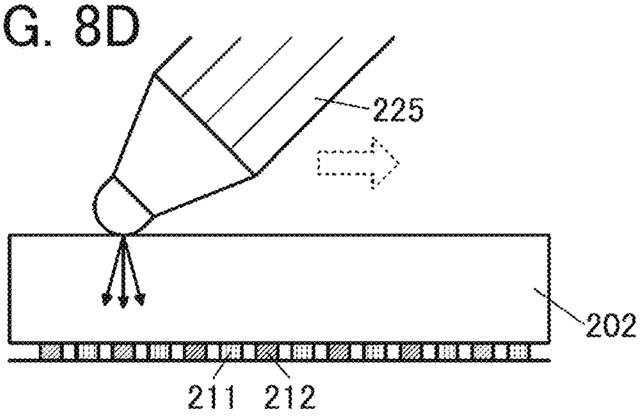

The display panel 200 can also function as a touch panel or a pen tablet. FIG. 8D shows a state in which a tip of a stylus 225 slides in a direction indicated by a dashed-dotted arrow while the tip of the stylus 225 touches the substrate 202.

As shown in FIG. 8D, when diffusely reflected light that is diffused by the contact surface of the tip of the stylus 225 and the substrate 202 is incident on the light-receiving device 212 that overlaps with the contact surface, the position of the tip of the stylus 225 can be sensed with high accuracy.

Figure 8E:
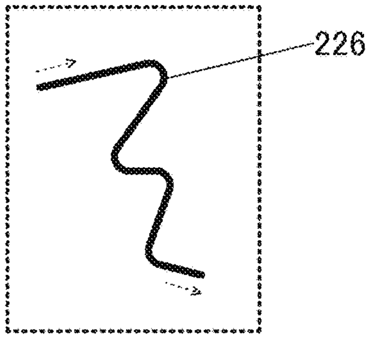

FIG. 8E shows an example of a path 226 of the stylus 225 that is detected in the display panel 200. The display panel 200 can sense the position of an object to be sensed, such as the stylus 225, with high accuracy, so that high-definition drawing can be performed using a drawing application or the like. Unlike the case of using a capacitive touch sensor, an electromagnetic induction touch pen, or the like, the display panel 200 can sense even the position of a highly insulating object to be sensed, the material of a tip portion of the stylus 225 is not limited, and a variety of writing materials (e.g., a brush, a glass pen, a quill pen, and the like) can be used.

Figure 8F:
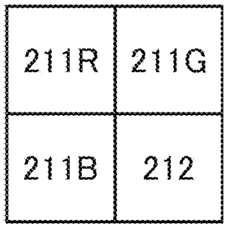
FIG. 8F to FIG. 8H are top views showing examples of a pixel.
Figure 8G:
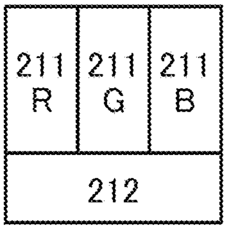
Figure 8H:
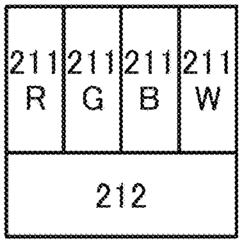

Here, FIG. 8F to FIG. 8H show examples of pixels that can be used for the display panel 200.

Pixels illustrated in FIG. 8F and FIG. 8G each include the light-emitting device 211R for red (R), the light-emitting device 211G for green (G), and the light-emitting device 211B for blue (B), and the light-receiving device 212. The pixels each include a pixel circuit for driving the light-emitting device 211R, the light-emitting device 211G, and the light-emitting device 211B and the light-receiving device 212.

FIG. 8F shows an example in which three light-emitting devices and one light-receiving device are provided in a matrix of 2×2. FIG. 8G shows an example in which three light-emitting devices are arranged in one column and one laterally long light-receiving device 212 is provided below the three light-emitting devices.

The pixel shown in FIG. 8H includes a light-emitting device 211W for white (W). Here, four light-emitting devices are arranged in one line and the light-receiving device 212 is provided below the four light-emitting devices.

Note that the pixel structure is not limited to the above structure, and a variety of pixel arrangements can be employed.

Structure Example 1-2

An example of a structure including a light-emitting device emitting visible light, a light-emitting device emitting infrared light, and a light-receiving device will be described below.

Figure 9A:
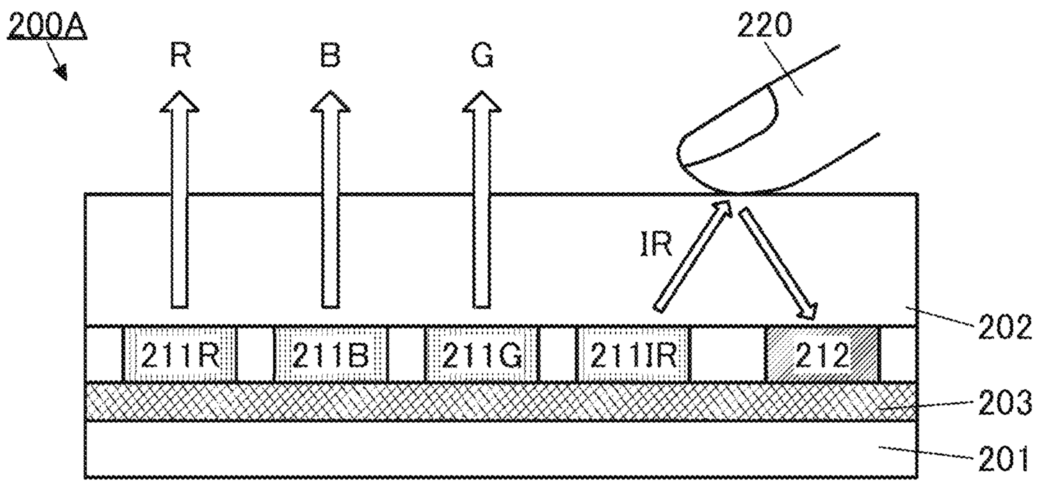
FIG. 9A is a cross-sectional view showing a structure example of a display apparatus.

A display panel 200A illustrated in FIG. 9A includes a light-emitting device 211IR in addition to the components illustrated in FIG. 8A as an example. The light-emitting device 211IR is a light-emitting device emitting infrared light (IR). Moreover, in that case, an element capable of receiving at least the infrared light (IR) emitted from the light-emitting device 211IR is preferably used as the light-receiving device 212. As the light-receiving device 212, an element capable of receiving visible light and infrared light is further preferably used.

As illustrated in FIG. 9A, when the finger 220 touches the substrate 202, the infrared light (IR) emitted from the light-emitting device 211IR is reflected by the finger 220 and part of reflected light is incident on the light-receiving device 212, so that the positional information of the finger 220 can be obtained.

Figure 9B:
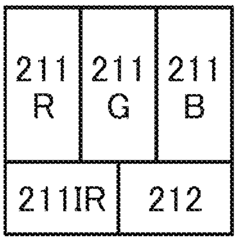
FIG. 9B to FIG. 9D are top views showing examples of a pixel.
Figure 9C:
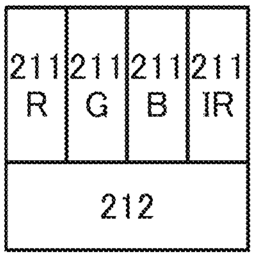
Figure 9D:
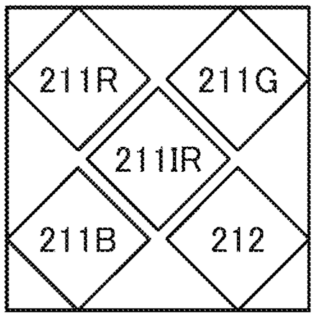

FIG. 9B to FIG. 9D show examples of pixels that can be used for the display panel 200A.

FIG. 9B illustrates an example in which three light-emitting devices are arranged in one column, and the light-emitting device 211IR and the light-receiving device 212 are arranged next to each other below the three light-emitting devices. FIG. 9C illustrates an example in which four light-emitting devices including the light-emitting device 211IR are arranged in one column, and the light-receiving device 212 is provided below the four light-emitting devices.

FIG. 9D shows an example in which three light-emitting devices and the light-receiving device 212 arranged in all directions with the light-emitting device 211IR used as a center.

Note that in the pixels shown in FIG. 9B to FIG. 9D, the positions of the light-emitting devices can be interchangeable, or the positions of the light-emitting device and the light-receiving device can be interchangeable.

Structure Example 1-3

An example of a structure including a light-emitting device emitting visible light and a light-emitting/receiving device emitting and receiving visible light will be described below.

Figure 10A:
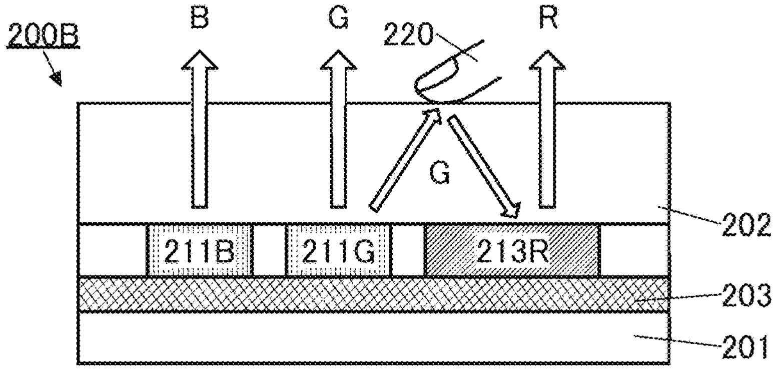
FIG. 10A is a cross-sectional view of a structure example of a display apparatus.

A display panel 200B illustrated in FIG. 10A includes the light-emitting device 211B, the light-emitting device 211G, and a light-emitting/receiving device 213R. The light-emitting/receiving device 213R has a function of a light-emitting device that emits red (R) light, and a function of a photoelectric conversion element that receives visible light. FIG. 10A illustrates an example in which the light-emitting/receiving device 213R receives green (G) light emitted from the light-emitting device 211G. Note that the light-emitting/receiving device 213R may receive blue (B) light emitted from the light-emitting device 211B. Alternatively, the light-emitting/receiving device 213R may receive both green light and blue light.

For example, the light-emitting/receiving device 213R preferably receives light having a shorter wavelength than light emitted from itself. Alternatively, the light-emitting/receiving device 213R may receive light (e.g., infrared light) having a longer wavelength than light emitted from itself. The light-emitting/receiving device 213R may receive light having approximately the same wavelength as light emitted from itself; however, in that case, the light-emitting/receiving device 213R also receives light emitted from itself, whereby its emission efficiency might be decreased. Therefore, the peak of the emission spectrum and the peak of the absorption spectrum of the light-emitting/receiving device 213R preferably overlap as little as possible.

Here, light emitted from the light-emitting/receiving device is not limited to red light. Light emitted from the light-emitting devices is not limited to a combination of green light and blue light. For example, the light-emitting/receiving device can be an element that emits green light or blue light and receives light having a different wavelength from light emitted from itself.

The light-emitting/receiving device 213R serves as both a light-emitting device and a light-receiving device as described above, whereby the number of elements provided in one pixel can be reduced. Thus, higher definition, a higher aperture ratio, higher resolution, and the like can be easily achieved.

FIG. 10B to FIG. 10I show examples of pixels that can be used for the display panel 200B.

Figure 10B:
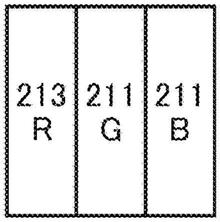
FIG. 10B to FIG. 10I are top views each illustrating an example of a pixel.
Figure 10C:
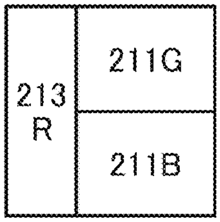

FIG. 10B illustrates an example in which the light-emitting/receiving device 213R, the light-emitting device 211G, and the light-emitting device 211B are arranged in one column. FIG. 10C illustrates an example in which the light-emitting device 211G and the light-emitting device 211B are arranged alternately in the vertical direction and the light-emitting/receiving device 213R is provided alongside the light-emitting devices.

Figure 10D:
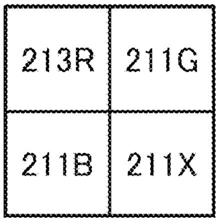

FIG. 10D shows an example in which three light-emitting devices (the light-emitting device 211G, the light-emitting device 211B, and a light-emitting device 211X) and one light-emitting/receiving device are arranged in a matrix of 2×2. The light-emitting device 211X emits light of a color other than R, G, and B. Examples of light of a color other than R, G, and B include white (W) light, yellow (Y) light, cyan (C) light, magenta (M) light, infrared light (IR), and ultraviolet light (UV). In the case where the light-emitting device 211X emits infrared light, the light-emitting/receiving device preferably has a function of sensing infrared light or a function of sensing both visible light and infrared light. The wavelength of light that the light-emitting/receiving device senses can be determined depending on the application of the sensor.

Figure 10E:
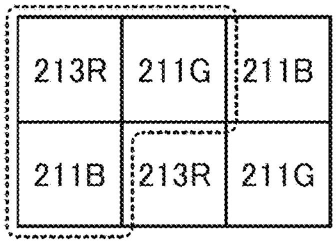

FIG. 10E illustrates two pixels. A region that includes three elements and is enclosed by a dotted line corresponds to one pixel. The pixels each include the light-emitting device 211G, the light-emitting device 211B, and the light-emitting/receiving device 213R. In the pixel on the left in FIG. 10E, the light-emitting/receiving device 213R is positioned in the same row as the light-emitting device 211G, and the light-emitting/receiving device 213R is positioned in the same column as the light-emitting device 211B. In the pixel on the right in FIG. 10E, the light-emitting/receiving device 213R is positioned in the same row as the light-emitting device 211G, and the light-emitting device 211G is positioned in the same column as the light-emitting device 211B. In the pixel layout in FIG. 10E, the light-emitting/receiving device 213R, the light-emitting device 211G, and the light-emitting device 211B are repeatedly arranged in both the odd-numbered row and the even-numbered row, and in each column, the light-emitting devices or the light-emitting device and the light-emitting/receiving device arranged in the odd-numbered row and the even-numbered row emit light of different colors.

Figure 10F:
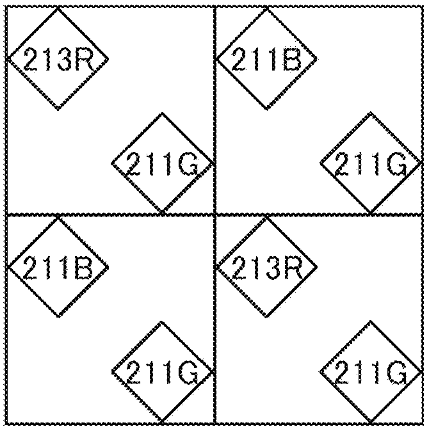

FIG. 10F illustrates four pixels which employ pentile arrangement; adjacent two pixels each have a different combination of two light-emitting devices or light-emitting/receiving devices that emit light of different colors. FIG. 10F illustrates the top-surface shape of the light-emitting devices or light-emitting/receiving devices.

In FIG. 10F, the upper-left pixel and the lower-right pixel each include the light-emitting/receiving device 213R and the light-emitting device 211G. The upper-right pixel and the lower-left pixel each include the light-emitting device 211G and the light-emitting device 211B. That is, in the example shown in FIG. 10F, each pixel is provided with the light-emitting device 211G The top surface shapes of the light-emitting devices and the light-emitting/receiving devices are not particularly limited and can be a circular shape, an elliptical shape, a polygonal shape, a polygonal shape with rounded corners, or the like. FIG. 10F and the like illustrate examples in which the top surface shapes of the light-emitting devices and the light-emitting/receiving devices are each a square tilted at approximately 45° (a diamond shape). Note that the top surface shapes of the light-emitting devices and the light-emitting/receiving devices of different colors may vary, or the elements of at least one color or all colors may have the same top surface shape.

The sizes of the light-emitting regions (or light-emitting/receiving regions) of the light-emitting devices and the light-emitting/receiving devices of different colors may vary, or the regions of at least one color or all colors may be the same in size. For example, in FIG. 10F, the light-emitting region of the light-emitting device 211G provided in each pixel may have a smaller area than the light-emitting region (or the light-emitting/receiving region) of the other elements.

Figure 10H:
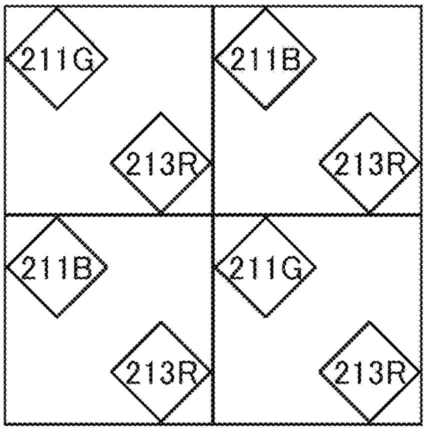
Figure 10G:
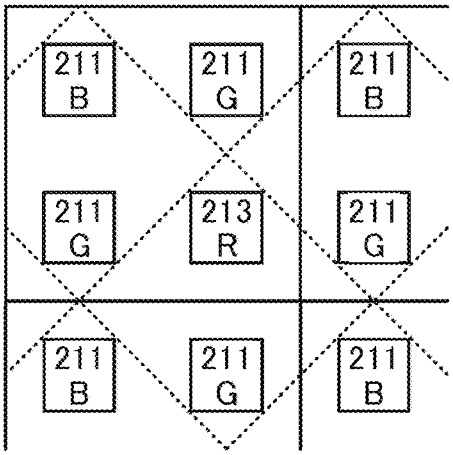

FIG. 10G is a variation of the pixel arrangement of FIG. 10F. Specifically, the structure of FIG. 10G is obtained by rotating the structure of FIG. 10F by 45°. Although one pixel is regarded as being formed of two elements in FIG. 10F, one pixel can be regarded as being formed of four elements as illustrated in FIG. 10G.

FIG. 10H is a variation of the pixel arrangement of FIG. 10F. In FIG. 10H, the upper-left pixel and the lower-right pixel each include the light-emitting/receiving device 213R and the light-emitting device 211G. The upper-right pixel and the lower-left pixel each include the light-emitting/receiving device 213R and the light-emitting device 211B. That is, in the example shown in FIG. 10H, each pixel is provided with the light-emitting/receiving device 213R. The structure illustrated in FIG. 10H achieves higher-resolution image capturing than the structure illustrated in FIG. 10F because of having the light-emitting/receiving device 213R in each pixel. Thus, the accuracy of biometric authentication can be increased, for example.

Figure 10I:
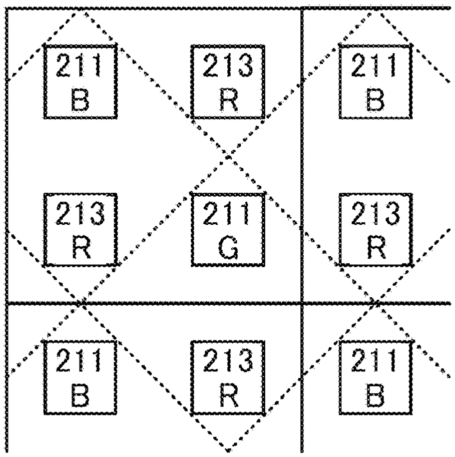

FIG. 10I shows a variation example of the pixel arrangement in FIG. 10H, obtained by rotating the pixel arrangement in FIG. 10H by 45°.

In FIG. 10I, one pixel is described as being composed of four elements (two light-emitting devices and two light-emitting/receiving devices). The pixel including a plurality of light-emitting/receiving devices having a light-receiving function allows high-resolution image capturing. Thus, the accuracy of biometric authentication can be increased. For example, the resolution of image capturing can be the square root of 2 times the resolution of display.

A display apparatus which employs the structure illustrated in FIG. 10H or FIG. 10I includes p (p is an integer greater than or equal to 2) first light-emitting devices, q (q is an integer greater than or equal to 2) second light-emitting devices, and r (r is an integer greater than p and q) light-emitting/receiving devices. As for p and r, r=2p is satisfied. As for p, q, and r, r=p+q is satisfied. Either the first light-emitting devices or the second light-emitting devices emit green light, and the other light-emitting devices emit blue light. The light-emitting/receiving devices emit red light and have a light-receiving function.

When a touch operation is detected using the light-emitting/receiving devices, for example, it is preferable that light emitted from a light source be less likely to be perceived by the user. Since blue light has lower visibility than green light, light-emitting devices that emit blue light are preferably used as a light source. Accordingly, the light-emitting/receiving devices preferably have a function of receiving blue light. Note that without limitation to the above, light-emitting devices used as a light source can be selected as appropriate depending on the sensitivity of the light-emitting/receiving devices.

As described above, the display apparatus of this embodiment can employ any of various types of pixel arrangements.

At least part of this embodiment can be implemented in combination with any of the other embodiments described in this specification, as appropriate.

Embodiment 3

In this embodiment, light-emitting devices (also referred to as light-emitting devices) that can be used in a display apparatus that is one embodiment of the present invention, and light-receiving devices (also referred to as light-receiving devices) will be described.

In this specification and the like, a device formed using a metal mask or an FMM (fine metal mask) may be referred to as a device having MM (metal mask) structure. In this specification and the like, a device formed without using a metal mask or an FMM may be referred to as a device having an MML (metal maskless) structure. A display apparatus having a device with an MML structure is formed without using a metal mask and thus has higher flexibility in designing the pixel arrangement, the pixel shape, and the like than a display apparatus having a device with an FMM structure or an MM structure.

Note that in the method for manufacturing a display apparatus having an MML structure, an island-shaped organic layer (hereinafter, an EL layer) that makes up an organic EL element is formed not by patterning with the use of a metal mask but by processing after formation of an EL layer over an entire surface. Accordingly, a high-resolution display apparatus or a display apparatus with a high aperture ratio, which has been difficult to be formed so far, can be obtained. Moreover, EL layers can be formed separately for the respective colors, enabling the display apparatus to perform extremely clear display with high contrast and high display quality. In addition, a sacrificial layer provided over an EL layer can reduce damage to the EL layer in the manufacturing process of the display apparatus, increasing the reliability of the light-emitting device.

The display apparatus of one embodiment of the present invention may employ a structure where an insulator for covering the end portion of the pixel electrode is not provided. In other words, a structure where an insulator is not provided between the pixel electrode and the EL layer may be employed. With such a structure, light can be efficiently extracted from the EL layer, leading to extremely low viewing angle dependence. For example, in the display apparatus of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction. The display apparatus of one embodiment of the present invention can have improved viewing angle dependence and high image visibility.

In the case where a display apparatus is a device with a fine metal mask (FMM) structure, the pixel arrangement structure or the like is limited in some cases. Here, the FMM structure will be described below.

To form the FMM structure, a metal mask provided with an opening portion (also referred to as an FMM) is set to be opposed to a substrate so that an EL material can be deposited to a desired region at the time of EL evaporation. Then, the EL material is deposited to the desired region by EL evaporation through the FMM. When the size of the substrate at the time of EL evaporation is larger, the size of the FMM is increased and accordingly the weight thereof is also increased. In addition, heat or the like is applied to the FMM at the time of EL evaporation and may change the shape of the FMM. Furthermore, there is a method in which EL evaporation is performed while a certain level of tension is applied to the FMM. Therefore, the weight and strength of the FMM are important parameters.

Thus, in the case where the pixel arrangement structure of a device with an FMM structure is designed, the above parameters and the like need to be taken into consideration, which imposes certain restrictions. In contrast, in the display apparatus of one embodiment of the present invention manufactured using an MML structure, an excellent effect such as higher flexibility in the pixel arrangement structure or the like than the FMM structure can be exhibited. This structure is highly compatible with a flexible device or the like, for example, and thus one or both of a pixel and a driver circuit can have a variety of circuit arrangements.

In this specification and the like, a structure in which light-emitting layers in light-emitting devices of different colors (here, blue (B), green (G), and red (R)) are separately formed or separately patterned is sometimes referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-Emitting Device

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission by using two light-emitting layers, two light-emitting layers are selected such that the light-emitting layers emit light of complementary colors. When an emission color of a first light-emitting layer and an emission color of a second light-emitting layer are complementary colors, for example, the light-emitting device can be configured to emit white light as a whole. To obtain white light emission by using three or more light-emitting layers, the light-emitting device is configured to emit white light as a whole by combining emission colors of the three or more light-emitting layers.

A light-emitting device having a tandem structure includes two or more light-emitting units between a pair of electrode, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission with a tandem structure, the light-emitting device is configured to obtain white light emission by combining light from light-emitting layers of a plurality of light-emitting units. Note that a combination of emission colors for obtaining white light emission is similar to that for a single structure. In a light-emitting device having a tandem structure, an intermediate layer such as a charge-generation layer is preferably provided between a plurality of light-emitting units.

When the white light-emitting device (having a single structure or a tandem structure) and a light-emitting device having an SBS structure are compared to each other, the light-emitting device having an SBS structure can have lower power consumption than the white light-emitting device. To reduce power consumption, a light-emitting device having an SBS structure is preferably used. Meanwhile, the white light-emitting device is preferable in terms of lower manufacturing cost or higher manufacturing yield because the manufacturing process of the white light-emitting device is simpler than that of a light-emitting device having an SBS structure.

Structure Example of Light-Emitting Device

Figure 11A:
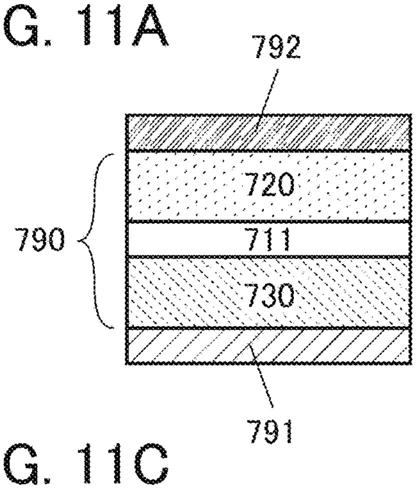
FIG. 11A to FIG. 11F are diagrams each illustrating a structure example of a light-emitting device.

As illustrated in FIG. 11A, the light-emitting device includes an EL layer 790 between a pair of electrodes (a lower electrode 791 and an upper electrode 792). The EL layer 790 can be formed of a plurality of layers such as a layer 720, a light-emitting layer 711, and a layer 730. The layer 720 can include, for example, a layer containing a substance with a high electron-injection property (an electron-injection layer) and a layer containing a substance with a high electron-transport property (an electron-transport layer). The light-emitting layer 711 contains a light-emitting compound, for example. The layer 730 can include, for example, a layer containing a substance with a high hole-injection property (a hole-injection layer) and a layer containing a substance with a high hole-transport property (a hole-transport layer).

The structure including the layer 720, the light-emitting layer 711, and the layer 730, which is provided between a pair of electrodes, can function as a single light-emitting unit, and the structure in FIG. 11A is referred to as a single structure in this specification.

Figure 11B:
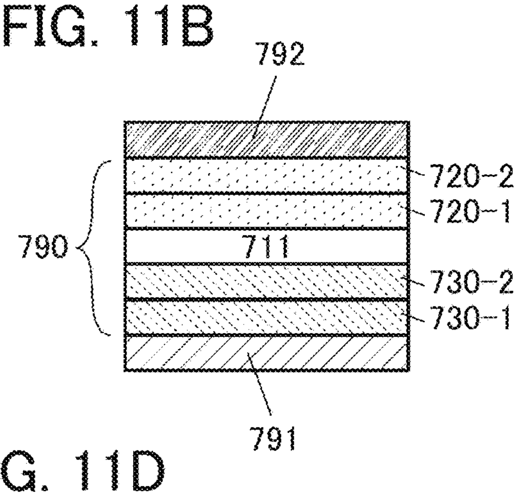

FIG. 11B is a modification example of the EL layer 790 included in the light-emitting device illustrated in FIG. 11A. Specifically, the light-emitting device illustrated in FIG. 11B includes a layer 730-1 over the lower electrode 791, a layer 730-2 over the layer 730-1, the light-emitting layer 711 over the layer 730-2, a layer 720-1 over the light-emitting layer 711, a layer 720-2 over the layer 720-1, and the upper electrode 792 over the layer 720-2. For example, when the lower electrode 791 functions as an anode and the upper electrode 792 functions as a cathode, the layer 730-1 functions as a hole-injection layer, the layer 730-2 functions as a hole-transport layer, the layer 720-1 functions as an electron-transport layer, and the layer 720-2 functions as an electron-injection layer. Alternatively, when the lower electrode 791 functions as a cathode and the upper electrode 792 functions as an anode, the layer 730-1 functions as an electron-injection layer, the layer 730-2 functions as an electron-transport layer, the layer 720-1 functions as a hole-transport layer, and the layer 720-2 functions as the hole-injection layer. With such a layered structure, carriers can be efficiently injected to the light-emitting layer 711, and the efficiency of the recombination of carriers in the light-emitting layer 711 can be enhanced.

Figure 11C:
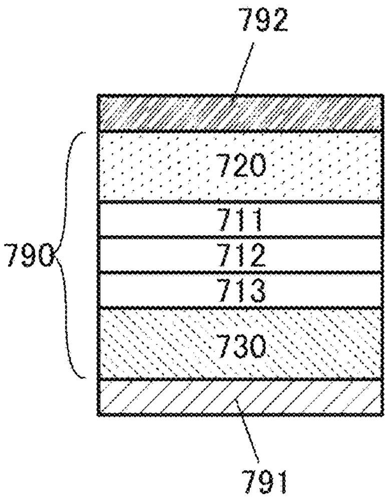
Figure 11D:
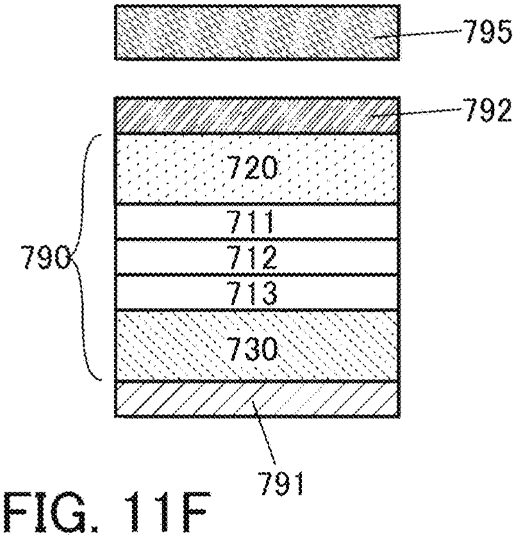

Note that structures in which a plurality of light-emitting layers (light-emitting layers 711, 712, and 713) are provided between the layer 720 and the layer 730 as illustrated in FIG. 11C and FIG. 11D are other variations of the single structure.

Figure 11E:
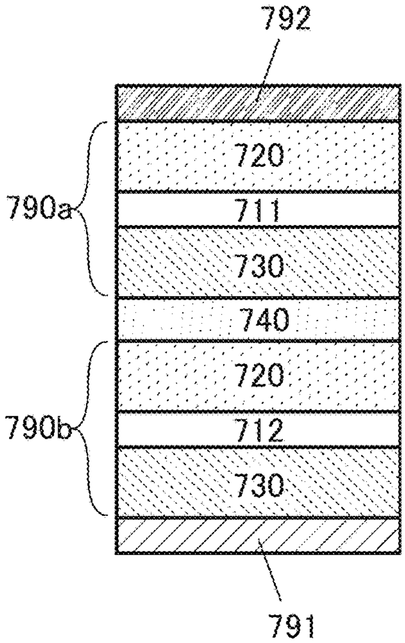
Figure 11F:
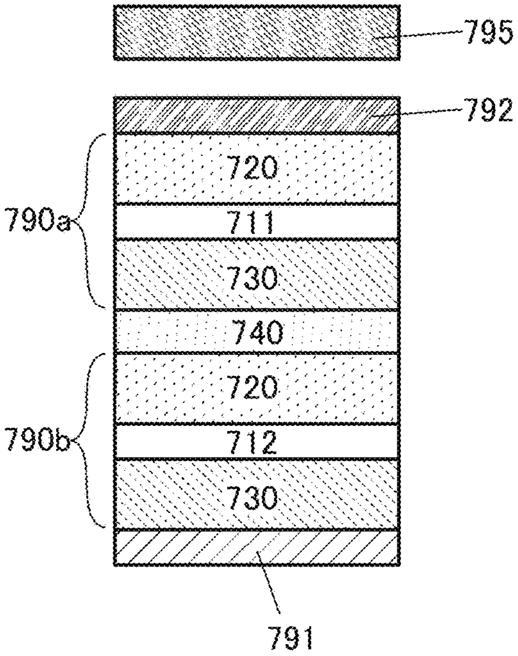

Structures in which a plurality of light-emitting units (an EL layer **790*a* and an EL layer 790*b*) are connected in series with an intermediate layer (charge-generation layer) 740 therebetween as illustrated in FIG. 11E and FIG. 11F are referred to as a tandem structure in this specification. The structures illustrated in FIG. 11E and FIG. 11**F are each referred to as a tandem structure in this specification and the like; however, the name of the structure is not limited thereto. A tandem structure may be referred to as a stack structure, for example. The tandem structure enables a light-emitting device capable of high luminance light emission.

In FIG. 11C, light-emitting materials emitting light of the same color may be used for the light-emitting layer 711, the light-emitting layer 712, and the light-emitting layer 713.

Alternatively, different light-emitting materials may be used for the light-emitting layer 711, the light-emitting layer 712, and the light-emitting layer 713. White light can be obtained when the light-emitting layer 711, the light-emitting layer 712, and the light-emitting layer 713 emit light of complementary colors. FIG. 11D shows an example in which a coloring layer 795 functioning as a color filter is provided. When white light passes through a color filter, light of a desired color can be obtained.

In FIG. 11E, the same light-emitting material may be used for the light-emitting layer 711 and the light-emitting layer 712. Alternatively, light-emitting materials that emit light of different colors may be used for the light-emitting layer 711 and the light-emitting layer 712. White light can be obtained when the light-emitting layer 711 and the light-emitting layer 712 emit light of complementary colors. FIG. 11F shows an example in which the coloring layer 795 is further provided.

In FIG. 11C, FIG. 11D, FIG. 11E, and FIG. 11F, the layer 720 and the layer 730 may each have a layered structure of two or more layers as in FIG. 11B.

In FIG. 11D, the same light-emitting material may be used for the light-emitting layer 711, the light-emitting layer 712, and the light-emitting layer 713. Similarly, in FIG. 11F, the same light-emitting material may be used for the light-emitting layer 711 and the light-emitting layer 712. Here, when a color conversion layer is used instead of the coloring layer 795, light of a desired color different from the light-emitting material can be obtained. For example, a blue light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

A structure in which light-emitting layers (here, blue (B), green (G), and red (R)) are separately formed for light-emitting devices is referred to as an SBS (Side By Side) structure in some cases.

The emission color of the light-emitting device can be changed to red, green, blue, cyan, magenta, yellow, white, or the like depending on the material of the EL layer 790. When the light-emitting device has a microcavity structure, the color purity can be further increased.

In the light-emitting device that emits white light, the light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that the light-emitting device can emit white light as a whole. This can be applied to a light-emitting device including three or more light-emitting layers.

The light-emitting layer preferably contains two or more selected from light-emitting substances that emit light of red (R), green (G), blue (B), yellow (Y), orange (O), and the like. Alternatively, a light-emitting layer preferably contains two or more light-emitting substances each of which emits light containing two or more of spectral components of R, G, and B.

Light-Receiving Device

Figure 12A:
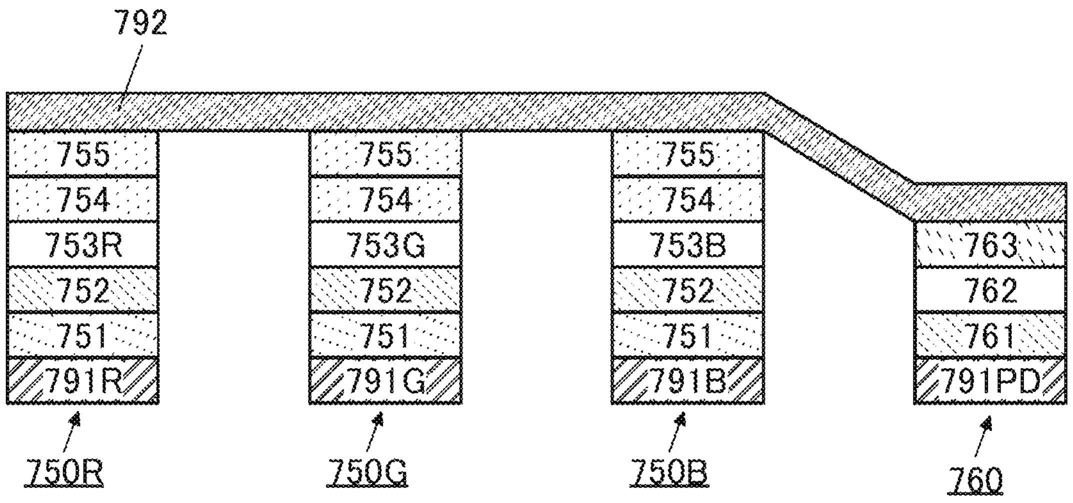
FIG. 12A and FIG. 12B are diagrams each showing a structure example of light-emitting devices and a light-receiving device.

FIG. 12A is a schematic cross-sectional view of a light-emitting device 750R, a light-emitting device 750G, a light-emitting device 750B, and a light-receiving device 760. The light-emitting device 750R, the light-emitting device 750G, the light-emitting device 750B, and the light-receiving device 760 share an upper electrode 792.

The light-emitting device 750R includes a pixel electrode 791R, a layer 751, a layer 752, a light-emitting layer 753R, a layer 754, a layer 755, and the upper electrode 792. The light-emitting device 750G includes the pixel electrode 791G and a light-emitting layer 753G. The light-emitting device 750B includes the pixel electrode 791B and a light-emitting layer 753B.

The layer 751 includes, for example, a layer containing a substance with a high hole-injection property (a hole-injection layer). The layer 752 includes, for example, a layer containing a substance with a high hole-transport property (a hole-transport layer). The layer 754 includes, for example, a layer containing a substance with a high electron-transport property (an electron-transport layer). The layer 755 includes, for example, a layer containing a substance with a high electron-injection property (an electron-injection layer).

Alternatively, the layer 751 may include an electron-injection layer, the layer 752 may include an electron-transport layer, the layer 754 may include a hole-transport layer, and the layer 755 may include a hole-injection layer.

FIG. 12A illustrates the layer 751 and the layer 752 separately; however, one embodiment of the present invention is not limited thereto. For example, the layer 752 may be omitted when the layer 751 has functions of both a hole-injection layer and a hole-transport layer or the layer 751 has functions of both an electron-injection layer and an electron-transport layer.

Note that the light-emitting layer 753R included in the light-emitting device 750R includes a light-emitting substance which emits red light, the light-emitting layer 753G included in the light-emitting device 750G includes a light-emitting substance which emits green light, and the light-emitting layer 753B included in the light-emitting device 750B includes a light-emitting substance which emits blue light. Note that the light-emitting device 750G and the light-emitting device 750B have a structure in which the light-emitting layer 753R included in the light-emitting device 750R is replaced with the light-emitting layer 753G and the light-emitting layer 753B, respectively, and the other components are similar to those of the light-emitting device 750R.

The structure (material, thickness, or the like) of the layer 751, the layer 752, the layer 754, and the layer 755 may be the same or different from each other among the light-emitting devices of different colors.

The light-receiving device 760 includes the pixel electrode 791PD, a layer 761, a layer 762, a layer 763, and the upper electrode 792. The light-receiving device 760 can be configured not to include a hole-injection layer and an electron-injection layer.

The layer 762 includes an active layer (also referred to as a photoelectric conversion layer). The layer 762 has a function of absorbing light in a specific wavelength range and generating carriers (electrons and holes).

The layer 761 and the layer 763 each include, for example, one of a hole-transport layer or an electron-transport layer. In the case where the layer 761 includes a hole-transport layer, the layer 763 includes an electron-transport layer. In the case where the layer 761 includes an electron-transport layer, the layer 763 includes a hole-transport layer.

In the light-receiving device 760, the pixel electrode 791PD may be an anode and the upper electrode 792 may be a cathode, or the pixel electrode 791PD may be a cathode and the upper electrode 792 may be an anode.

Figure 12B:
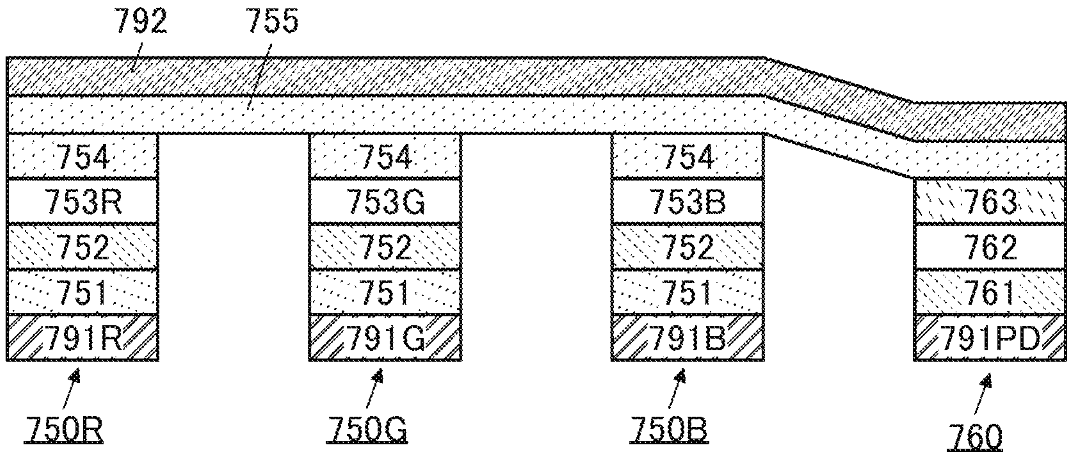

FIG. 12B is a variation of FIG. 12A. FIG. 12B shows an example in which the light-emitting devices and the light-receiving devices share not only the upper electrode 792 but also the layer 755. In this case, the layer 755 can be referred to as a common layer. By providing one or more common layers for the light-emitting devices and the light-receiving devices in this manner, the manufacturing process can be simplified, resulting in a reduction in manufacturing cost.

Here, the layer 755 functions as an electron-injection layer or a hole-injection layer of the light-emitting device 750R and the like. At this time, the layer 755 functions as an electron-transport layer or a hole-transport layer of the light-receiving device 760. Thus, the light-receiving device 760 illustrated in FIG. 12B is not necessarily provided with the layer 763 functioning as an electron-transport layer or a hole-transport layer.

Light-Emitting Device

Here, a specific structure example of a light-emitting device will be described.

The light-emitting device includes at least a light-emitting layer. In addition to the light-emitting layer, the light-emitting device may further include a layer containing any of a substance with a high hole-injection property, a substance with a high hole-transport property, a hole-blocking material, a substance with a high electron-transport property, an electron-blocking material, a substance with a high electron-injection property, an electron-blocking material, a substance with a bipolar property (a substance with a high electron- and hole-transport property), and the like.

Any of a low molecular compound and a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the light-emitting device can include one or more of the hole-injection layer, the hole-transport layer, the hole-blocking layer, an electron-blocking layer, an electron-transport layer, and an electron-injection layer.

The hole-injection layer injects holes from the anode to the hole-transport layer and contains a material with a high hole-injection property. Examples of a material with a high hole-injection property include an aromatic amine compound and a composite material containing a hole-transport material and an acceptor material (electron-accepting material).

The hole-transport layer transports holes injected from the anode by the hole-injection layer, to the light-emitting layer. The hole-transport layer contains a hole-transport material. The hole-transport material preferably has a hole mobility higher than or equal to $1\ 10^{-6}\ cm^2/Vs$. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, to the light-emitting layer. The electron-transport layer contains an electron-transport material. The electron-transport material preferably has an electron mobility higher than or equal to $1\times10^{-6}\ cm^2/Vs$. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_2$), 8-(quinolinolato) lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of the organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino [2,3-a:2',3'-c]phenazine (abbreviation: HATNA), 2,4,6-tris [3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (exciplex-triplet energy transfer), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

Light-Receiving Device

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electron conjugation widely spread in fullerene having a spherical shape, its electron-accepting property is high. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-Phenyl-C71-butyric acid methyl ester (abbreviation: PC70BM), [6,6]-Phenyl-C61-butyric acid methyl ester (abbreviation: PC60BM), and 1',1",4',4"-Tetrahydro-di[1,4]methanonaphthaleno[1,2:2',3',56,60:2",3"][5,6]fullerene-C60 (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron- and hole-transport property), and the like. Without limitation to the above, the light-receiving device may further include a substance with a high hole-injection property, a hole-blocking material, a material with a high electron-injection property, a layer containing an electron-blocking material, and the like.

Either a low molecular compound or a high molecular compound can be used for the light-receiving device, and an inorganic compound may also be included. The layer included in the light-receiving device can be formed by any of the following methods: an evaporation method (including a vacuum evaporation method), a transfer method, a printing method, an inkjet method, a coating method, and the like.

As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. The third material may be a low molecular compound or a high molecular compound.

The above is the description of the light-receiving device.

At least part of this embodiment can be implemented in combination with any of the other embodiments described in this specification, as appropriate.

Embodiment 4

In this embodiment, a structure example of a light-emitting apparatus or a display apparatus that can be used for the display apparatus of one embodiment of the present invention will be described.

One embodiment of the present invention is a display apparatus including a light-emitting device and a light-receiving device. For example, three kinds of light-emitting devices emitting red (R), green (G), and blue (B) light are included, whereby a full-color display apparatus can be achieved.

In one embodiment of the present invention, patterning of EL layers and an EL layer and an active layer is performed by a photolithography method without a shadow mask such as a metal mask. With the patterning, a high-resolution display apparatus with a high aperture ratio, which had been difficult to achieve, can be fabricated. Moreover, EL layers can be formed separately, which enables extremely clear images; thus, a display apparatus with a high contrast and high display quality can be fabricated.

It is difficult to set the distance between EL layers for different colors or between an EL layer and an active layer to be less than 10 μm with a formation method using a metal mask, for example. In contrast, with use of the above method, the distance can be decreased to be less than or equal to 3 μm, less than or equal to 2 μm, or less than or equal to 1 μm. For example, with use of an exposure tool for LSI, the distance can be decreased to be less than or equal to 500 nm, less than or equal to 200 nm, less than or equal to 100 nm, or less than or equal to 50 nm. Accordingly, the area of a non-light-emitting region exiting between two light-emitting devices or between a light-emitting device and a light-receiving device can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90%; that is, an aperture ratio lower than 100% can be achieved.

Furthermore, patterns of the EL layer and the active layer themselves can be made much smaller than those in the case of using a metal mask. For example, in the case of using a metal mask for forming EL layers separately, a variation in the thickness occurs between the center and the edge of the pattern. This causes a reduction in an effective area that can be used as a light-emitting region with respect to the area of the entire pattern. In contrast, in the above manufacturing method, the pattern is formed by processing a film deposited to have a uniform thickness, which enables a uniform thickness in the pattern. Thus, even in a fine pattern, almost the whole area can be used as a light-emitting region. Therefore, the above method makes it possible to obtain a high resolution display apparatus with a high aperture ratio.

In many cases, an organic film formed using a fine metal mask (FMM) has an extremely small taper angle (e.g., a taper angle of greater than 0° and less than 30°) so that the thickness of the film becomes smaller in a portion closer to an end portion. Therefore, it is difficult to clearly observe a side surface of an organic film formed using an FMM because the side surface and a top surface are continuously connected. In contrast, an EL layer included in one embodiment of the present invention is processed without using an FMM, and has a clear side surface. In particular, part of the taper angle of the EL layer included in one embodiment of the present invention is preferably greater than or equal to 30° and less than or equal to 120°, further preferably greater than or equal to 60° and less than or equal to 120°.

Note that in this specification and the like, an end portion of an object having a tapered shape indicates that the end portion of the object has a cross-sectional shape in which the angle between a side surface (surface) of the object and a bottom surface (a surface on which the object is formed) is greater than 0° and less than 90° in a region of the end portion, and the thickness continuously increases from the end portion. A taper angle refers to an angle between a bottom surface (a surface on which an object is formed) and a side surface (surface) at an end portion of the object.

Hereinafter, a more specific example will be described.

Figure 13A:
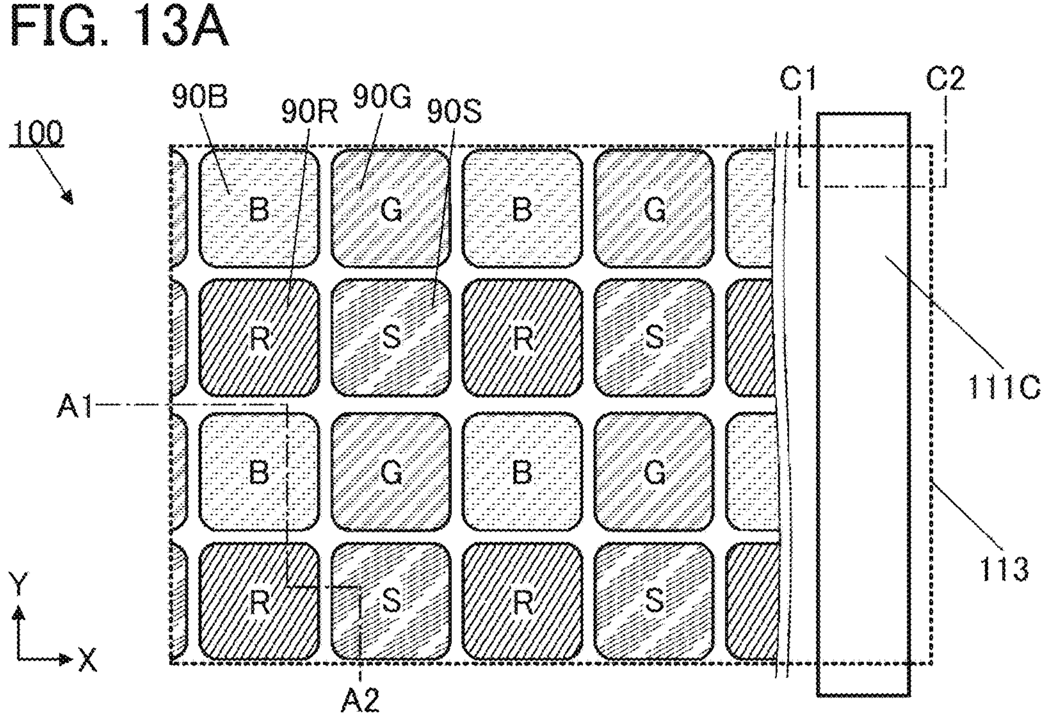
FIG. 13A and FIG. 13B are diagrams showing a structure example of a display apparatus.

FIG. 13A is a schematic top view of the display apparatus 100. The display apparatus 100 includes a plurality of light-emitting devices 90R emitting red light, a plurality of light-emitting devices 90G emitting green light, a plurality of light-emitting devices 90B emitting blue light, and a plurality of light-receiving devices 90S. In FIG. 13A, light-emitting regions of the light-emitting devices or the light-receiving devices are denoted by R, G, B, and S to easily differentiate the light-emitting devices.

The light-emitting devices 90R, the light-emitting devices 90G, the light-emitting devices 90B, and the light-receiving devices 90S are arranged in a matrix. In FIG. 13A, two elements are alternately arranged in one direction. Note that the arrangement method of the light-emitting devices is not limited thereto; another method such as a stripe, S stripe, delta, Bayer, zigzag, PenTile, or diamond arrangement may also be used.

FIG. 13A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting devices 90R and the like are arranged. In FIG. 13A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, the top surface of the connection electrode 111C can have a band shape, an L shape, a square bracket shape, a quadrangular shape, or the like.

Figure 13B:
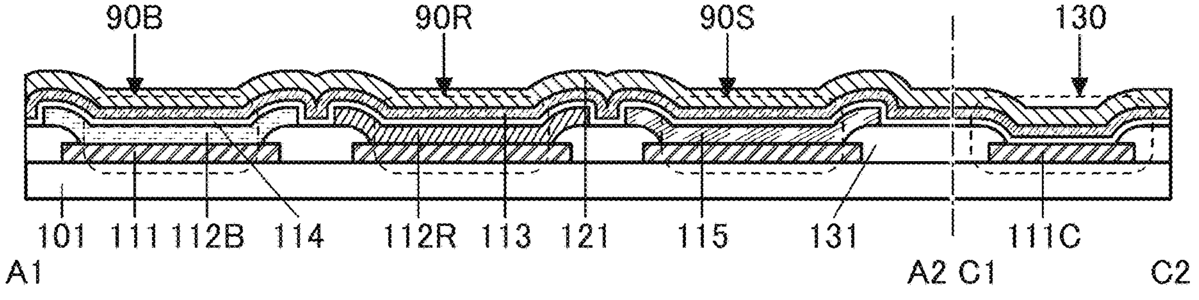

FIG. 13B is a schematic cross-sectional view taken along dashed-dotted lines A1-A2 and C1-C2 in FIG. 13A. FIG. 13B is a schematic cross-sectional view of the light-emitting device 90B, the light-emitting device 90R, the light-receiving device 90S, and the connection electrode 111C.

Note that the light-emitting device 90G that is not illustrated in the schematic cross-sectional view can have a structure similar to that of the light-emitting device 90B or the light-emitting device 90R, of which description can be referred to hereinafter.

The light-emitting device 90B includes a pixel electrode 111, an organic layer 112B, an organic layer 114, and the common electrode 113. The light-emitting device 90R includes the pixel electrode 111, an organic layer 112R, the organic layer 114, and the common electrode 113. The light-receiving device 90S includes the pixel electrode 111, an organic layer 115, the organic layer 114, and the common electrode 113. The organic layer 114 and the common electrode 113 are shared by the light-emitting device 90B, the light-emitting device 90R, and the light-receiving device 90S. The organic layer 114 can also be referred to as a common layer. The pixel electrodes 111 are provided so as to be separated between the light-emitting devices and between the light-emitting device and the light-receiving device.

The organic layer 112R contains at least a light-emitting organic compound that emits light with a peak in a red wavelength range. The organic layer 112B contains at least a light-emitting organic compound that emits light with a peak in a blue wavelength range. The organic layer 115 contains a photoelectric conversion material that has sensitivity in the visible light or infrared light wavelength range. The organic layer 112R and the organic layer 112B can each be called an EL layer.

The organic layer 112R, the organic layer 112B, and the organic layer 115 may each include one or more of an electron-injection layer, an electron-transport layer, a hole-injection layer, and a hole-transport layer. The organic layer 114 does not necessarily include the light-emitting layer. For example, the organic layer 114 includes one or more of an electron-injection layer, an electron-transport layer, a hole-injection layer, and a hole-transport layer.

Here, the uppermost layer in the stacked-layer structure of the organic layer 112R, the organic layer 112B, and the organic layer 115, i.e., the layer in contact with the organic layer 114 is preferably a layer other than the light-emitting layer. For example, a structure is preferable in which an electron-injection layer, an electron-transport layer, a hole-injection layer, a hole-transport layer, or a layer other than those covers the light-emitting layer so as to be in contact with the organic layer 114. When a top surface of the light-emitting layer is protected by another layer in manufacturing each light-emitting device, the reliability of the light-emitting device can be improved.

The pixel electrode 111 is provided for each element. The common electrode 113 and the organic layer 114 are provided as layers common to the light-emitting devices. A conductive film that transmits visible light is used for either the respective pixel electrodes or the common electrode 113, and a reflective conductive film is used for the other. When the respective pixel electrodes are light-transmitting electrodes and the common electrode 113 is a reflective electrode, a bottom-emission display apparatus is obtained. When the respective pixel electrodes are reflective electrodes and the common electrode 113 is a light-transmitting electrode, a top-emission display apparatus is obtained. Note that when both the respective pixel electrodes and the common electrode 113 transmit light, a dual-emission display apparatus can be obtained.

The insulating layer 131 is provided to cover end portions of the pixel electrode 111. The end portions of the insulating layer 131 are preferably tapered. Note that in this specification and the like, an end portion of an object having a tapered shape indicates that the end portion of the object has a cross-sectional shape in which the angle between a surface of the object and a surface on which the object is formed is greater than 0° and less than 90° in a region of the end portion, and the thickness continuously increases from the end portion.

When an organic resin is used for the insulating layer 131, a surface of the insulating layer 131 can be moderately curved. Thus, coverage with a film formed over the insulating layer 131 can be improved.

Examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors of these resins.

Alternatively, the insulating layer 131 may be formed using an inorganic insulating material. Examples of inorganic insulating materials that can be used for the insulating layer 131 include oxides and nitride films such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

As illustrated in FIG. 13B, there are gaps between two organic layers of light-emitting devices that emit light of different colors and between two organic layers of the light-emitting device and the light-receiving device. The organic layer 112R, the organic layer 112B, and the organic layer 115 are thus preferably provided so as not to be in contact with each other. This suitably prevents unintentional light emission from being caused by current flowing through adjacent two organic layers. As a result, the contrast can be increased to achieve a display apparatus with high display quality.

The organic layer 112R, the organic layer 112B, and the organic layer 115 each preferably have a taper angle of greater than or equal to 30°. In an end portion of each of the organic layer 112R, an organic layer 112G, and the organic layer 112B, the angle between a side surface (surface) of the layer and a bottom surface of the layer (a surface on which the layer is formed) is preferably greater than or equal to 30° and less than or equal to 120°, further preferably greater than or equal to 45° and less than or equal to 120°, still further preferably greater than or equal to 60° and less than or equal to 120°. Alternatively, the organic layer 112R, the organic layer 112G, and the organic layer 112B each preferably have a taper angle of 90° or a neighborhood thereof (greater than or equal to 80° and less than or equal to 100°, for example).

A protective layer 121 is provided over the common electrode 113. The protective layer 121 has a function of preventing diffusion of impurities such as water into each light-emitting device from the above.

The protective layer 121 can have, for example, a single-layer structure or a stacked-layer structure including at least an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, the top surface of the organic insulating film can be flat, and accordingly, coverage with the inorganic insulating film over the organic insulating film is improved, leading to an improvement in barrier properties. Moreover, since the top surface of the protective layer 121 is flat, a preferable effect can be obtained; when a component (e.g., a color filter, an electrode of a touch sensor, or a lens array) is provided above the protective layer 121, the component is less affected by an uneven shape caused by the lower structure.

In the connection portion 130, the common electrode 113 is provided on and in contact with the connection electrode 111C and the protective layer 121 is provided to cover the common electrode 113. In addition, the insulating layer 131 is provided to cover end portions of the connection electrode 111C.

A structure example of a display apparatus that is partly different from that in FIG. 13B will be described below. Specifically, an example in which the insulating layer 131 is not provided is described.

Figure 14A:
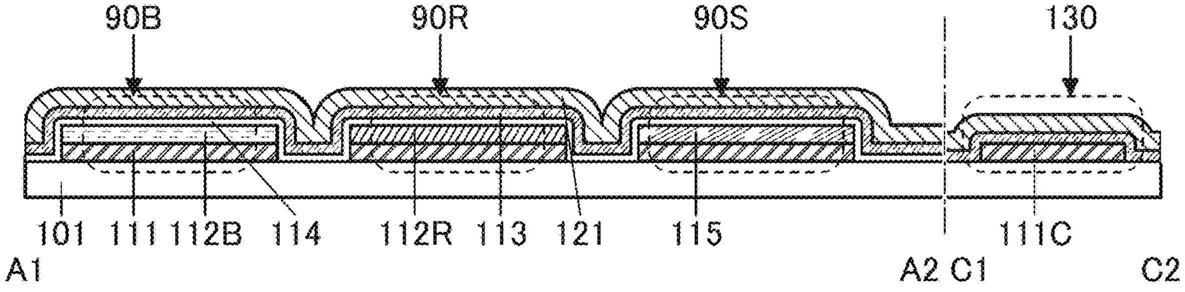
FIG. 14A to FIG. 14D are diagrams each showing a structure example of a display apparatus.
Figure 14B:
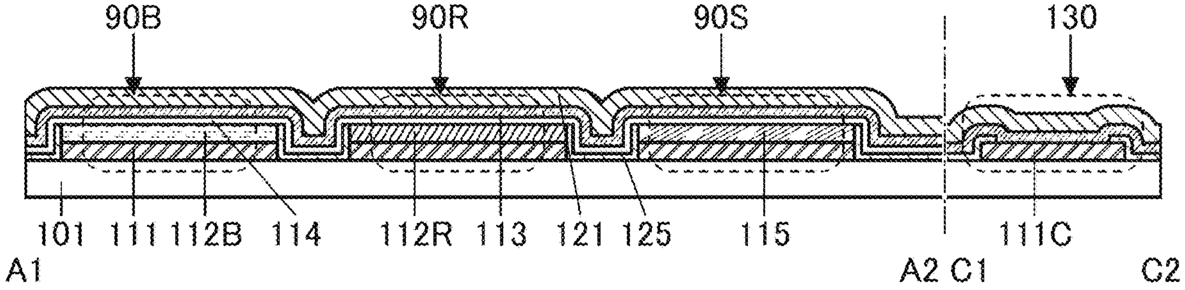
Figure 14C:
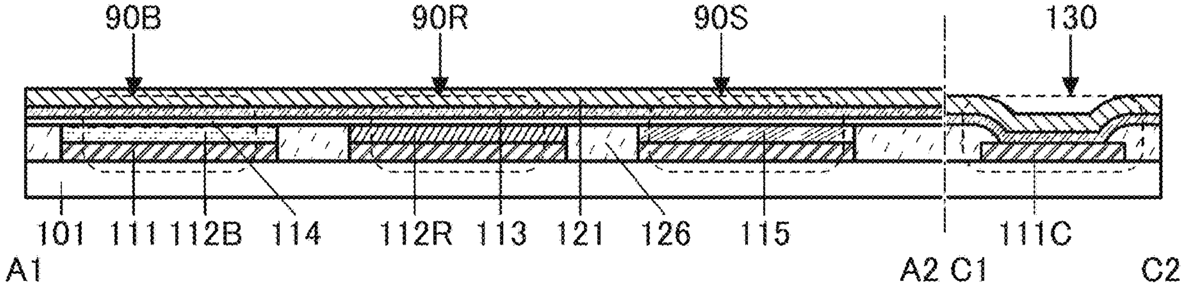

FIG. 14A to FIG. 14C show examples in which the side surface of the pixel electrode 111 is substantially aligned with the side surface of the organic layer 112R, the organic layer 112B, or the organic layer 115.

In FIG. 14A, the organic layer 114 is provided to cover top surfaces and side surfaces of the organic layer 112R, the organic layer 112B, and the organic layer 115. The organic layer 114 can prevent the pixel electrode 111 and the common electrode 113 from being in contact with each other and being electrically short-circuited.

FIG. 14B shows an example in which an insulating layer 125 is provided to be in contact with the side surfaces of the organic layer 112R, the organic layer 112G, and the organic layer 112B and side surfaces of the pixel electrode 111. The insulating layer 125 can prevent the pixel electrode 111 and the common electrode 113 from being electrically short-circuited and effectively inhibit leakage current therebetween.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when an inorganic insulating film such as an aluminum oxide film, a hafnium oxide film, or a silicon oxide film formed by an ALD method is used as the insulating layer 125, the insulating layer 125 has a small number of pin holes and excels in a function of protecting the organic layer.

Note that in this specification and the like, oxynitride refers to a material that contains more oxygen than nitrogen, and nitride oxide refers to a material that contains more nitrogen than oxygen. For example, a silicon oxynitride refers to a material that contains oxygen at a higher proportion than nitrogen, and a silicon nitride oxide refers to a material that contains nitrogen at a higher proportion than oxygen.

The insulating layer 125 can be formed by a sputtering method, a CVD method, a PLD method, an ALD method, or the like. The insulating layer 125 is preferably formed by an ALD method achieving good coverage.

In FIG. 14C, resin layers 126 are provided between two adjacent light-emitting devices and between the light-emitting device and the light-receiving device so as to fill the space between two facing pixel electrodes and two facing organic layers. The resin layer 126 can planarize the surface on which the organic layer 114, the common electrode 113, and the like are formed, which prevents disconnection of the common electrode 113 due to poor coverage in a step between adjacent light-emitting devices.

As the resin layer 126, an insulating layer containing an organic material can be favorably used. For example, the resin layer 126 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The resin layer 126 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the resin layer 126 can be formed using a photosensitive resin. A photoresist may be used as the photosensitive resin. The photosensitive resin can be of positive or negative type.

A material that absorbs visible light is suitably used as the resin layer 126. When a material that absorbs visible light is used as the resin layer 126, light emitted by the EL layer can be absorbed by the resin layer 126, whereby stray light from an adjacent pixel can be blocked and color mixture can be suppressed. Accordingly, a display apparatus that has high display quality can be provided.

Figure 14D:
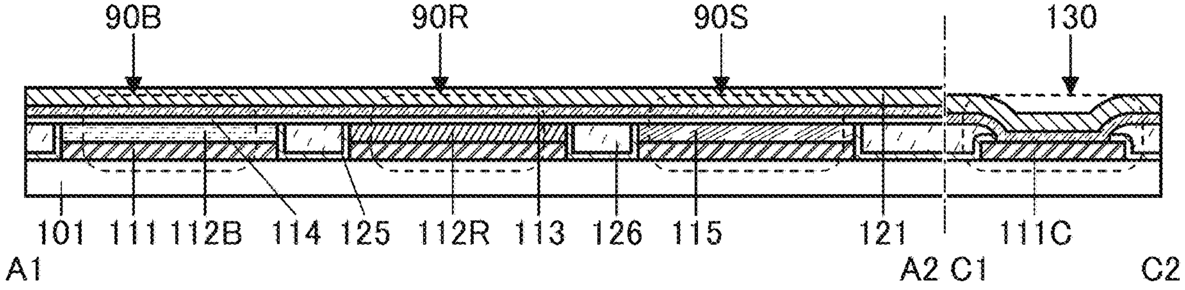

In FIG. 14D, the insulating layer 125 and the resin layer 126 over the insulating layer 125 are provided. Since the insulating layer 125 prevents the organic layer 112R or the like from being in contact with the resin layer 126, impurities such as moisture included in the resin layer 126 can be prevented from being diffused into the organic layer 112R or the like, whereby a highly reliable display apparatus can be provided.

A reflective film (e.g., a metal film containing one or more of silver, palladium, copper, titanium, aluminum, and the like) may be provided between the insulating layer 125 and the resin layer 126 so that light emitted from the light-emitting layer is reflected by the reflective film; hence, the display apparatus may be provided with a function of increasing the light extraction efficiency.

Figure 15A:
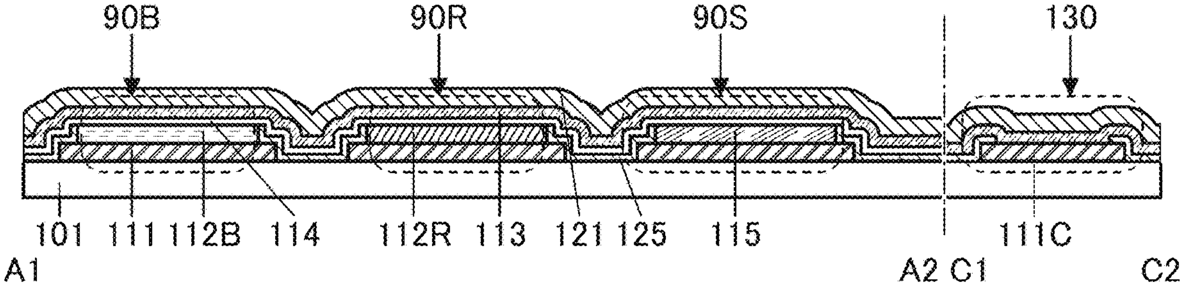
FIG. 15A to FIG. 15C are diagrams each showing a structure example of a display apparatus.
Figure 15B:
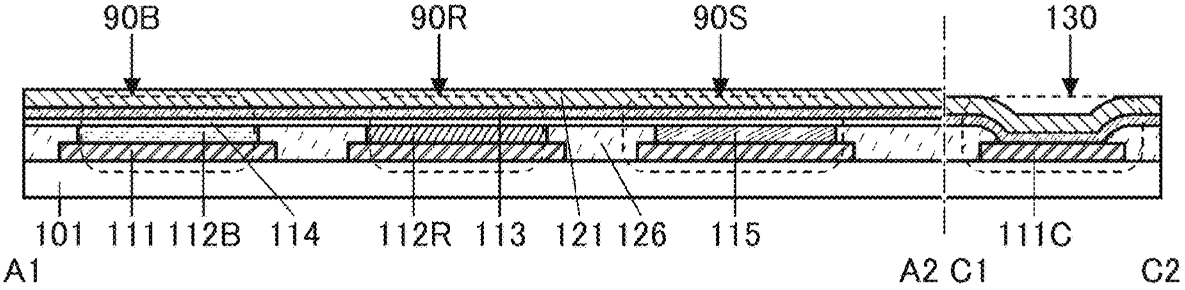
Figure 15C:
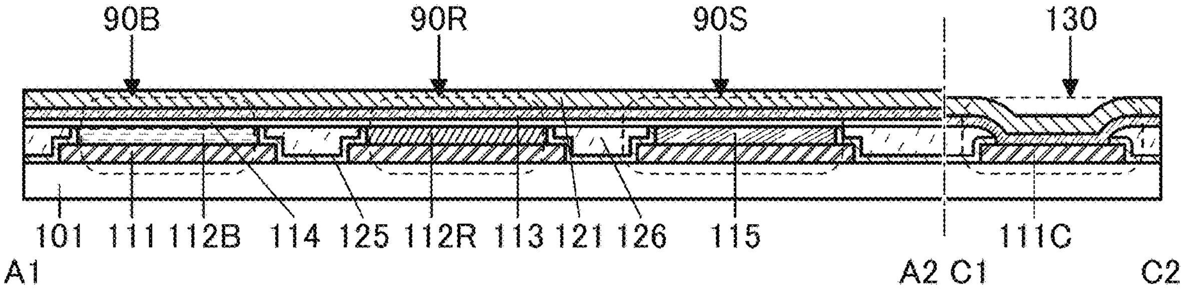

FIG. 15A to FIG. 15C show examples in which the width of the pixel electrode 111 is larger than the width of the organic layer 112R, the organic layer 112B, or the organic layer 115. The organic layer 112R or the like is provided on the inner side than end portions of the pixel electrode 111.

FIG. 15A shows an example in which the insulating layer 125 is provided. The insulating layer 125 is provided to cover the side surfaces of the organic layers included in the light-emitting device or the light-receiving device and part of a top surface and the side surfaces of the pixel electrode 111.

FIG. 15B shows an example in which the resin layer 126 is provided. The resin layer 126 is positioned between two adjacent light-emitting devices or between the light-emitting device and the light-receiving device, and covers the side surfaces of the organic layers and the top and side surfaces of the pixel electrode 111.

FIG. 15C shows an example in which both the insulating layer 125 and the resin layer 126 are provided. The insulating layer 125 is provided between the organic layer 112R or the like and the resin layer 126.

FIG. 16A to FIG. 16D show examples in which the width of the pixel electrode 111 is smaller than the width of the organic layer 112R, the organic layer 112B, or the organic layer 115. The organic layer 112R or the like extends to an outer side beyond the end portions of the pixel electrode 111.

Figure 16A:
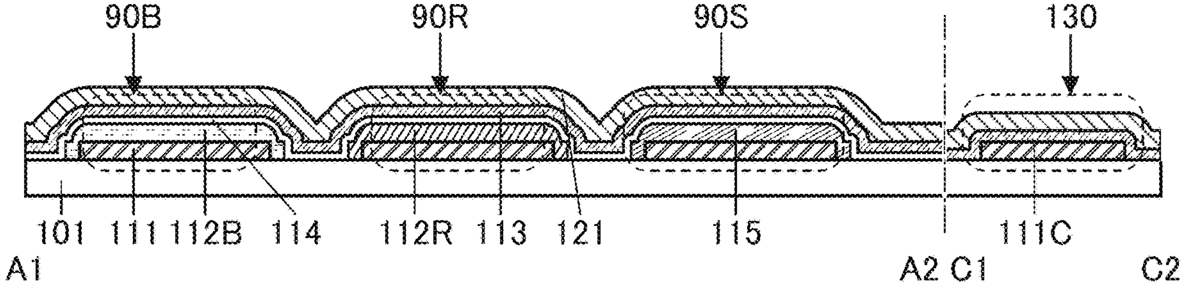
FIG. 16A to FIG. 16D are diagrams each showing a structure example of a display apparatus.
Figure 16B:
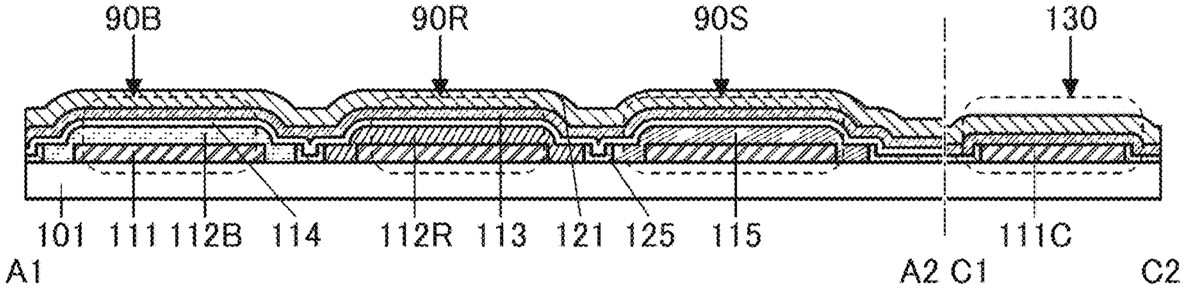

FIG. 16B shows an example in which the insulating layer 125 is provided. The insulating layer 125 is provided in contact with the side surfaces of the organic layers of two adjacent light-emitting devices. The insulating layer 125 may be provided to cover not only the side surface but also part of a top surface of the organic layer 112R or the like.

Figure 16C:
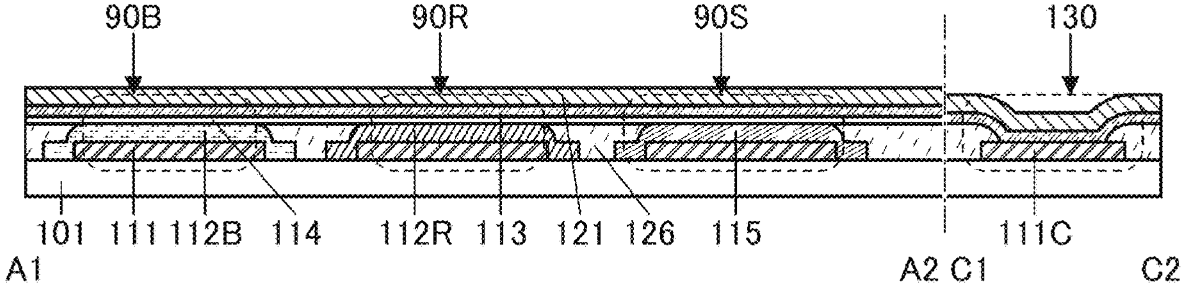

FIG. 16C shows an example in which the resin layer 126 is provided. The resin layer 126 is positioned between two adjacent light-emitting devices and covers the side surface and part of the top surface of the organic layer 112R or the like. The resin layer 126 may be formed to be in contact with the side surface of the organic layer 112R or the like and not to cover the top surface thereof.

Figure 16D:
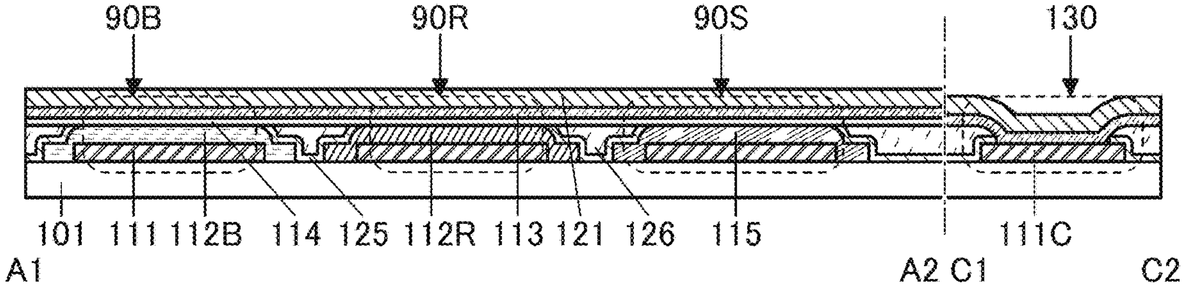

FIG. 16D shows an example in which both the insulating layer 125 and the resin layer 126 are provided. The insulating layer 125 is provided between the organic layer 112R or the like and the resin layer 126.

Here, a structure example of the resin layer 126 is described.

A top surface of the resin layer 126 is preferably as flat as possible; however, the surface of the resin layer 126 may be concave or convex depending on an uneven shape of a surface on which the resin layer 126 is formed, the formation conditions of the resin layer 126, or the like.

FIG. 17A to FIG. 18F are each an enlarged view of an end portion of the pixel electrode 111R included in the light-emitting device 90R, an end portion of the pixel electrode 111G included in the light-emitting device 90G, and the vicinity thereof. The organic layer 112G is provided over the pixel electrode 111G.

Figure 17A:
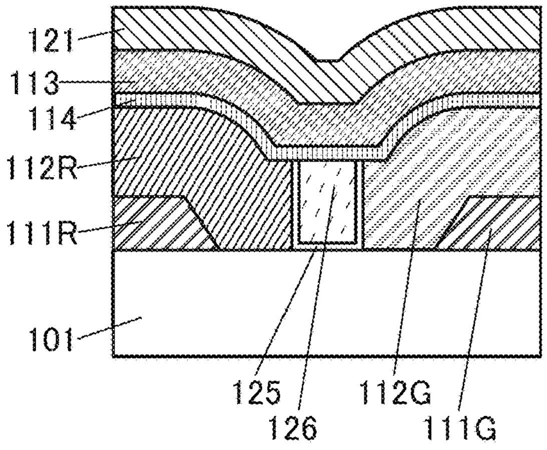
FIG. 17A to FIG. 17F are diagrams each showing a structure example of a display apparatus.
Figure 17B:
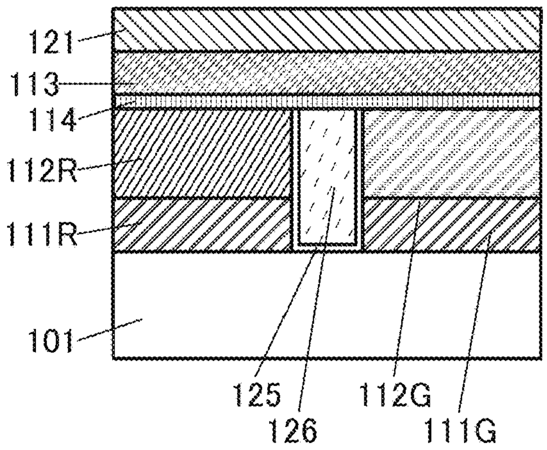
Figure 17C:
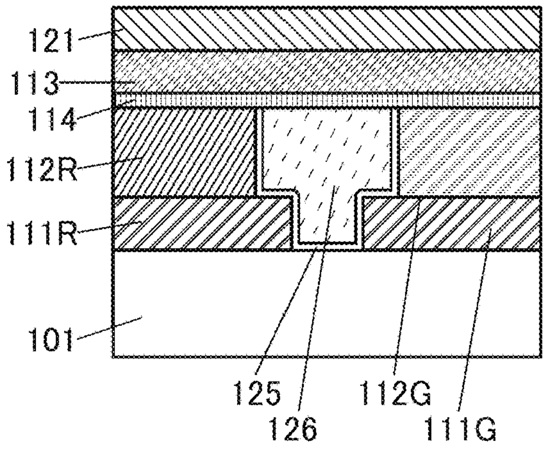

FIG. 17A, FIG. 17B, and FIG. 17C are each an enlarged view of the resin layer 126 and the vicinity thereof, in the case where the resin layer 126 has a flat top surface. FIG. 17A shows an example of the case where the organic layer 112R or the like has a larger width than the pixel electrode 111. FIG. 17B shows an example in which the widths of them are substantially the same. FIG. 17C shows an example of the case where the organic layer 112R or the like has a smaller width than the pixel electrode 111.

The organic layer 112R is provided to cover the end portions of the pixel electrode 111 as illustrated in FIG. 17A, so that the end portion of the pixel electrode 111 is preferably tapered. Accordingly, the step coverage with the organic layer 112R is improved and a highly reliable display apparatus can be provided.

Figure 17D:
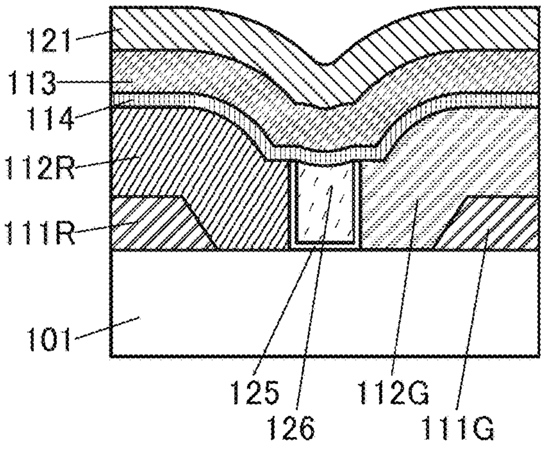
Figure 17E:
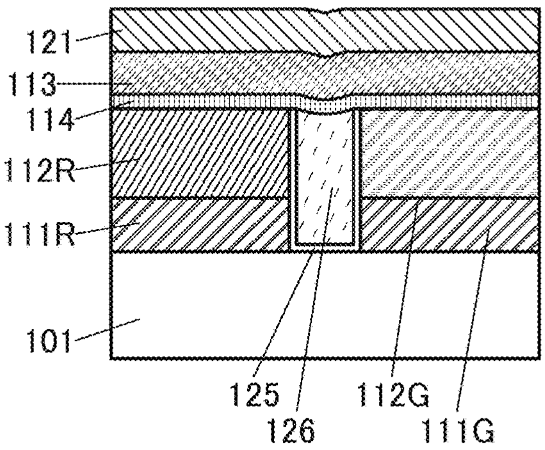
Figure 17F:
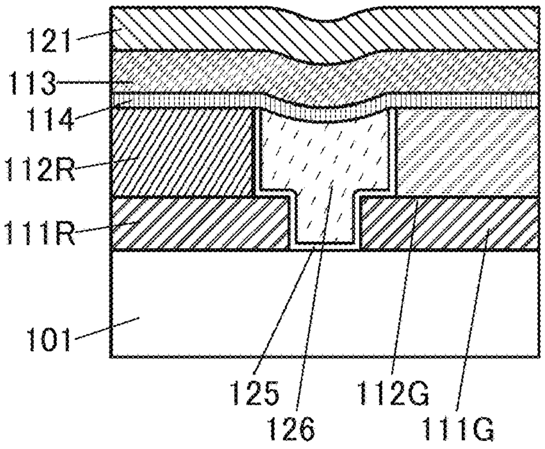

FIG. 17D, FIG. 17E, and FIG. 17F show examples of the case where the top surface of the resin layer 126 is concave. In this case, a concave portion that reflects the concave top surface of the resin layer 126 is formed on each of top surfaces of the organic layer 114, the common electrode 113, and the protective layer 121.

Figure 18A:
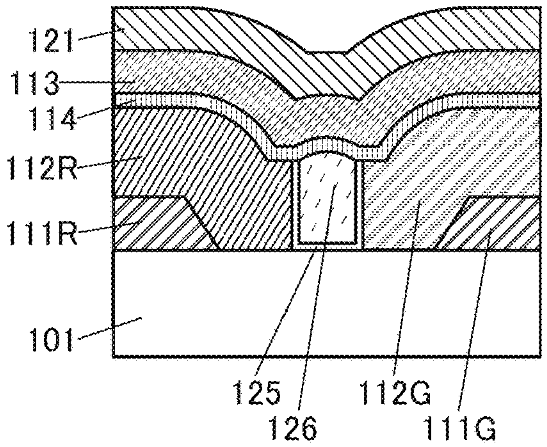
FIG. 18A to FIG. 18F are diagrams each showing a structure example of a display apparatus.
Figure 18D:
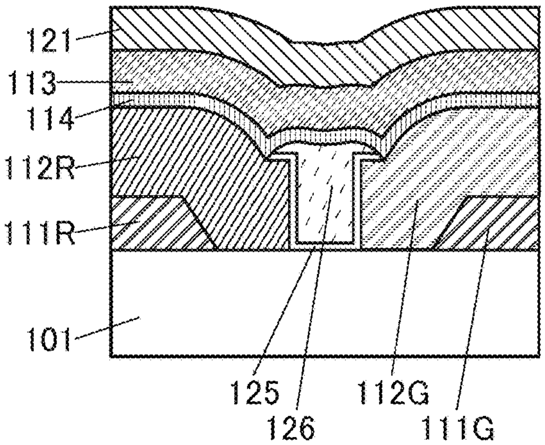
Figure 18B:
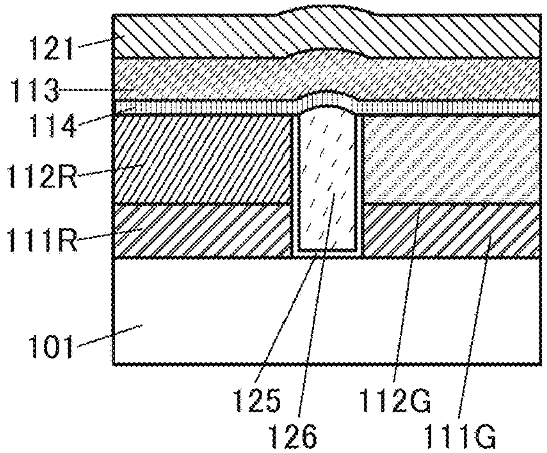
Figure 18E:
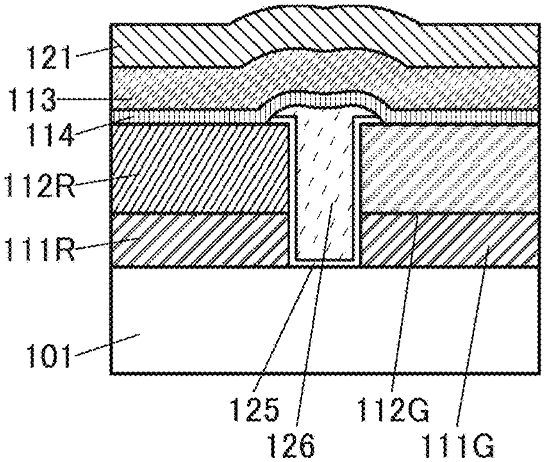
Figure 18C:
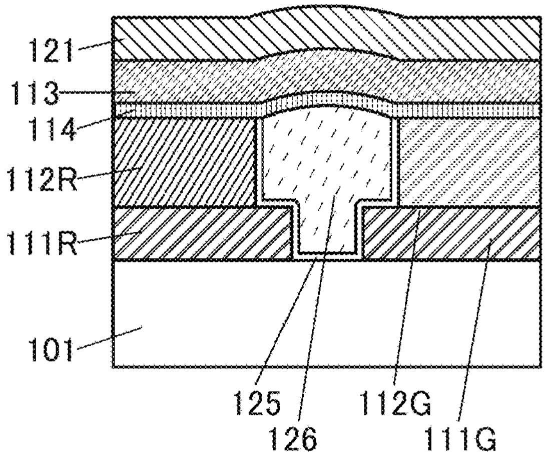

FIG. 18A, FIG. 18B, and FIG. 18C show examples of the case where the top surface of the resin layer 126 is convex. In this case, a convex portion that reflects the convex top surface of the resin layer 126 is formed on each of the top surfaces of the organic layer 114, the common electrode 113, and the protective layer 121.

Figure 18F:
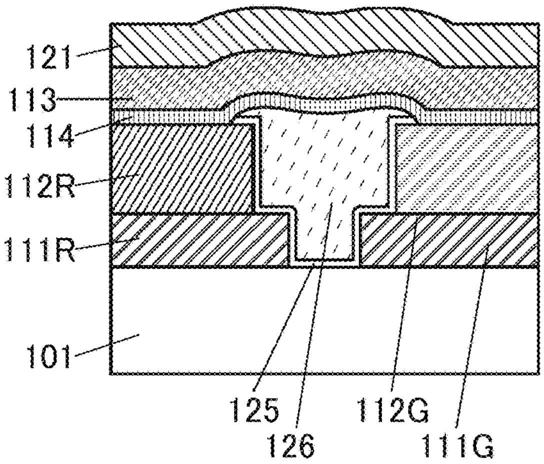

FIG. 18D, FIG. 18E, and FIG. 18F show examples of the case where part of the resin layer 126 covers an upper end portion and part of the top surface of the organic layer 112R and an upper end portion and part of the top surface of the organic layer 112G. Here, the insulating layer 125 is provided between the resin layer 126 and the top surfaces of the organic layers 112R and 112G.

FIG. 18D, FIG. 18E, and FIG. 18F show examples of the case where the top surface of the resin layer 126 is partly concave. In this case, unevenness that reflects the shape of the resin layer 126 is formed on each of the organic layer 114, the common electrode 113, and the protective layer 121.

The above is the description of the structure example of the resin layer.

Figure 19A:
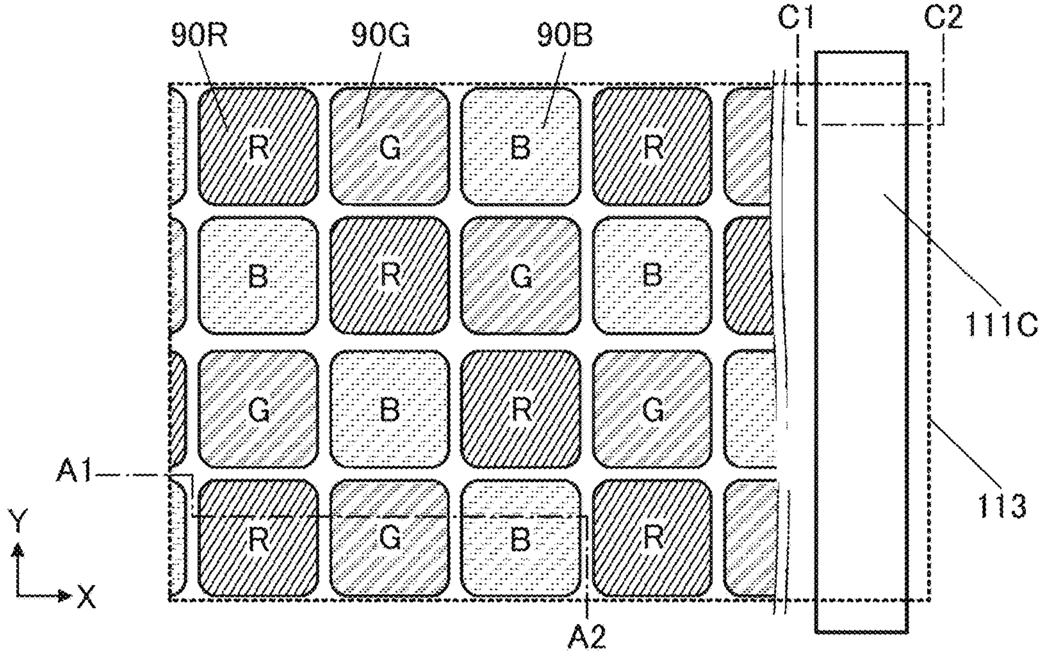
FIG. 19A and FIG. 19B are diagrams showing a structure example of a display apparatus.
Figure 19B:
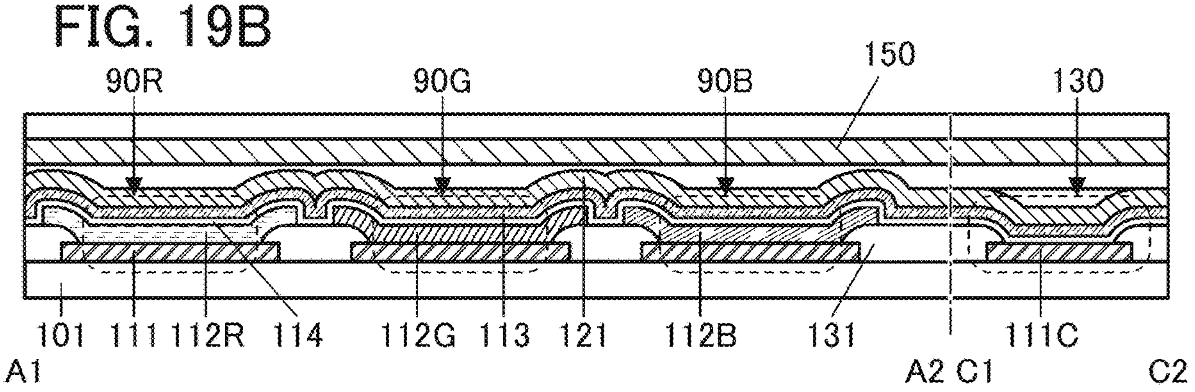

The display apparatus of one embodiment of the present invention may have a structure without a light-receiving device, as illustrated in FIG. 19A. In the case where a light-receiving device is not provided, a capacitive sensor instead of a light-receiving device may be used as the input device. Although a capacitive sensor is generally used as a touch sensor, it is not capable of image-capturing. However, a capacitive sensor can read a change in capacitance due to bumps and dips of fingerprints, and is capable of obtaining fingerprint pattern information. As illustrated in FIG. 19B, a capacitive sensor 150 can be provided over each light-emitting device.

Note that the structures in FIG. 14A to FIG. 18F can be used in display apparatuses without a light-receiving device.

At least part of this embodiment can be implemented in combination with any of the other embodiments described in this specification, as appropriate.

Embodiment 5

In this embodiment, a structure example of a display apparatus that can be used for the display apparatus of one embodiment of the present invention will be described. Although a display apparatus capable of displaying an image is described here, when a light-emitting device is used as a light source, a display apparatus can be obtained.

The display apparatus in this embodiment can be a high-definition display apparatus or a large-sized display apparatus. Accordingly, the display apparatus in this embodiment can be used for display portions of electronic devices such as a digital camera, a digital video camera, a digital photo frame, a mobile phone, a portable game machine, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

Display Apparatus 400

Figure 20:
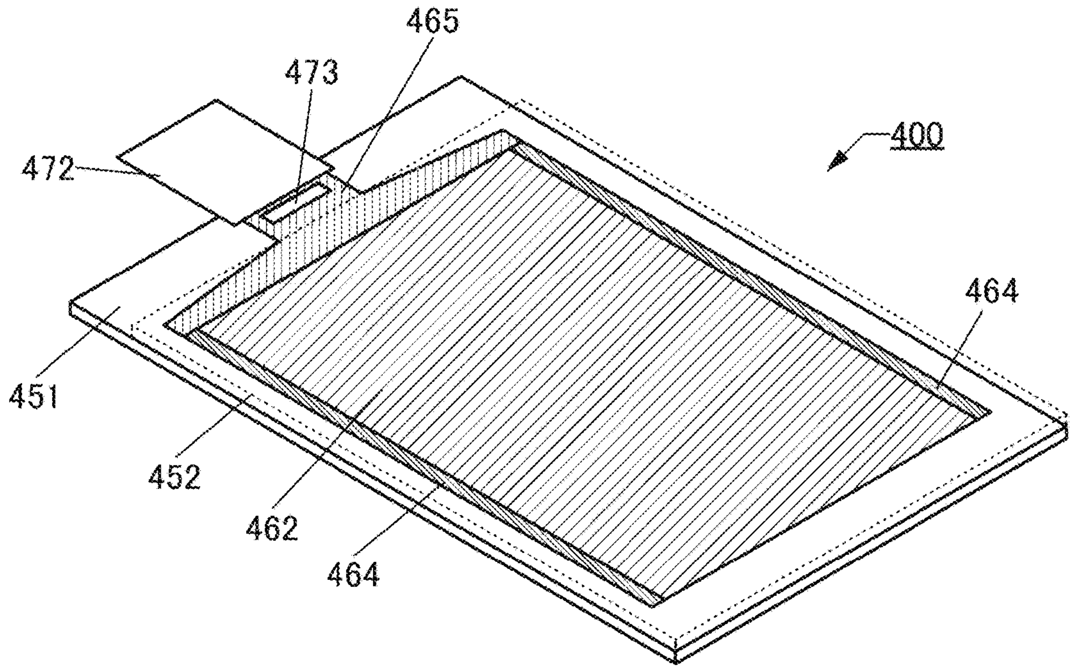
FIG. 20 is a diagram showing a structure example of a display apparatus.
Figure 21A:
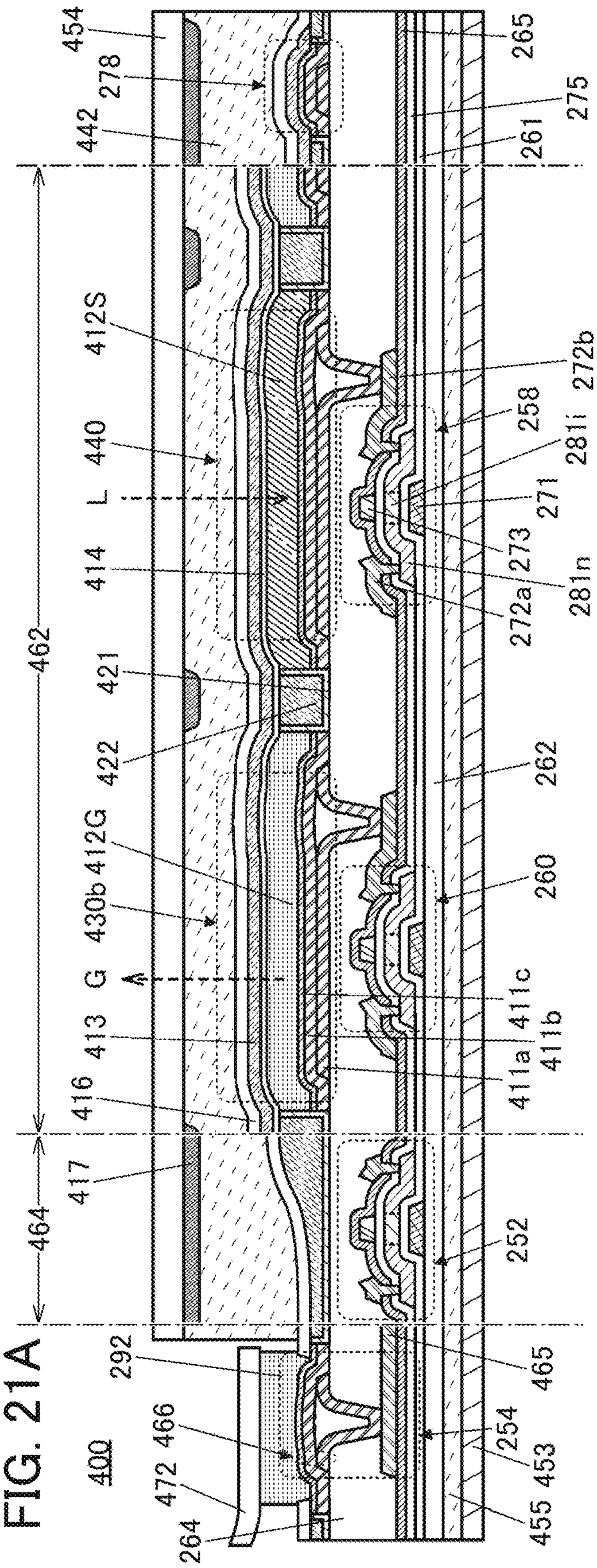
FIG. 21A is a cross-sectional view showing an example of a display apparatus.

FIG. 20 illustrates a perspective view of a display apparatus 400, and FIG. 21A illustrates a cross-sectional view of the display apparatus 400.

The display apparatus 400 has a structure in which a substrate 452 and a substrate 451 are bonded to each other. In FIG. 20, the substrate 452 is denoted by a dashed line.

The display apparatus 400 includes a display portion 462, a circuit 464, a wiring 465, and the like. FIG. 20 illustrates an example in which an IC 473 and an FPC 472 are integrated on the display apparatus 400. Thus, the structure illustrated in FIG. 20 can be regarded as a display module including the display apparatus 400, the IC (integrated circuit), and the FPC.

As the circuit 464, a scan line driver circuit can be used, for example.

The wiring 465 has a function of supplying a signal and power to the display portion 462 and the circuit 464. The signal and power are input to the wiring 465 from the outside through the FPC 472 or input to the wiring 465 from the IC 473.

FIG. 20 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display apparatus 400 and the display module are not necessarily provided with an IC. The IC may be mounted on the FPC by a COF method or the like.

FIG. 21A illustrates an example of cross sections of part of a region including the FPC 472, part of the circuit 464, part of the display portion 462, and part of a region including a connection portion of the display apparatus 400. FIG. 21A specifically illustrates an example of a cross section of a region including a light-emitting device 430*b* emitting green light (G) and the light-receiving device 440 receiving reflected light (L) in the display portion 462.

The display apparatus 400 illustrated in FIG. 21A includes a transistor 252, a transistor 260, a transistor 258, the light-emitting device 430*b*, the light-receiving device 440, and the like between a substrate 453 and a substrate 454.

The light-emitting device or the light-receiving device that is described above can be used as the light-emitting device 430*b* and the light-receiving device 440.

Here, in the case where the pixel of the display apparatus includes three kinds of subpixels including light-emitting devices that emit different colors, as the three subpixels, subpixels of three colors of red (R), green (G), and blue (B), subpixels of three colors of yellow (Y), cyan (C), and magenta (M), and the like can be given. In the case where four subpixels are included, the four subpixels can be of four colors of R, G, B, and white (W) or of four colors of R, G, B, and Y. Alternatively, the subpixel may include a light-emitting device emitting infrared light.

As the light-receiving device 440, a photoelectric conversion element having sensitivity to light in a red, green, or blue wavelength range or a photoelectric conversion element having sensitivity to light in an infrared wavelength range can be used.

The substrate 454 and the protective layer 416 are bonded to each other with the adhesive layer 442. The adhesive layer 442 is provided to overlap with the light-emitting device 430*b* and the light-receiving device 440, and the display apparatus 400 employs a solid sealing structure. A light-blocking layer 417 is provided on the substrate 454.

The light-emitting device 430*b* and the light-receiving device 440 each include a conductive layer 411*a*, a conductive layer 411*b*, and a conductive layer 411*c* as pixel electrodes. The conductive layer 411*b* reflects visible light and functions as a reflective electrode. The conductive layer 411*c* transmits visible light and functions as an optical adjustment layer.

A conductive layer 411*a* included in the light-emitting device 430*b* is electrically connected to a conductive layer 272*b* included in the transistor 260 through an opening provided in an insulating layer 264. The transistor 260 has a function of controlling the driving of the light-emitting device. The conductive layer 411*a* included in the light-receiving device 440 is electrically connected to the conductive layer 272*b* included in the transistor 258. The transistor 258 has a function of controlling, for example, the timing of light exposure using the light-receiving device 440.

An EL layer 412G or the photoelectric conversion layer 412S is provided to cover the pixel electrode. An insulating layer 421 is provided in contact with a side surface of the EL layer 412G and a side surface of the photoelectric conversion layer 412S, and a resin layer 422 is provided to fill a concave portion of the insulating layer 421. An organic layer 414, a common electrode 413, and the protective layer 416 are provided to cover the EL layer 412G and the photoelectric conversion layer 412S. Providing the protective layer 416 covering the light-emitting devices inhibits entry of impurities such as water into the light-emitting devices; as a result, the reliability of the light-emitting devices can be increased.

Light G from the light-emitting device 430*b* is emitted toward the substrate 452 side. The light-receiving device 440 receives light L incident through the substrate 452 and converts the light L into an electric signal. For the substrate 452, a material having a high visible-light-transmitting property is preferably used.

The transistor 252, the transistor 260, and the transistor 258 are all formed over the substrate 451. These transistors can be formed using the same materials in the same step.

Note that the transistor 252, the transistor 260, and the transistor 258 may be separately formed to have different structures. For example, it is possible to separately form a transistor having a back gate and a transistor having no back gate, or transistors having semiconductors, gate electrodes, gate insulating layers, source electrodes, and drain electrodes that are formed of different materials or have different thicknesses.

The substrate 453 and an insulating layer 262 are bonded to each other with an adhesive layer 455.

As a method of fabricating the display apparatus 400, first, a formation substrate provided with the insulating layer 262, the transistors, the light-emitting devices, the light-receiving devices and the like and the substrate 454 provided with the light-blocking layer 417 are bonded to each other with the adhesive layer 442. Then, the substrate 453 is attached to a surface exposed by separation of the formation substrate, whereby the components formed over the formation substrate are transferred to the substrate 453. The substrate 453 and the substrate 454 are preferably flexible. This can increase the flexibility of the display apparatus 400.

The connection portion 254 is provided in a region of the substrate 453 that does not overlap with the substrate 454. In the connection portion 254, the wiring 465 is electrically connected to the FPC 472 through a conductive layer 466 and a connection layer 292. The conductive layer 466 can be obtained by processing the same conductive film as the pixel electrode. Thus, the connection portion 254 and the FPC 472 can be electrically connected to each other through the connection layer 292.

The transistor 252, the transistor 260, and the transistor 258 each include the conductive layer 271 functioning as a gate, the insulating layer 261 functioning as a gate insulating layer, a semiconductor layer 281 including a channel formation region 281*i* and a pair of low-resistance regions 281*n*, the conductive layer 272*a* connected to one of the pair of low-resistance regions 281*n*, the conductive layer 272*b* connected to the other of the pair of low-resistance regions 281*n*, an insulating layer 275 functioning as a gate insulating layer, the conductive layer 273 functioning as a gate, and the insulating layer 265 covering the conductive layer 273. The insulating layer 261 is positioned between the conductive layer 271 and the channel formation region 281*i*. The insulating layer 275 is positioned between the conductive layer 273 and the channel formation region 281*i*.

The conductive layer 272*a* and the conductive layer 272*b* are connected to the corresponding low-resistance regions 281*n* through openings provided in the insulating layer 265. One of the conductive layer 272*a* and the conductive layer 272*b* functions as a source and the other functions as a drain.

FIG. 21A illustrates an example in which the insulating layer 275 covers the top surface and a side surface of the semiconductor layer. The conductive layer 272*a* and the conductive layer 272*b* are connected to the respective low-resistance regions 281*n* through openings provided in the insulating layer 275 and the insulating layer 265.

Figure 21B:
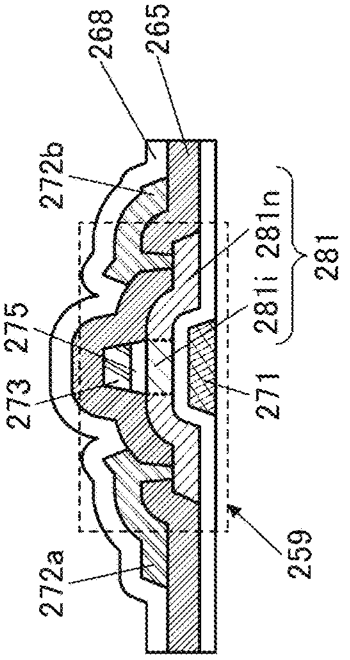
FIG. 21B is a cross-sectional view showing an example of a transistor.

In a transistor 259 illustrated in FIG. 21B, the insulating layer 275 overlaps with the channel formation region 281*i* of the semiconductor layer 281 and does not overlap with the low-resistance regions 281*n*. The structure illustrated in FIG. 21B is obtained by processing the insulating layer 275 with the conductive layer 273 as a mask, for example. In FIG. 21B, the insulating layer 265 is provided to cover the insulating layer 275 and the conductive layer 273, and the conductive layer 272*a* and the conductive layer 272*b* are connected to the low-resistance regions 281*n* through openings in the insulating layer 265. Furthermore, an insulating layer 268 covering the transistor may be provided.

There is no particular limitation on the structure of the transistors included in the display apparatus in this embodiment. For example, a planar transistor, a staggered transistor, or an inverted staggered transistor can be used. A top-gate or bottom-gate transistor structure can be used. Alternatively, gates may be provided above and below a semiconductor layer where a channel is formed.

The structure in which the semiconductor layer where a channel is formed is provided between the two gates is used for the transistor 252, the transistor 260, and the transistor 258. The two gates may be connected to each other and supplied with the same signal to operate the transistor. Alternatively, the threshold voltage of the transistor may be controlled by supplying a potential for controlling the threshold voltage to one of the two gates and a potential for driving to the other.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, a transistor using a metal oxide in its channel formation region (hereinafter, an OS transistor) is preferably used for the display apparatus in this embodiment.

The band gap of a metal oxide used for the semiconductor layer of the transistor is preferably 2 eV or more, further preferably 2.5 eV or more. With the use of a metal oxide having a wide bandgap, the off-state current of the OS transistor can be reduced. The off-state current value per micrometer of channel width of the OS transistor at room temperature can be, for example, lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

A metal oxide contains preferably at least indium or zinc and further preferably indium and zinc. The metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as In-M-Zn oxide in some cases.

When a metal oxide is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio. By increasing the proportion of the number of indium atoms in the metal oxide, the on-state current, field-effect mobility, or the like of the transistor can be improved.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The atomic ratio of In may be less than the atomic ratio of M in the In-M-Zn oxide. Examples of the atomic ratio of the metal elements in such an In-M-Zn oxide include In:M:Zn=1:3:2 or a composition in the neighborhood thereof, In:M:Zn=1:3:3 or a composition in the neighborhood thereof, In:M:Zn=1:3:4 or a composition in the neighborhood thereof. By increasing the proportion of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)-gate voltage (Vg) curve of a transistor, the tangent at a point where the slope of the curve is the steepest intersects the straight line of Id=1 pA.

The display apparatus includes OS transistors and light-emitting devices with MML (metal maskless) structure, which enables the leakage current that might flow through the transistor and the leakage current that might flow between adjacent light-emitting elements (such leakage current is also referred to as lateral leakage current, side leakage current, or the like) to be very low. With this structure, a viewer can notice any one or more of the image crispness, the image sharpness, a high chroma, and a high contrast ratio in an image displayed on the display apparatus. With the structure where the leakage current that might flow through the transistor and the lateral leakage current that might flow between light-emitting elements are very low, display with little leakage of light at the time of black display (i.e., with few phenomena in which the black image looks whitish) (such display is also referred to as deep black display) can be achieved.

In particular, in the case where a light-emitting device having an MML structure employs the above-described SBS structure, a layer provided between light-emitting elements (for example, also referred to as an organic layer or a common layer which is commonly used between the light-emitting elements) is disconnected; accordingly, display with no or extremely low side leakage can be achieved.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher breakdown voltage between the source and the drain than a Si transistor, a high voltage can be applied between the source and the drain of the OS transistor. Accordingly, when an OS transistor is used as the driving transistor in the pixel circuit, the amount of current flowing through the light-emitting device can be increased, so that the emission luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor in the pixel circuit, the amount of current flowing between the source and the drain can be set minutely by a change in gate-source voltage; hence, the amount of current flowing through the light-emitting device can be controlled. Accordingly, the gray level in the pixel circuit can be increased.

Regarding saturation characteristics of current flowing when the transistor operates in a saturation region, the OS transistor can make current (saturation current) flow more stably than the Si transistor even when the source-drain voltage gradually increases. Thus, by using an OS transistor as the driving transistor, a stable current can be fed through a light-emitting device that contains an EL material even when the current-voltage characteristics of the light-emitting device vary, for example. In other words, when the OS transistor operates in the saturation region, the source-drain current hardly changes with an increase in the source-drain voltage; hence, the emission luminance of the light-emitting device can be stable.

As described above, with use of an OS transistor as a driving transistor included in the pixel circuit, it is possible to achieve "inhibition of black floating", "increase in emission luminance", "increase in gray level", "inhibition of variation in light-emitting devices", and the like.

Alternatively, a semiconductor layer of a transistor may contain silicon. Examples of silicon include amorphous silicon and crystalline silicon (e.g., low-temperature polysilicon or single crystal silicon).

In particular, low-temperature polysilicon has relatively high mobility and can be formed over a glass substrate, and thus can be suitably used for a display apparatus. For example, a transistor including low-temperature polysilicon in a semiconductor layer can be used as the transistor 252 and the like included in the driver circuit, and a transistor including an oxide semiconductor in a semiconductor layer can be used as the transistor 260, the transistor 258, and the like provided in the pixel.

Alternatively, a semiconductor layer of a transistor may include a layered material that functions as a semiconductor. The layered substance is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered materials include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A material into which impurities such as water and hydrogen are less likely to diffuse is preferably used for at least one of the insulating layers that cover the transistors. This allows the insulating layer to function as a barrier layer. Such a structure can effectively inhibit diffusion of impurities into the transistors from the outside and increase the reliability of the display apparatus.

An inorganic insulating film is preferably used as each of the insulating layer 261, the insulating layer 262, the insulating layer 265, the insulating layer 268, and the insulating layer 275. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 400. This can inhibit entry of impurities from the end portion of the display apparatus 400 through the organic insulating film. Alternatively, the organic insulating film may be formed so that an end portion of the organic insulating film is positioned on the inner side compared to the end portion of the display apparatus 400, to prevent the organic insulating film from being exposed at the end portion of the display apparatus 400.

An organic insulating film is suitable for the insulating layer 264 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

A light-blocking layer 417 is preferably provided on the surface of the substrate 454 on the substrate 453 side. A variety of optical members can be arranged on the outer side of the substrate 454. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 454.

FIG. 21A illustrates a connection portion 278. In the connection portion 278, the common electrode 413 is electrically connected to a wiring. FIG. 21A illustrates an example in which the wiring has the same stacked-layer structure as the pixel electrode.

For each of the substrate 453 and the substrate 454, glass, quartz, ceramics, sapphire, a resin, a metal, an alloy, a semiconductor, or the like can be used. The substrate on the side from which light from the light-emitting device is extracted is formed using a material that transmits the light. When the substrate 453 and the substrate 454 are formed using a flexible material, the flexibility of the display apparatus can be increased. Furthermore, a polarizing plate may be used as the substrate 453 or the substrate 454.

For each of the substrate 453 and the substrate 454, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 453 and the substrate 454.

In the case where a circularly polarizing plate overlaps with the display apparatus, a highly optically isotropic substrate is preferably used as the substrate included in the display apparatus. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic resin film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 292, an anisotropic conductive film (ACF), an anisotropic conductive paste (ACP), or the like can be used.

As materials that can be used for conductive layers such as a variety of wirings and electrodes that constitute a display apparatus, in addition to a gate, a source, and a drain of a transistor, metals such as aluminum, titanium, chromium, nickel, copper, yttrium, zirconium, molybdenum, silver, tantalum, or tungsten, an alloy containing the metal as its main component, and the like can be given. A single-layer structure or a stacked-layer structure including a film containing any of these materials can be used.

As a light-transmitting conductive material, a conductive oxide such as indium oxide, an indium tin oxide, an indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, and titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of an indium tin oxide and an alloy of silver and magnesium is preferably used because conductivity can be increased. They can also be used for conductive layers such as a variety of wirings and electrodes included in the display apparatus, and conductive layers (e.g., conductive layers functioning as the pixel electrode and the common electrode) included in the light-emitting device.

Examples of insulating materials that can be used for the insulating layers include resins such as an acrylic resin and an epoxy resin, and inorganic insulating materials such as silicon oxide, silicon oxynitride, silicon nitride oxide, silicon nitride, and aluminum oxide.

At least part of any of the structure examples, the drawings corresponding thereto, and the like described in this embodiment can be combined with the other structure examples, the other drawings, and the like as appropriate.

At least part of this embodiment can be implemented in combination with any of the other embodiments described in this specification, as appropriate.

Embodiment 6

In this embodiment, an example of a display apparatus including the light-receiving device of one embodiment of the present invention or the like will be described.

In the display apparatus of this embodiment, a plurality of kinds of subpixels including light-emitting devices that emit different color from each other can be included in a pixel. For example, the pixel can include three kinds of subpixels. The three subpixels can be of three colors of red (R), green (G), and blue (B) or of three colors of yellow (Y), cyan (C), and magenta (M), for example. Alternatively, the pixel can include four kinds of subpixels. The four subpixels can be of four colors of R, G, B, and white (W) or of four colors of R, G, B, and Y, for example.

There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

Furthermore, in the case of a display apparatus in which not only a light-emitting device but also a light-receiving device is included in a pixel, the pixel has a light-receiving function and thus can detect a contact or approach of an object while displaying an image. For example, an image can be displayed by using all the subpixels included in a display apparatus; or light can be emitted by some of the subpixels as a light source and an image can be displayed by using the remaining subpixels.

Figure 22A:
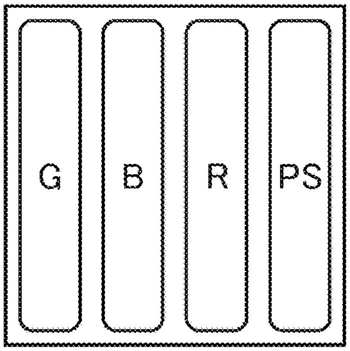
FIG. 22A to FIG. 22F are diagrams each showing an examples of a pixel.
Figure 22B:
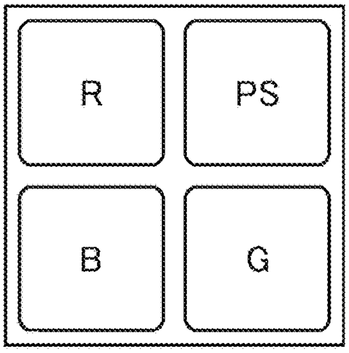
Figure 22C:
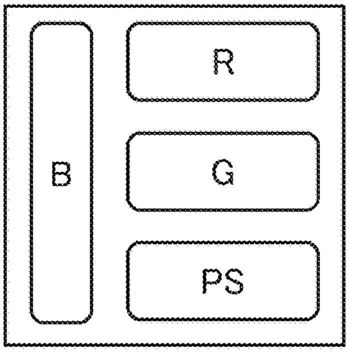

Pixels illustrated in FIG. 22A, FIG. 22B, and FIG. 22C each include a subpixel G, a subpixel B, a subpixel R, and a subpixel PS.

The pixel illustrated in FIG. 22A employs stripe arrangement. The pixel illustrated in FIG. 22B employs matrix arrangement.

The pixel arrangement illustrated in FIG. 22C has a structure in which three subpixels (the subpixel R, the subpixel G, and the subpixel S) are vertically arranged next to one subpixel (the subpixel B).

Figure 22D:
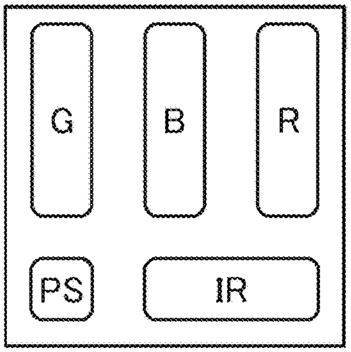
Figure 22E:
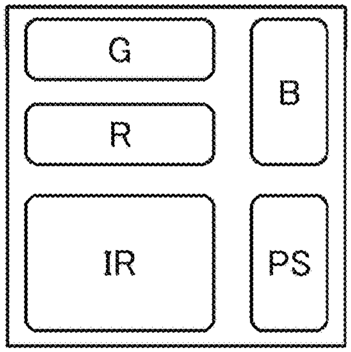
Figure 22F:
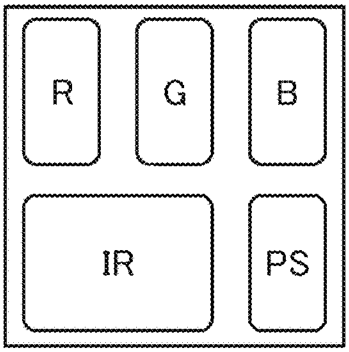

Pixels illustrated in FIG. 22D, FIG. 22E, and FIG. 22F each include the subpixel G, the subpixel B, the subpixel R, a subpixel IR, and the subpixel PS.

FIG. 22D, FIG. 22E, and FIG. 22F show examples in which one pixel is provided in two rows. Three subpixels (the subpixel G, the subpixel B, and the subpixel R) are provided in the upper row (first row), and two subpixel (one subpixel PS and one subpixel IR) are provided in the lower row (second row).

In FIG. 22D, the three vertically oriented subpixel G, subpixel B, and subpixel R are arranged laterally, and the subpixel PS and the horizontally oriented subpixel IR are arranged laterally below the three subpixels. In FIG. 22E, the two horizontally oriented subpixel G and subpixel R are arranged in the vertical direction; the vertically oriented subpixel B is arranged laterally next to the subpixels G and R; and the horizontally oriented subpixel IR and the vertically oriented subpixel PS are arranged laterally below the subpixels R, G, and B. In FIG. 22F, the three vertically oriented subpixel R, subpixel G, and subpixel B are arranged laterally, and the horizontally oriented subpixel IR and the vertically oriented subpixel PS are arranged laterally below the subpixels R, G, and B. In FIG. 22E and FIG. 22F, the area of the subpixel IR is the largest, and the area of the subpixel PS is substantially the same as that of the subpixel and the like.

Note that the layout of the subpixels is not limited to those in FIS. 22A to FIG. 22F.

The subpixel R includes a light-emitting device that emits red light. The subpixel G includes a light-emitting device that emits green light. The subpixel B includes a light-emitting device that emits blue light. The subpixel IR includes a light-emitting device that emits infrared light. The subpixel PS includes a light-receiving device. The wavelength of light detected by the subpixel PS is not particularly limited; however, the light-receiving device included in the subpixel PS preferably has sensitivity to light emitted by the light-emitting device included in the subpixel R, the subpixel G, the subpixel B, or the subpixel IR. For example, the light-receiving device preferably detects one or more kinds of light in blue, violet, bluish violet, green, yellowish green, yellow, orange, red, and infrared wavelength ranges, for example.

The light-receiving area of the subpixel PS is smaller than the light-emitting areas of the other subpixels. A smaller light-receiving area leads to a narrower image-capturing range, prevents a blur in a captured image, and improves the definition. Thus, by using the subpixel PS, high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel PS.

Moreover, the subpixel PS can be used in a touch sensor (also referred to as a direct touch sensor), a near touch sensor (also referred to as a hover sensor, a hover touch sensor, a contactless sensor, or a touchless sensor), or the like. For example, the subpixel PS preferably detects infrared light. Thus, touch sensing is possible even in a dark place.

Here, the touch sensor or the near touch sensor can detect an approach or contact of an object (e.g., a finger, a hand, or a pen). The touch sensor can detect the object when the display apparatus and the object come in direct contact with each other. Furthermore, the near touch sensor can detect the object even when the object is not in contact with the display apparatus. For example, the display apparatus is preferably capable of sensing an object positioned in the range of 0.1 mm to 300 mm inclusive, more preferably 3 mm to 50 mm inclusive from the display apparatus. This structure enables the display apparatus to be operated without direct contact of an object. In other words, the display apparatus can be operated in a contactless (touchless) manner. With the above-described structure, the display apparatus can be controlled with a reduced risk of making the display apparatus dirty or damaging the display apparatus or without the object directly touching a dirt (e.g., dust, bacteria, or a virus) attached to the display apparatus.

For high-resolution image capturing, the subpixel PS is preferably provided in every pixel included in the display apparatus. Meanwhile, in the case where the subpixel PS is used in a touch sensor, a near touch sensor, or the like, high accuracy is not required as compared to the case of capturing an image of a fingerprint or the like; accordingly, the subpixel PS is provided in some subpixels in the display apparatus. When the number of subpixels PS included in the display apparatus is smaller than the number of subpixels R or the like, higher detection speed can be achieved.

The display apparatus may have a function of changing the refresh rate. For example, the refresh rate is adjusted (in the range from 0.01 Hz to 240 Hz, for example) in accordance with contents displayed on the display apparatus, whereby power consumption can be reduced. Moreover, driving with a lowered refresh rate that enables the power consumption of the display apparatus may be referred to as idling stop (IDS) driving.

In addition, the drive frequency of a touch sensor or a near touch sensor may be changed depending on the above refresh rate. In the case where the refresh rate of the display apparatus is 120 Hz, for example, the drive frequency of a touch sensor or a near touch sensor can be higher than 120 Hz (typically 240 Hz). With this structure, low power consumption can be achieved and the response speed of the touch sensor or the near touch sensor can be increased.

Figure 22G:
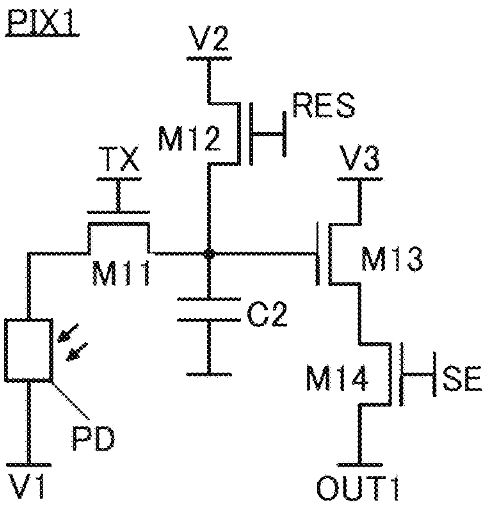
FIG. 22G and FIG. 22H are diagrams each showing an example of a circuit diagram of a pixel.
Figure 22H:
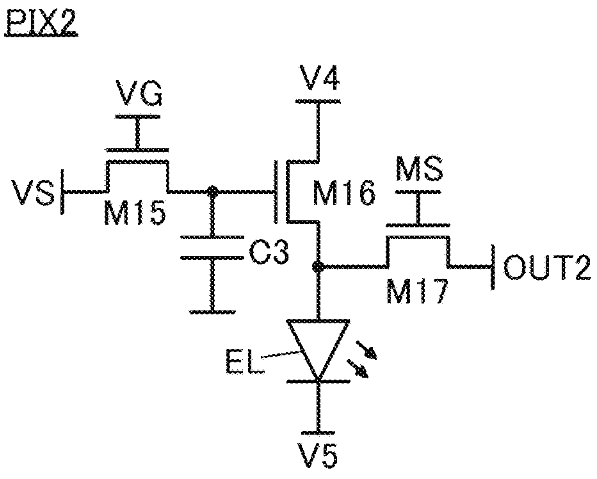

FIG. 22G shows an example of the pixel circuit of the subpixel including a light-receiving device. FIG. 22H shows an example of the pixel circuit of the subpixel including a light-emitting device.

A pixel circuit PIX1 illustrated in FIG. 22G includes a light-receiving device PD, a transistor M11, a transistor M12, a transistor M13, a transistor M14, and a capacitor C2. Here, a photodiode is used as an example of the light-receiving device PD.

An anode of the light-receiving device PD is electrically connected to a wiring V1, and a cathode of the light-receiving device PD is electrically connected to one of a source and a drain of the transistor M11. Alternatively, the cathode may be electrically connected to the wiring V1 and the anode may be electrically connected to one of the source and the drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to each of the wiring V1, the wiring V2, and the wiring V3. When the anode of the light-receiving device PD is electrically connected to the wiring V1, in the case where the light-receiving device PD is driven with a reverse bias, the wiring V2 is supplied with a potential higher than the potential of the wiring V1. When the cathode of the light-receiving device PD is electrically connected to the wiring V1, in the case where the light-receiving device PD is driven with a reverse bias, the wiring V1 is supplied with a potential higher than the potential of the wiring V2.

The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with a current flowing through the light-receiving device PD. The transistor M13 functions as an amplifier transistor for outputting a signal corresponding to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 illustrated in FIG. 22H includes a light-emitting device EL, a transistor M15, a transistor M16, a transistor M17, and a capacitor C3. Here, a light-emitting diode is used as an example of the light-emitting device EL. In particular, an organic EL element is preferably used as the light-emitting device EL.

A gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other of the source and the drain of the transistor M16 is electrically connected to an anode of the light-emitting device EL and one of a source and a drain of the transistor M17. A gate of the transistor M17 is electrically connected to a wiring MS, and the other of the source and the drain of the transistor M17 is electrically connected to a wiring OUT2. A cathode of the light-emitting device EL is electrically connected to a wiring V5.

A constant potential is supplied to the wiring V4 and the wiring V5. The anode of the light-emitting device EL can be set to a high potential, and the cathode can be set to a lower potential than the anode. The transistor M15 is controlled by a signal supplied to the wiring VG and functions as a selection transistor for controlling a selection state of the pixel circuit PIX2. The transistor M16 functions as a driving transistor that controls a current flowing through the light-emitting device EL in accordance with a potential supplied to the gate of the transistor M16. When the transistor M15 is on, a potential supplied to the wiring VS is supplied to the gate of the transistor M16, and the luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Here, transistors in which a metal oxide (an oxide semiconductor) is used in a semiconductor layer where a channel is formed are preferably used as the transistors M11, M12, M13, and M14 included in the pixel circuit PIX1 and the transistors M15, M16, and M17 included in the pixel circuit PIX2.

A transistor using a metal oxide having a wider band gap and a lower carrier density than silicon achieves an extremely low off-state current. Therefore, owing to the low off-state current, charge accumulated in a capacitor that is connected in series to the transistor can be retained for a long time. Hence, it is particularly preferable to use transistors containing an oxide semiconductor as the transistors M11, M12, and M15 each of which is connected in series with the capacitor C2 or the capacitor C3. When the other transistors also include an oxide semiconductor, the manufacturing cost can be reduced.

Alternatively, transistors using silicon as a semiconductor in which a channel is formed can be used as the transistor M11 to the transistor M17. It is particularly preferable to use silicon with high crystallinity, such as single crystal silicon or polycrystalline silicon, because high field-effect mobility can be achieved and higher-speed operation can be performed.

Alternatively, a transistor using an oxide semiconductor may be used as one or more of the transistor M11 to the transistor M17, and transistors using silicon may be used as the other transistors.

Although n-channel transistors are shown in FIG. 22G and FIG. 22H, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including the transistor and/or the capacitor are preferably provided to overlap with the light-receiving device PD or the light-emitting device EL. Thus, the effective area of each pixel circuit can be reduced, and a high-resolution light-receiving portion or display portion can be achieved.

At least part of this embodiment can be implemented in combination with any of the other embodiments described in this specification, as appropriate.

REFERENCE NUMERALS

C2: capacitor, C3 capacitor, M11: transistor, M12: transistor, M13: transistor, M14: transistor, M15: transistor, M16: transistor, M17: transistor, OUT1: wiring, OUT2: wiring, PD: light-receiving device, PIX1: pixel circuit, PIX2: pixel circuit, V1: wiring, V2: wiring, V3: wiring, V4: wiring, V5: wiring, 30*a*: electronic device, 30*b*: electronic device, 31: display portion, 32*a*: housing, 32*b*: housing, 33: camera, 34: microphone, 35: push button, 36: speaker 37: hinge jig, 38: sensor, 41: icon, 42: clock, 43: keyboard keys, 45: hand, 46: stylus, 51: shaft, 52: shaft hole, 53: lock component, 54: hole, 55: dent portion, 56: ball, 57: spring, 58: circle, 90B: light-emitting device, 90G: light-emitting device, 90R: light-emitting device, 90S: light-receiving device, 100: display apparatus, 111: pixel electrode, 111C: connection electrode, 111G: pixel electrode, 111R: pixel electrode, 112B: organic layer, 112G: organic layer, 112R: organic layer, 113: common electrode, 114: organic layer, 115: organic layer, 121: protective layer, 125: insulating layer, 126: resin layer, 130: connection portion, 131: insulating layer, 150: capacitive sensor, 200: display panel, 200A: display panel, 200B: display panel, 201: substrate, 202: substrate, 203: functional layer, 211: light-emitting device, 211B: light-emitting device, 211G: light-emitting device, 211IR: light-emitting device, 211R: light-emitting device, 211W: light-emitting device, 211X: light-emitting device, 212: light-receiving device, 213R: light-emitting/receiving device, 220: finger, 221: contact portion, 222: fingerprint, 223: imaging range, 225: stylus, 226: path, 252: transistor, 254: connection portion, 258: transistor, 259: transistor, 260: transistor, 261: insulating layer, 262: insulating layer, 264: insulating layer, 265: insulating layer, 268: insulating layer, 271: conductive layer, 272*a*: conductive layer, 272*b*: conductive layer, 273: conductive layer, 275: insulating layer, 278: connection portion, 281: semiconductor layer, 281*i*: channel formation region, 281*n*: low-resistance region, 292: connection layer, 400: display apparatus, 411*a*: conductive layer, 411*b*: conductive layer, 411*c*: conductive layer, 412G: EL layer, 412S: photoelectric conversion layer, 413: common electrode, 414: organic layer, 416: protective layer, 417: light-blocking layer, 421: insulating layer, 422: resin layer, 430*b*: light-emitting device, 440: light-receiving device, 442: adhesive layer, 451: substrate, 452: substrate, 453: substrate, 454: substrate, 455: adhesive layer, 462: display portion, 464: circuit, 465: wiring, 466: conductive layer, 472: FPC, 473: IC, 711: light-emitting layer, 712: light-emitting layer, 713: light-emitting layer, 720: layer, 720-1: layer, 720-2: layer, 730: layer, 730-1: layer, 730-2: layer, 750B: light-emitting device, 750G: light-emitting device, 750R: light-emitting device, 751: layer, 752: layer, 753B: light-emitting layer, 753G: light-emitting layer, 753R: light-emitting layer, 754: layer, 755: layer, 760: light-receiving device, 761: layer, 762: layer, 763: layer, 790: EL layer, 790*a*: EL layer, 790*b*: EL layer, 791: lower electrode, 791B: pixel electrode, 791G: pixel electrode, 791PD: pixel electrode, 791R: pixel electrode, 792: upper electrode, 795: coloring layer

The invention claimed is:

1. An electronic device comprising:

a first housing;

a second housing; and a display portion surrounded by the first housing and the second housing, wherein the display portion comprises:

a first transistor over a flexible substrate;

a second transistor over the flexible substrate;

a light-emitting device over the first transistor; and a light-receiving device over the second transistor, wherein the light-emitting device is electrically connected and overlaps with the first transistor, wherein the light-receiving device is electrically connected and overlaps with the second transistor, wherein the light-emitting device comprises:

a first pixel electrode;

an EL layer over the first pixel electrode;

an organic layer over the EL layer; and a common electrode over the organic layer, wherein the light-receiving device comprises:

a second pixel electrode;

a photoelectric conversion layer over the second pixel electrode;

the organic layer over the photoelectric conversion layer; and the common electrode over the organic layer, wherein the organic layer and the common electrode are shared by the light-emitting device and the light-receiving device, wherein the display portion is configured to display a keyboard key, and wherein an image of a fingerprint is captured by using light emitted from the light-emitting device and capturing light reflected from a finger with the light-receiving device.

2. The electronic device according to claim 1, wherein the keyboard key is displayed when the first housing and the second housing make a certain angle.

3. The electronic device according to claim 2, wherein the certain angle is greater than 0° and less than 180°.

4. The electronic device according to claim 2, wherein the certain angle is greater than or equal to 85° and less than or equal to 135°.

5. The electronic device according to claim 1, wherein the first housing and the second housing are connected to each other via a hinge jig.

6. The electronic device according to claim 5, wherein the hinge jig comprises a first shaft hole, a second shaft hole, and a lock component, wherein the lock component comprises a spring and a ball, wherein the first housing comprises a first shaft, wherein the second housing comprises a second shaft, wherein a plurality of dent portions are provided close to the first shaft and the second shaft, wherein the first shaft is inserted in the first shaft hole, wherein the second shaft is inserted in the second shaft hole, and wherein the angle is fixed by the ball entering any of the plurality of dent portions.

7. The electronic device according to claim 1, wherein the electronic device is foldable.

8. The electronic device according to claim 1, wherein the light-emitting device and the light-receiving device do not overlap with each other.

9. The electronic device according to claim 1, wherein the organic layer comprises an electron-injection layer.

10. The electronic device according to claim 1, wherein the first pixel electrode comprises a first conductive layer, a second conductive layer, and a third conductive layer, wherein the first conductive layer is electrically connected to the first transistor, wherein the second conductive layer reflects visible light, and wherein the third conductive layer transmits visible light.

11. The electronic device according to claim 1, wherein a first character string is input by first touch operation on the keyboard key with the finger.

12. An electronic device comprising:

a first housing;

a second housing; and a display portion surrounded by the first housing and the second housing, wherein the display portion comprises:

a first transistor over a flexible substrate;

a second transistor over the flexible substrate;

a light-emitting device over the first transistor; and a light-receiving device over the second transistor, wherein the light-emitting device is electrically connected and overlaps with the first transistor, wherein the light-receiving device is electrically connected and overlaps with the second transistor, wherein the light-emitting device comprises:

a first pixel electrode;

an EL layer over the first pixel electrode;

an organic layer over the EL layer; and a common electrode over the organic layer, wherein the light-receiving device comprises:

a second pixel electrode;

a photoelectric conversion layer over the second pixel electrode;

the organic layer over the photoelectric conversion layer; and the common electrode over the organic layer, wherein the organic layer and the common electrode are shared by the light-emitting device and the light-receiving device, wherein the display portion is configured to display a keyboard key, and wherein the keyboard key is displayed when the first housing and the second housing make a certain angle.

13. The electronic device according to claim 12, wherein the first housing and the second housing are connected to each other via a hinge jig.

14. The electronic device according to claim 13, wherein the hinge jig comprises a first shaft hole, a second shaft hole, and a lock component, wherein the lock component comprises a spring and a ball, wherein the first housing comprises a first shaft, wherein the second housing comprises a second shaft, wherein a plurality of dent portions are provided close to the first shaft and the second shaft, wherein the first shaft is inserted in the first shaft hole, wherein the second shaft is inserted in the second shaft hole, and wherein the angle is fixed by the ball entering any of the plurality of dent portions.

15. The electronic device according to claim 12, wherein the certain angle is greater than 0° and less than 180°.

16. The electronic device according to claim 12, wherein the certain angle is greater than or equal to 85° and less than or equal to 135°.

17. The electronic device according to claim 12, wherein the electronic device is foldable.

18. The electronic device according to claim 12, wherein the light-emitting device and the light-receiving device do not overlap with each other.

19. The electronic device according to claim 12, wherein the organic layer comprises an electron-injection layer.

20. The electronic device according to claim 12, wherein the first pixel electrode comprises a first conductive layer, a second conductive layer, and a third conductive layer, wherein the first conductive layer is electrically connected to the first transistor, wherein the second conductive layer reflects visible light, and wherein the third conductive layer transmits visible light.

* * * * *